US011315968B2

United States Patent
Kido et al.

(10) Patent No.: US 11,315,968 B2
(45) Date of Patent: Apr. 26, 2022

(54) SOLID STATE IMAGE DEVICE HAVING AN IMPURITY CONCENTRATION AT A P/N INTERFACE OF ONE PHOTODIODE BEING EQUAL TO OR GREATER THAN AT P/N INTERFACE OF ANOTHER PHOTODIODE WITHIN A SEMICONDUCTOR SUBSTRATE

(71) Applicant: SONY CORPORATION, Tokyo (JP)

(72) Inventors: Hideo Kido, Kanagawa (JP); Takayuki Enomoto, Kanagawa (JP); Hideaki Togashi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/426,691

(22) Filed: Feb. 7, 2017

(65) Prior Publication Data
US 2017/0148833 A1 May 25, 2017

Related U.S. Application Data

(63) Continuation of application No. 13/540,760, filed on Jul. 3, 2012, now Pat. No. 9,570,489.

(30) Foreign Application Priority Data

Jul. 12, 2011 (JP) .............................. JP2011-153914
Aug. 11, 2011 (JP) .............................. JP2011-176057

(51) Int. Cl.
*H01L 27/146* (2006.01)
*H04N 5/378* (2011.01)

(52) U.S. Cl.
CPC .... *H01L 27/14614* (2013.01); *H01L 27/1461* (2013.01); *H01L 27/1463* (2013.01);
(Continued)

(58) Field of Classification Search
CPC ........... H01L 27/1461; H01L 27/14614; H01L 27/14647
See application file for complete search history.

(56) References Cited

U.S. PATENT DOCUMENTS

| | | | |
|---|---|---|---|
| 2006/0215048 A1 | 9/2006 | Suzuki | |
| 2009/0303371 A1* | 12/2009 | Watanabe | ......... H01L 27/14641 348/311 |

(Continued)

FOREIGN PATENT DOCUMENTS

| | | | |
|---|---|---|---|
| JP | 2009-295937 A | 12/2009 | |
| JP | 2010-114274 A | 5/2010 | |

(Continued)

OTHER PUBLICATIONS

Office Action for CN Patent Application No. 201710073089.8, dated Sep. 17, 2020, 04 pages of Office Action and 06 pages of English Translation.

*Primary Examiner* — Anh D Mai
(74) *Attorney, Agent, or Firm* — Chip Law Group

(57) ABSTRACT

A solid-state imaging device includes: a first photodiode made up of a first first-electroconductive-type semiconductor region formed on a first principal face side of a semiconductor substrate, and a first second-electroconductive-type semiconductor region formed within the semiconductor substrate adjacent to the first first-electroconductive-type semiconductor region; a second photodiode made up of a second first-electroconductive-type semiconductor region formed on a second principal face side of the semiconductor substrate, and a second second-electroconductive-type semiconductor region formed within the semiconductor substrate adjacent to the second first-electroconductive-type semiconductor region; and a gate electrode formed on the first principal face side of the semiconductor substrate; with impurity concentration of a connection face between the (Continued)

second first-electroconductive-type semiconductor region and the second second-electroconductive-type semiconductor region being equal to or greater than impurity concentration of a connection face of an opposite layer of the second first-electroconductive-type semiconductor region of the second second-electroconductive-type semiconductor region.

3 Claims, 60 Drawing Sheets

(52) U.S. Cl.
CPC .... *H01L 27/1464* (2013.01); *H01L 27/14616* (2013.01); *H01L 27/14621* (2013.01); *H01L 27/14627* (2013.01); *H01L 27/14636* (2013.01); *H01L 27/14645* (2013.01); *H01L 27/14689* (2013.01); *H04N 5/378* (2013.01)

(56) References Cited

U.S. PATENT DOCUMENTS

| | | |
|---|---|---|
| 2010/0117126 A1 | 5/2010 | Takahashi |
| 2010/0176277 A1 | 7/2010 | Kubodera et al. |

FOREIGN PATENT DOCUMENTS

| | | | |
|---|---|---|---|
| JP | 2010-114275 A | 5/2010 | |
| JP | 2010-114322 A | 5/2010 | |
| JP | 2010-192483 A | 9/2010 | |

* cited by examiner

FIG. 48A
(1) (2)
FIG. 48B
(1) (2)
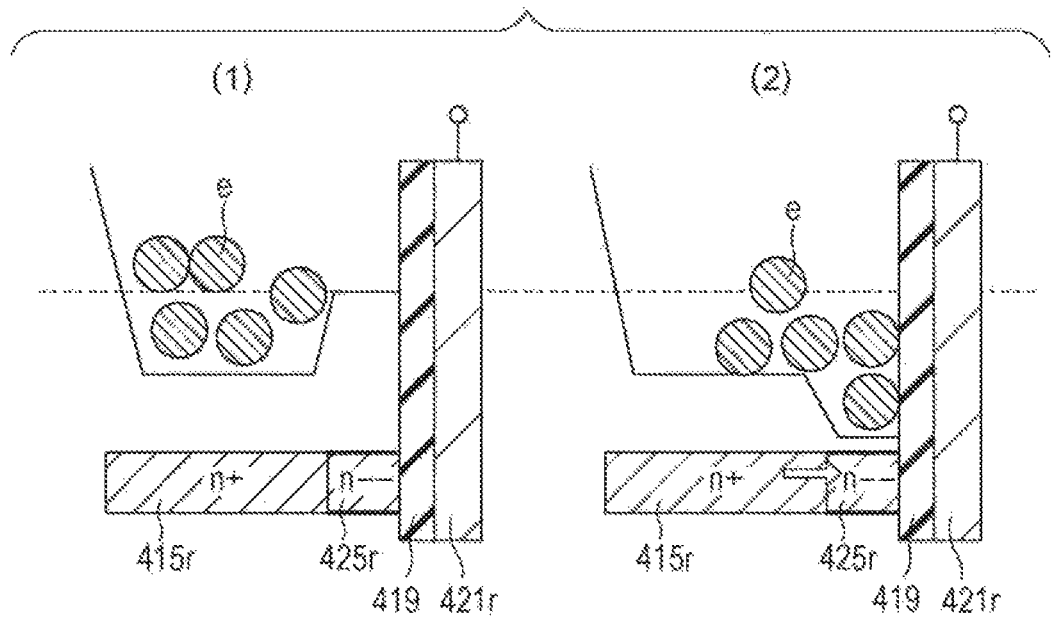
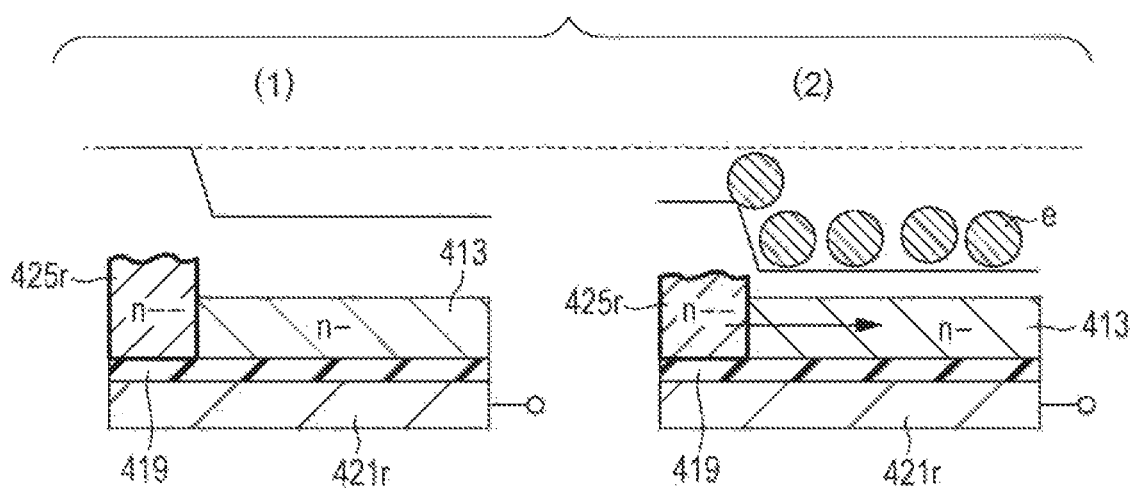

SOLID STATE IMAGE DEVICE HAVING AN IMPURITY CONCENTRATION AT A P/N INTERFACE OF ONE PHOTODIODE BEING EQUAL TO OR GREATER THAN AT P/N INTERFACE OF ANOTHER PHOTODIODE WITHIN A SEMICONDUCTOR SUBSTRATE

CROSS-REFERENCE PARAGRAPH

The present application is a continuation application of U.S. patent application Ser. No. 13/540,760, filed on Jul. 3, 2012, which claims the priority from prior Japanese Priority Patent Application JP 2011-176057 filed in the Japan Patent Office on Aug. 11, 2011, and prior Japanese Priority Patent Application JP 2011-153914 filed in the Japan Patent Office on Jul. 12, 2011, the entire contents of which are hereby incorporated by reference.

BACKGROUND

The present technology relates to a solid-state imaging device, a solid-state imaging device manufacturing method, and an electronic device employing this solid-state imaging device.

With solid-state imaging devices having a photoelectric conversion region, there is a solid-state imaging device having a configuration wherein multiple photoelectric conversion regions are disposed in the depth direction of a semiconductor substrate. With such a solid-state imaging device, a trench is formed in proximity to a photoelectric conversion region disposed in a depth position of the semiconductor substrate, and a readout gate is disposed within this trench via a gate insulating film.

With the solid-state imaging device thus configured, a channel is formed in a position along the gate insulating film between the depth position where the photoelectric conversion region is disposed and a floating diffusion within the semiconductor substrate. Signal charges accumulated in the photoelectric conversion region are read out to the floating diffusion via this channel by applying voltage to a readout gate embedded in the trench (see Japanese Unexamined Patent Application Publication No. 2009-295937).

Also, a configuration has been disclosed wherein a semiconductor substrate region where a channel between a photoelectric conversion region having an n-type impurity region disposed in a depth position of a semiconductor substrate and a floating diffusion made up of an n-type impurity region is formed is taken as an n-type impurity region having low concentration. With such a configuration, the photoelectric conversion region is completely depleted by adjusting the n-type impurity concentration, whereby all of the signal charges can be transferred (see Japanese Unexamined Patent Application Publication No. 2010-114322).

Also, with regard to rear face irradiation type solid-state imaging devices, improvement in saturation charge amount, and high sensitivity have been demanded.

As a configuration for increasing saturation charge amount, a solid-state imaging device has been proposed wherein multiple photodiodes are formed in the depth direction within a substrate (see Japanese Unexamined Patent Application Publication No. 2010-114274). With this configuration, saturation charge amount is increased by laminating three photodiodes (PD1, PD2, and PD3) formed with PN junction between an n-type semiconductor region and a p-type semiconductor region on the n-type semiconductor region in the depth direction. Additionally, a vertical-type gate electrode embedded in the depth direction from the surface of the substrate is provided as a transfer transistor (Tr). Electric charges are transferred to the floating diffusion (FD) from a photodiode PD formed in a depth position of the substrate using this vertical-type Tr.

Also, as for a configuration for enabling high sensitivity, a solid-state imaging device has been proposed wherein a second photodiode PD2 is provided on the light incident side (substrate rear face), and a first photodiode PD1 is provided on the opposite face (substrate front face) on the light incident side (see Japanese Unexamined Patent Application Publication No. 2010-192483).

With this solid-state imaging device, the first photodiode PD1 and floating diffusion (FD) and so forth are formed by injecting ions into the surface of the semiconductor substrate. Further, after forming a gate electrode, a wiring layer, or the like on the semiconductor substrate, the semiconductor substrate is reversed, and the rear face of the semiconductor substrate is ground.

Next, ions are injected from the rear face side of the semiconductor substrate to perform activation of impurities by heat treatment of 1000° C. such as laser annealing or the like for example to form a second photodiode PD2 and so forth.

SUMMARY

However, with the solid-state imaging devices configured such as described above, though all of the signal charges of a photoelectric conversion region disposed in a relatively shallow position within the semiconductor substrate may be read out, it is difficult to read out signal charges of a photoelectric conversion region positioned in a deep portion. This is because in the case of having turned on the readout gate, a region of which the potential is deeper than a channel portion is formed in a portion in proximity to the gate insulating film in the n-type impurity region making up the photoelectric conversion region, and signal charges are remained in this deep region. Such remaining of signal charges becomes a cause for generating an afterimage as to an imaged image according to this solid-state imaging device. Also, with the solid-state imaging device, further improvement in saturation charge amount has been demanded.

Therefore, with the present technology, it has been found to be desirable to provide a solid-state imaging device whereby all signal charges of a photoelectric conversion region can be read out regardless of deep positions of the semiconductor substrate, thereby realizing improvement in imaging properties. Also, with the present technology, it has been found to be desirable to provide a solid-state imaging device whereby improvement in saturation charge amount can be realized. Also, with the present technology, it has been found to be desirable to provide a manufacturing method for such a solid-state imaging device, and an electronic device including such a solid-state imaging device.

A solid-state imaging device according to the present technology includes a readout gate embedded within a trench formed in a semiconductor substrate via a gate insulating film, and a photoelectric conversion region provided within the semiconductor substrate. Further, a floating diffusion is provided on the surface layer of the semiconductor substrate while keeping an interval with the photoelectric conversion region. In particular, a potential adjustment region is provided adjacent to the photoelectric conversion region and gate insulating film. This potential adjustment region is the same electroconductive type as the semiconductor substrate and photoelectric conversion region, and is also an impurity region of which the electroconductive-type concentration is lower than the semiconductor substrate and photoelectric conversion region.

With the solid-state imaging device having such a configuration, the steps in potential decrease in a channel-formed region along the gate insulating film as compared to a configuration where no potential adjustment is provided. Also, for example, in the case that all of the photoelectric conversion region, a region along the gate insulating film in the semiconductor substrate, and the potential adjustment region are the n-types, the potential of the semiconductor substrate is shallower than the potential adjustment region. Therefore, in the event of reading out signal charges (electrons) accumulated in the photoelectric conversion region to the potential adjustment region by applying voltage to the readout gate, the signal charges (electrons) are read out to the channel-formed region of the semiconductor substrate along the gate insulating film without disturbance.

Also, the present technology is also a manufacturing method for such a solids-state imaging device, and performs the following procedures. First, an impurity is introduced into the semiconductor substrate. Thus, a photoelectric conversion region is formed within the semiconductor substrate. Also, along with this, a potential adjustment region which is the same electroconductive type as with the semiconductor substrate and photoelectric conversion region, and is also low in the concentration of this electroconductive type as compared to the semiconductor substrate and photoelectric conversion region is formed adjacent to the photoelectric conversion region. Next, a trench adjacent to the potential adjustment region is formed in the semiconductor substrate. After this, a readout gate is formed within the trench via a gate insulating film. Also, a floating diffusion is formed in proximity to the readout gate by introducing an impurity into the surface layer of the semiconductor substrate.

Also, a solid-state imaging device according to the present technology includes a first photodiode made up of a first first-electroconductive-type semiconductor region formed on a first principal face side of a semiconductor substrate, and a first second-electroconductive-type semiconductor region formed within the semiconductor substrate adjacent to the first first-electroconductive-type semiconductor region, and a second photodiode made up of a second second-electroconductive-type semiconductor region formed on a second principal face side of the semiconductor substrate, and a second second-electroconductive-type semiconductor region formed within the semiconductor substrate adjacent to the second first-electroconductive-type semiconductor region, and also includes a gate electrode formed on the first principal face side of the semiconductor substrate. With the above configuration, impurity concentration of a connection face between the second first-electroconductive-type semiconductor region and the second second-electroconductive-type semiconductor region is equal to or greater than impurity concentration of a connection face of an opposite layer of the second first-electroconductive-type semiconductor region of the second second-electroconductive-type semiconductor region.

Alternatively, with the above configuration, the first second-electroconductive-type semiconductor region and the second second-electroconductive-type semiconductor region are connected within the semiconductor substrate. Also, the impurity concentration of a connection face between the second first-electroconductive-type semiconductor region and the second second-electroconductive-type semiconductor region is equal to or smaller than impurity concentration of a connection face between the first second-electroconductive-type semiconductor region of the second second-electroconductive-type semiconductor region.

Also, the electronic device according to the present technology includes the above solid-state imaging device, and an optical system configured to guide incident light into an imaging unit of the solid-state imaging device, and a signal processing circuit configured to process an output signal of the solid-state imaging device.

A solid-state imaging device manufacturing method according to the present technology includes: injecting a second-electroconductive-type impurity from the first principal face side of a semiconductor substrate to form a first second-electroconductive-type semiconductor region within the first principal face side of the semiconductor substrate; injecting a first-electroconductive-type impurity from the first principal face side of the semiconductor substrate to form a first first-electroconductive-type semiconductor region on the surface of the first principal face of the semiconductor substrate; forming a gate electrode on the first principal face of the semiconductor substrate; injecting a second-electroconductive-type impurity from the second principal face side of the semiconductor substrate to form a second second-electroconductive-type semiconductor region within the second principal face side of the semiconductor substrate, of which the impurity concentration on the surface side of the second principal face is equal to or greater than impurity concentration on the deep portion side of the semiconductor substrate; and injecting a first-electroconductive-type impurity from the second principal face side of the semiconductor substrate to form a second first-electroconductive-type semiconductor region on the surface of the second principal face of the semiconductor substrate.

According to the above solid-state imaging device, and the solid-state imaging device manufactured by the above manufacturing method, a photodiode is formed on the second principal face side of the semiconductor substrate from the first-electroconductive-type semiconductor region and the second-electroconductive-type semiconductor region which have high impurity concentration. Therefore, the photodiode having great PN junction capacity is formed on the second principal face side. Accordingly, the saturation signal amount of the solid-state imaging device can be increased.

Also, the present technology is also an electronic device including such a solid-state imaging device.

According to the present technology, the potential steps of the channel-formed region are adjusted by the potential adjustment region, whereby signal charges of the photoelectric conversion region can be read out to the channel-formed region of the semiconductor substrate without disturbance. As a result thereof, all of the signal charges of the photoelectric conversion region can be read out in the solid-state imaging device where the photoelectric conversion region is provided to a deep position of the semiconductor substrate, whereby improvement in imaging properties can be realized by preventing occurrence of an afterimage.

Also, according to the present technology, the solid-state imaging device whereby saturation charge amount can be improved can be provided.

BRIEF DESCRIPTION OF THE DRAWINGS

FIGS. 48A and 48B are diagrams for describing driving of the solid-state imaging device according to the sixth embodiment;

DETAILED DESCRIPTION OF EMBODIMENTS

Figure 1A:
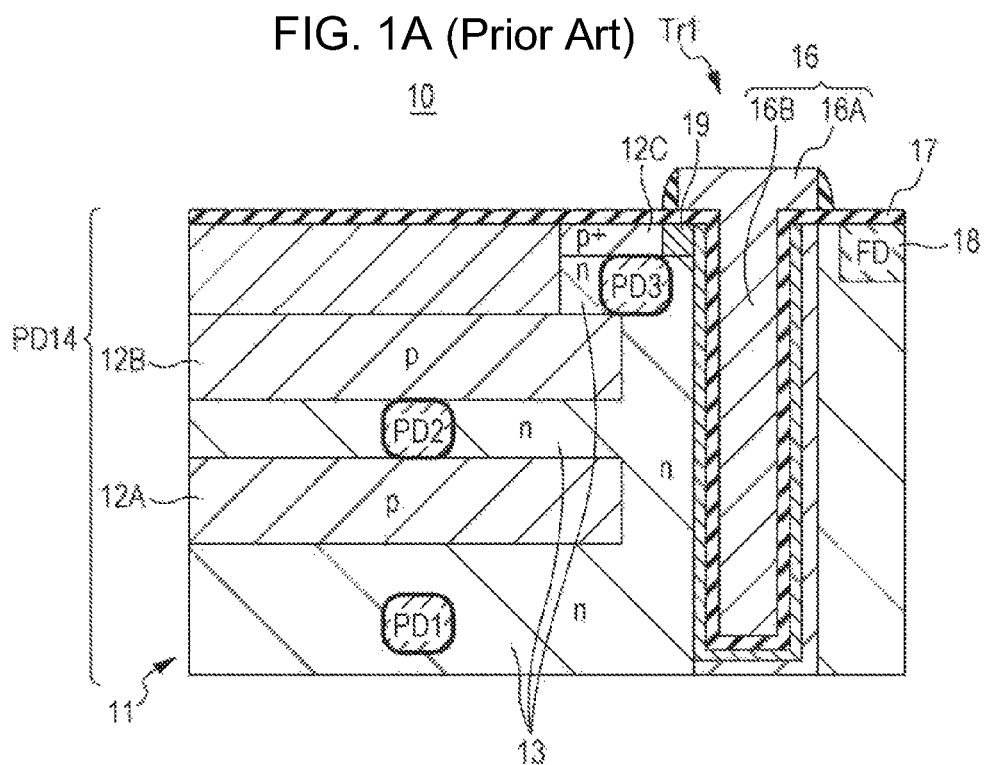
FIG. 1A is a cross-sectional view illustrating the configuration of a solid-state imaging device.

Though most preferable mode examples for implementing the present technology will be described below, the present technology is not restricted to the following examples.

Note that description will be made in the following sequence.

1. Overview of Solid-state Imaging Device
2. First Embodiment of Solid-state Imaging Device
3. Solid-state Imaging Device Manufacturing Method According to First Embodiment
4. Second Embodiment of Solid-state Imaging Device
5. Solid-state Imaging Device Manufacturing Method According to Second Embodiment
6. Third Embodiment of Solid-state Imaging Device
7. Solid-state Imaging Device Manufacturing Method According to Third Embodiment
8. Fourth Embodiment of Solid-state Imaging Device
9. Solid-state Imaging Device Manufacturing Method According to Fourth Embodiment
10. Fifth Embodiment of Solid-state Imaging Device
11. Solid-state Imaging Device Manufacturing Method According to Fifth Embodiment
12. Sixth Embodiment (Example of Solid-state Imaging Device to Which Potential Adjustment Region Is Provided)
13. Seventh Embodiment (Example of Solid-state Imaging Device to Which Pinning Region Overlapped with Potential Adjustment Region Is Provided)
14. Modifications
15. Embodiment of Electronic Device Note that, with the embodiments and modifications, common components are denoted with the same reference numerals, and redundant description will be omitted.

1. Overview of Solid-State Imaging Device

First, overview of a solid-state imaging device will be described.

Figure 1B:
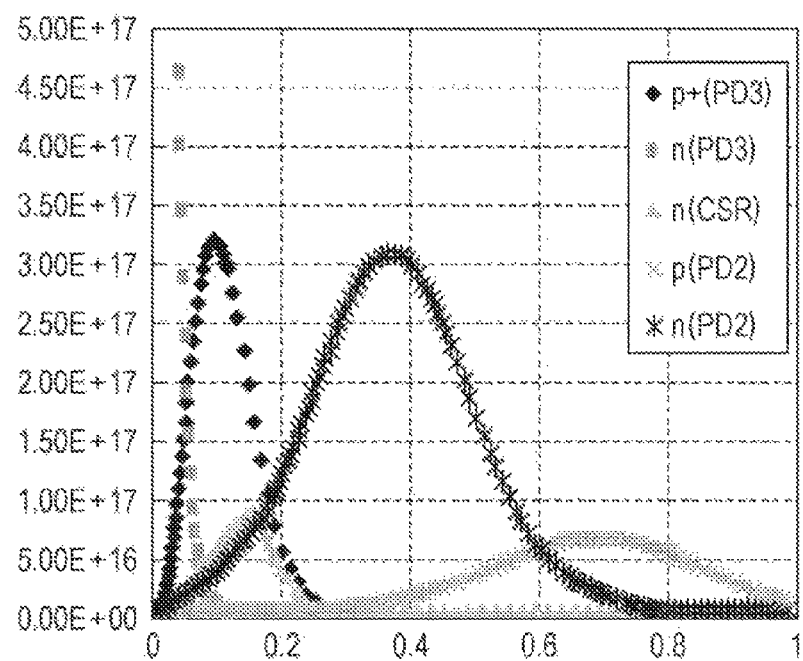
FIG. 1B is a potential profile in the depth direction in a photodiode of the solid state imaging device.

FIGS. 1A and 1B illustrate the configuration of a solid-state imaging device disclosed in the above Japanese Unexamined Patent Application Publication No. 2010-114274. FIG. 1A is a cross-sectional view illustrating the configuration of the solid-state imaging device, and FIG. 1B is a potential profile in the depth direction in a photodiode (PD) of the solid-state imaging device illustrated in FIG. 1A.

A solid-state imaging device 10 illustrated in FIG. 1A includes a three-layered photodiode (PD) 14 in different depths within a semiconductor substrate 11.

The solid-state imaging device 10 includes a first photodiode (PD1) formed with a connection face between a first electroconductive type (p type) semiconductor region 12A and a second electroconductive type (n type) semiconductor region 13 in a deep position of the semiconductor substrate 11, includes a third photodiode (PD3) formed with a connection face between a first electroconductive type (p+ type) semiconductor region 12C of which the impurity concentration is greater than other regions, and a second electroconductive type (n type) semiconductor region 13 on the surface of the semiconductor substrate 11, and also includes a second photodiode (PD2) formed with a connection face between a first electroconductive type (p type) semiconductor region 12B, and a second electroconductive type (n type) semiconductor region 13 on an intermediate layer between the first photodiode (PD1) and the third photodiode (PD3).

Also, the solid-state imaging device 10 includes a vertical-type transistor (Tr) which reads out electric charges of the PD 14. The vertical-type Tr is configured of a readout gate electrode 16 formed via a gate insulating film 17, a transfer channel 19 for transferring signal charges, and a floating diffusion (FD) 18 for accumulating transferred signal charges.

The readout gate electrode 16 is made up of a planar gate electrode 16A formed on the semiconductor substrate 11, and a vertical-type gate electrode 16B formed in a columnar shape in the depth direction from the surface of the semiconductor substrate 11 under the planar gate electrode 16A.

The FD 18 is made up of a second electroconductive type (n+ type) semiconductor region having high concentration. The FD 18 is formed in a position facing the PD 14 on the face of the semiconductor substrate 11 via the readout gate electrode 16.

Also, an overflow path is configured of an n-type semiconductor region 13 formed from the surface to the inner portion of the semiconductor substrate 11 along the vertical-type gate electrode 16B. That is to say, of the second electroconductive type semiconductor region 13, portions adjacent to the first electroconductive type semiconductor region 12A through 12C make up the PD 1 through 3. Of the second electroconductive type semiconductor region 13, a portion formed from the surface to the inner portion of the semiconductor substrate 11 along the vertical-type gate electrode 16B makes up an overflow path.

The transfer channel 19 is configured of a second electroconductive type (n− type) semiconductor region having low concentration, and is formed immediately below the planar gate electrode 16A adjacent to a first electroconductive type semiconductor region 12C. The transfer channel 19 is formed adjacent to the FD 18 and an n-type semiconductor region 13 making up an overflow path.

Next, description will be made regarding potential profiles of the PD 3 formed on the surface of the semiconductor substrate 11, and the PD 2 formed in a deep position of the semiconductor substrate 11 shown in FIG. 1B. A potential profile illustrated in FIG. 1B illustrates the potentials of the second electroconductive type semiconductor region 13 and the first electroconductive type semiconductor regions 12A and 12B making up the PD 14.

The PD 14 and FD 18 of the solid-state imaging device 10 illustrated in the above FIG. 1 are formed by ion injection from the surface side of the semiconductor substrate 11. Therefore, as illustrated in FIG. 1B, in the case of forming a photodiode in a deep position of the semiconductor substrate 11, a PN junction between the first electroconductive type semiconductor region and the second electroconductive type semiconductor region has to be created by ion injection with high energy. Therefore, the impurity of each of the first electroconductive type semiconductor region and the second electroconductive type semiconductor region extends into a wide range, and impurity profiles become moderate. As a result thereof, impurity concentration around the PN junction is reduced. Therefore, the PD 1 formed in a deep position of the semiconductor substrate 11 is small in capacity per increment area, and is small in saturation signal amount that can be accumulated.

Accordingly, with the configuration of the solid-state imaging device 10 illustrated in FIGS. 1A and 1B, even when increasing the photodiode itself in the depth direction of the semiconductor substrate 11, the saturation signal amount of the photodiode of a substrate deep portion is small, and accordingly, saturation signal amount increase efficiency is poor, and no great advantage is obtained in increase of saturation charge amount.

Figure 2A:
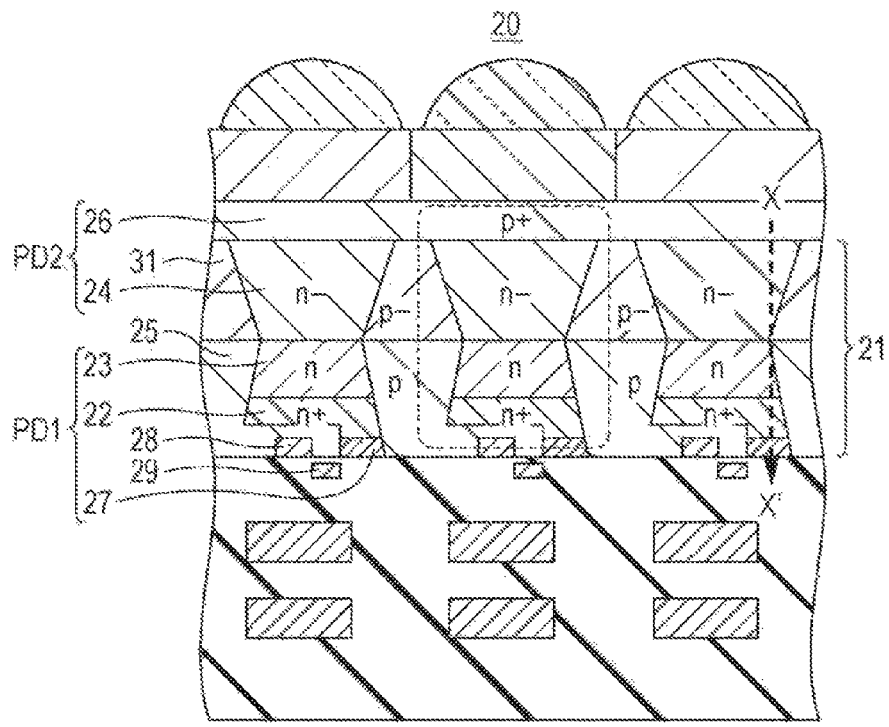
FIG. 2A is a cross-sectional view illustrating the configuration of a solid-state imaging device.
Figure 2B:
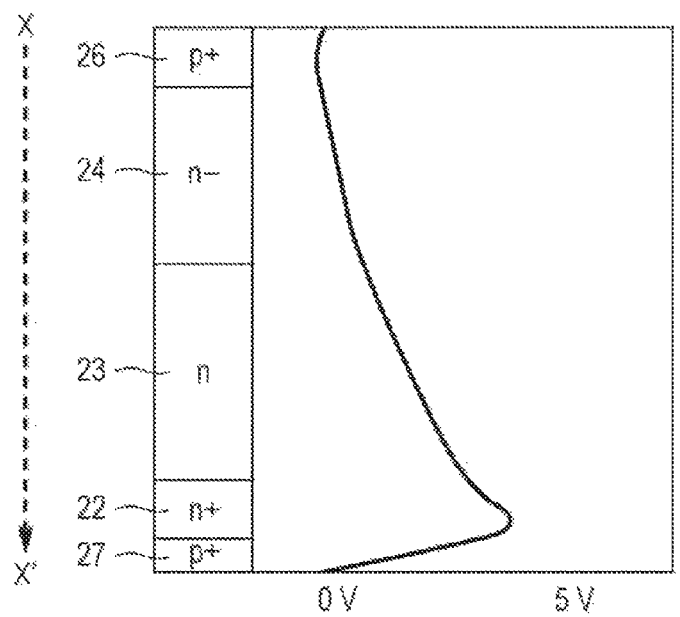
FIG. 2B is a potential profile in the depth direction in a photodiode of the solid state imaging device.

Next, FIGS. 2A and 2B illustrate the configuration of the solid-state imaging device disclosed in the above Japanese Unexamined Patent Application Publication No. 2010-192483. FIG. 2A is a cross-sectional view illustrating the configuration of the solid-state imaging device, and FIG. 2B is a potential profile in the depth direction in X-X' cross-section of a photodiode (PD) of the solid-state imaging device illustrated in FIG. 2A.

With a solid-state imaging device 20 illustrated in FIG. 2A, a first photodiode (PD 1) is formed on the opposite face side (substrate front face) of the light incident face of a semiconductor substrate 21, and a second photodiode (PD 2) is formed on the light incident face (substrate rear face) side. A first electroconductive type (p type) semiconductor region 25 and a first electroconductive type (p type) semiconductor region 31 are provided between the PD 1 and PD 2 as pixel separation regions.

Also, optical components such as a color filter, a micro lens, and so forth are mounted on the incident face (substrate rear face) of the semiconductor substrate 21. A wiring layer, a MOS transistor for reading out signal charges subjected to photoelectric conversion and accumulated, and so forth are formed on the substrate front face side.

The PD 1 is configured of a charge accumulating region made up of a second electroconductive type (n+ type) semiconductor region 22 having high concentration, a photoelectric conversion region made up of a second electroconductive type (n type) semiconductor region 23, and a first electroconductive type (p+ type) semiconductor region 27 having high concentration for suppressing occurrence of dark current. Also, the PD 2 is configured of a photoelectric conversion region made up of a second electroconductive type (n− type) semiconductor region 24, and a first electroconductive type (p+ type) semiconductor region 26 having high concentration.

According to the above configuration, as illustrated in FIG. 2B, with the PD 1 and PD 2, a sufficient potential region is formed up to a deep region.

A smooth slope is formed from the second electroconductive type semiconductor region 24 of the PD 2 on the rear face side to the second electroconductive type semiconductor region 22 of the PD 1 on the front face side. The PD 2 on the rear face side has to transfer electric charges to the transfer Tr formed on the front face side of the semiconductor substrate 21, and accordingly, the potential has to be lower than the PD 1 on the front face side.

Next, a forming method for the PD 1 and PD 2 of the solid-state imaging device illustrated in FIG. 2A will be described.

First, the PD 1, an impurity diffusion region making up the vertical-type Tr, and a p-type semiconductor region 25 serving as a pixel separation region are formed by ion injection as to the face side of the semiconductor substrate 21 using normal process flow. Further, an insulating layer and an electroconductive layer are formed on the semiconductor substrate 21, and a gate electrode and wirings and so forth are formed.

Next, the wiring layer side of the semiconductor substrate 21 is adhered to a supporting substrate, and the semiconductor substrate 21 is thinned down to a thickness of around 1 to 1.5 μm using CMP (Chemical Mechanical Polishing) or etching. Next, ion injection for forming a p− type semiconductor region 31 serving as a pixel separation region, and ion injection for forming the PD 2 are performed from the rear face side of the semiconductor substrate 21. After ion injection, laser annealing is performed on the rear face side to active the formed impurity region, and to form the PD 2.

As described above, with the solid-state imaging device illustrated in FIG. 2A, the PD 1 is formed by ion injection from the front face side of the semiconductor substrate 21. Next, the PD 2 is formed by ion injection from the rear face of the semiconductor substrate 21.

According to performing ion injection from the two directions of the front face side and rear face side of the semiconductor substrate 21, an impurity is suppressed from extending into a wide range at a deep portion of the semiconductor substrate 21, and a light receiving region can be extended in the depth direction of the semiconductor substrate 21. Therefore, the increase ratio of saturation charge amount can be improved. Also, the PD 2 on the rear face side can be formed with relatively low energy.

However, with the solid-state imaging device 20 illustrated in the above FIGS. 2A and 2B, electric charges have to be moved to the front face side of the semiconductor substrate 21 using the potential slope of the semiconductor substrate 21. Therefore, the impurity concentration of the PD 2 on the rear face side is not the same or denser than the PD 1 on the front face side. Accordingly, increase in saturation signal amount is not expected.

Figure 3A:
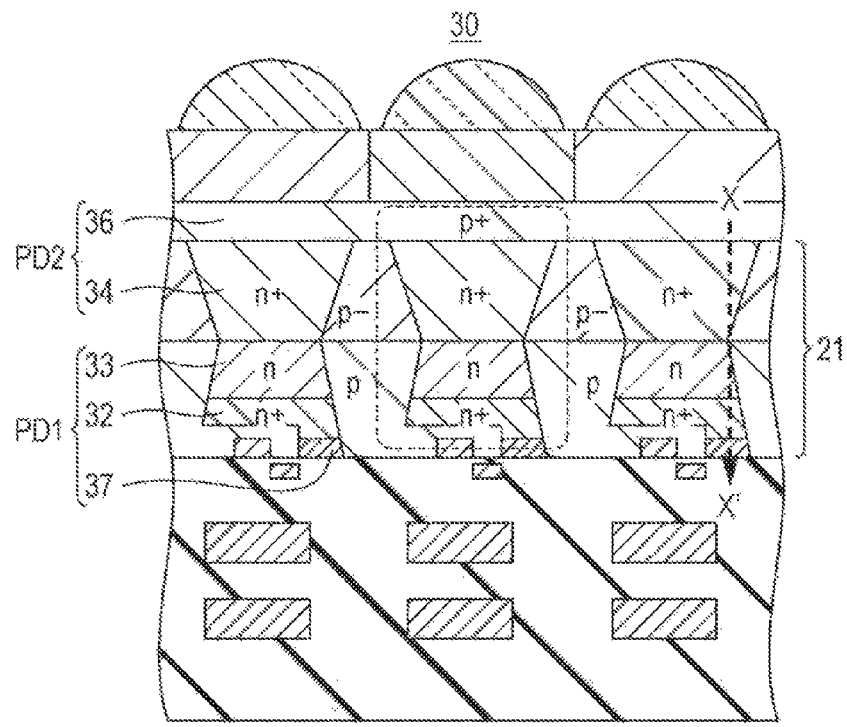
FIG. 3A is a cross-sectional view illustrating the configuration of a solid-state imaging device.
Figure 3B:
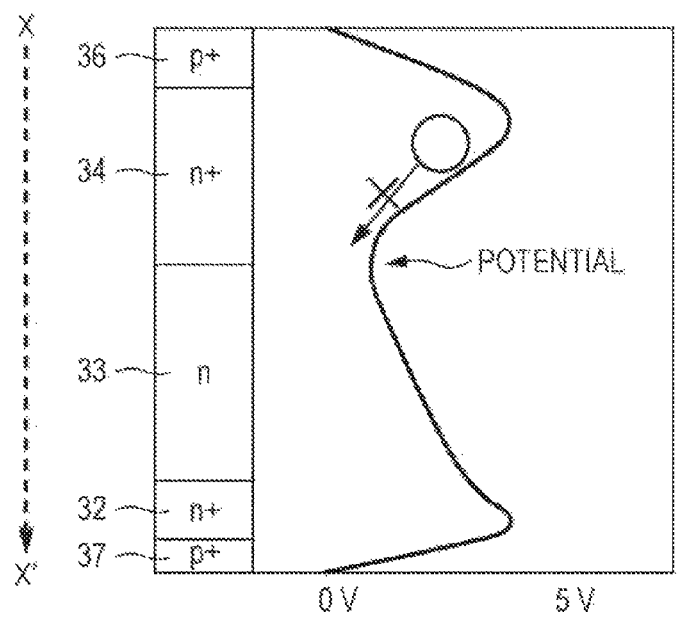
FIG. 3B is a potential profile in the depth direction in a photodiode of the solid state imaging device.

With the solid-state imaging device 20 having the configuration illustrated in the above FIGS. 2A and 2B, a configuration in the case of setting the impurity concentration of the PD 2 on the rear face side to be the same or deeper as compared to the PD 1 on the front face side is illustrated in FIGS. 3A and 3B. FIG. 3A is a cross-sectional view illustrating the configuration of the solid-state imaging device, and FIG. 3B is a potential profile in the depth direction in the X-X' cross-section of the photodiode (PD) of the solid-state imaging device illustrated in FIG. 3A.

With a solid-state imaging device 30 illustrated in FIG. 3A, a first photodiode (PD 1) is formed on the light incident face and the opposite face (substrate front face) side of the semiconductor substrate 21, and a second photodiode (PD 2) is formed on the light incident face (substrate rear face). Note that the other configurations are the same as with the solid-state imaging device 20 illustrated in the above FIG. 2A.

The PD 1 is configured of a charge accumulating region made up of a second electroconductive type (n+ type) semiconductor region 32 having high concentration, a photoelectric conversion region made up of a second electroconductive type (n type) semiconductor region 33, and a first electroconductive type (p+ type) semiconductor region 37 having high concentration for suppressing occurrence of dark current. Also, the PD 2 is configured of a photoelectric conversion region made up of a second electroconductive type (n+ type) semiconductor region 34 of which the concentration is equal to or greater than the PD 1, and a first electroconductive type (p+ type) semiconductor region 36 having high concentration.

According to the above configuration, as illustrated in the potential profile in FIG. 3B, with the PD 1 and PD 2, a sufficient potential region is formed up to a deep region. Also, in the case of setting the impurity concentration of the PD 2 to be equal to or greater than the PD1, the potential of the PD 2 is increased up to the same as with the PD 1.

Upon the potential of the PD 2 being increased, the concentration of the second electroconductive type semiconductor region 33 formed by ion injection from the front face side of the semiconductor substrate is low, and accordingly, a potential barrier is caused between the PD 2 and PD 1. That is to say, with the solid-state imaging device having the configuration illustrated in FIG. 3A, electric charges generated at the photodiode (PD 2) on the rear face side are not transferred to the FD on the surface. Also, the second electroconductive type semiconductor region 33 is formed in a deeper portion of the semiconductor substrate than the second electroconductive type semiconductor region 32, and accordingly, an impurity is readily extended as compared to the second electroconductive type semiconductor region 32, and it is difficult to form high concentration.

Accordingly, upon setting the impurity concentration of the PD 2 on the rear face side to be equal to or denser than the PD 1 on the front face side, a potential barrier is generated in the middle of a transfer path, which disables charge transfer from the PD 2 to the FD. As a result thereof, with the solid-state imaging device 30 illustrated in FIG. 3A, saturation signal amount is not increased.

As described above, from the perspective of charge transfer, with the configuration of a solid-state imaging device according to the related art, the impurity concentration of the PD on the front face side where the transfer Tr is formed has to be set to be higher, and the impurity concentration of the PD formed on the rear face side (light incident face side) has to be set to be lower than the than at the front face side. With this configuration, the impurity concentration at the PD on the front face side can be set to be higher, and accordingly, a steep PN junction between the first electroconductive type semiconductor region and the second electroconductive type semiconductor region is obtained, and PN junction capacity can be increased. However, no steep junction is obtained between the first electroconductive type semiconductor region and the second electroconductive type semiconductor region of the PD on the rear face side, and accordingly, PN junction capacity is not increased.

2. First Embodiment of Solid-State Imaging Device

[Configuration Example of Solid-State Imaging Device: Schematic Configuration Diagram]

A specific embodiment of a solid-state imaging device according to the present embodiment will be described below.

Figure 4:
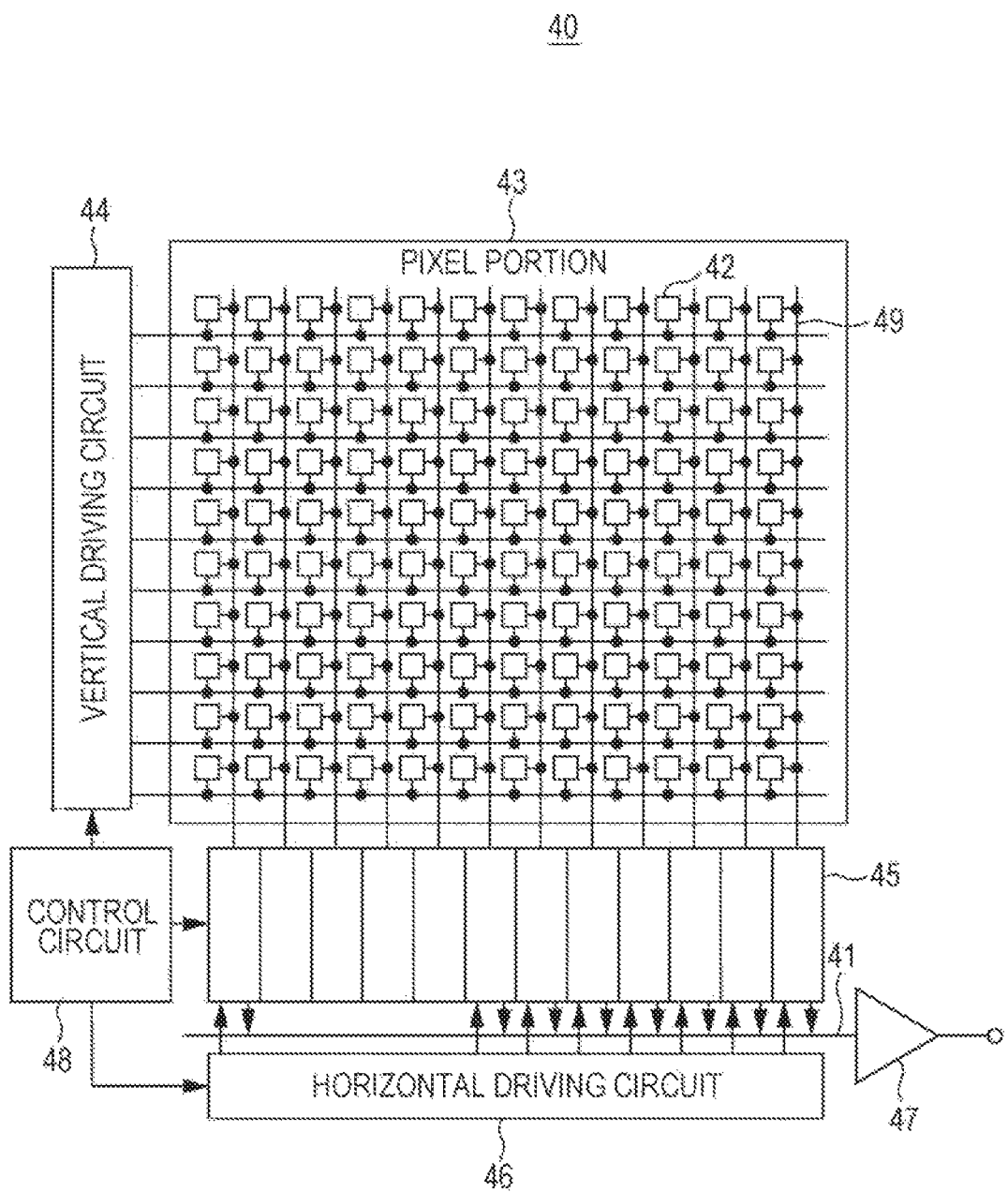
FIG. 4 is a plan view illustrating the configuration of a solid-state imaging device according to a first embodiment.

FIG. 4 illustrates a schematic configuration diagram of a MOS (Metal Oxide Semiconductor) type solid-state imaging device as an example of the solid-state imaging device.

A solid-state imaging device 40 illustrated in FIG. 4 is configured of a semiconductor substrate, for example, a pixel portion (so-called imaging region) 43 where pixels 42 including photodiodes serving as multiple photoelectric conversion units are regularly arrayed in a two-dimensional manner on a silicon substrate, and a peripheral circuit portion. The pixels 42 include photodiodes, and multiple pixel transistors (so-called MOS transistors).

The multiple pixel transistors can be configured of, for example, three transistors of a transfer transistor, a reset transistor, and an amplification transistor. Additionally, the multiple pixel transistors can also be configured of four transistors by adding a selection transistor thereto.

The peripheral circuit portion is configured of a vertical driving circuit 44, column signal processing circuits 45, a horizontal driving circuit 46, an output circuit 47, a control circuit 48, and so forth.

The control circuit 48 generates a clock signal or control signal serving as a reference of operations of the vertical driving circuit 44, column signal processing circuits 45, horizontal driving circuit 46, and so forth based on a vertical synchronizing signal, a horizontal synchronizing signal, and master clock. The control circuit 48 inputs these signals to the vertical driving circuit 44, column signal processing circuits 45, horizontal driving circuit 46, and so forth.

The vertical driving circuit 44 is configured of a shift register, for example. The vertical driving circuit 44 selectively scans the pixels 42 of the pixel portion 43 in increments of rows sequentially in the vertical direction, and supplies a pixel signal based on a signal charge generated according to light receiving amount at the photoelectric conversion element of each pixel 42 through a vertical signal line 49 to the column signal processing circuits 45.

The column signal processing circuits 45 are arrayed for each column of the pixels 42, for example, and subject signals output from four rows worth of pixels 42 to signal processing such noise removal or the like using a signal from a black reference pixel (formed around an effective pixel region) for each pixel column. That is to say, the column signal processing circuits 45 perform signal processing such as CDS (correlated double sampling) for removing fixed pattern noise peculiar to the pixels 42, signal amplification, or the like. A horizontal selection switch (not illustrated) is provided to the output stages of the column signal processing circuits 45 so as to be connected to the horizontal signal line 41.

The horizontal driving circuit 46 is configured of, for example, a shift register, sequentially selects each of the column signal processing circuits 45 by sequentially outputting a horizontal scan pulse, and outputs a pixel signal from each of the column signal processing circuits 45 to the horizontal signal line 41.

The output circuit 47 subjects a signal sequentially supplied from each of the column signal processing circuits 45 through the horizontal signal line 41 to signal processing, and outputs the signal.

The driving circuits for driving the pixels are configured of the above peripheral circuits 44 through 48, and pixel circuits provided to the pixel portion 43. Note that the peripheral circuits 44 through 48 may be disposed in a position laminated on the pixel portion 43.

In the case of applying the above solid-state imaging device 40 to a rear-surface irradiation type solid-state imaging device, no wiring layer is formed on the rear face on the light incident face (so-called light receiving face) side, and a wiring layer is formed on the front face side on the opposite side of the light receiving face. [Configuration Example of Solid-state Imaging Device: Pixel Portion]

Figure 5A:
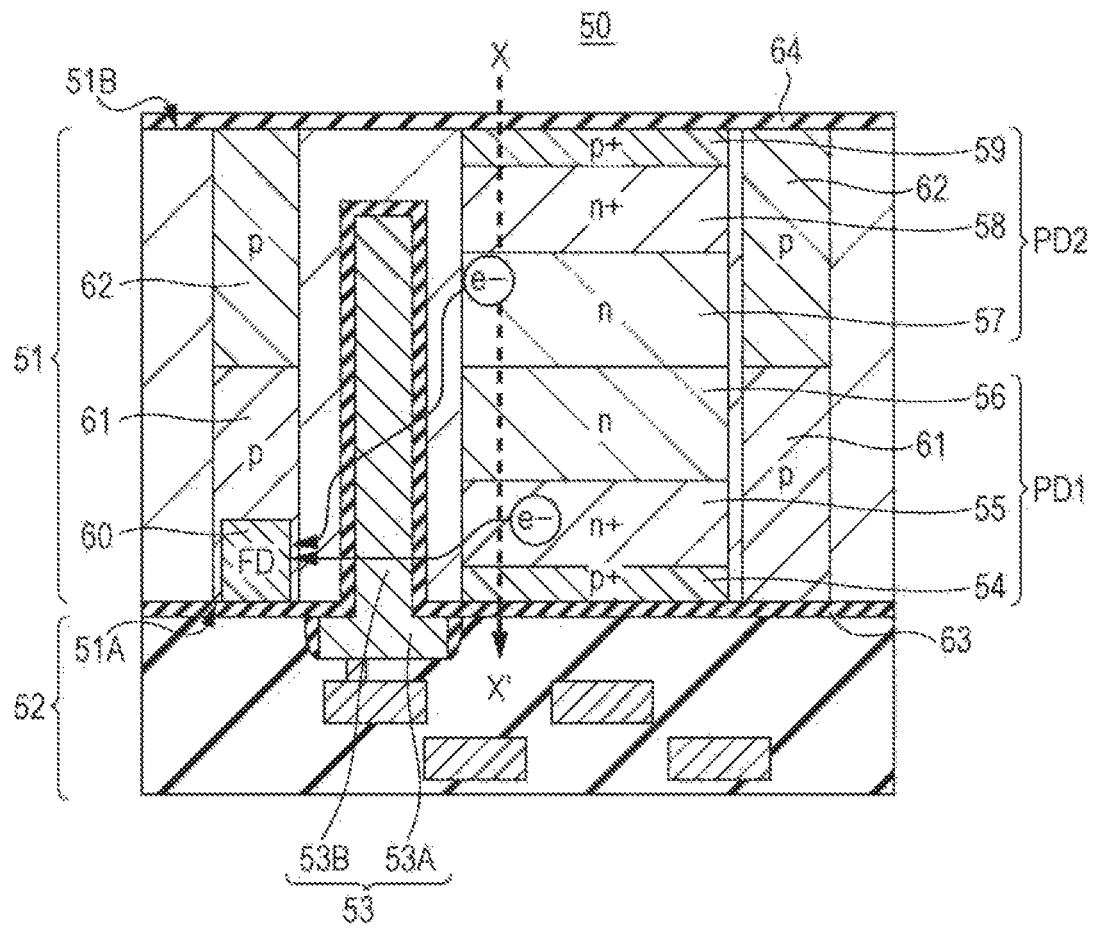
FIG. 5A is a cross-sectional view illustrating the configuration of the solid-state imaging device according to the first embodiment.
Figure 5B:
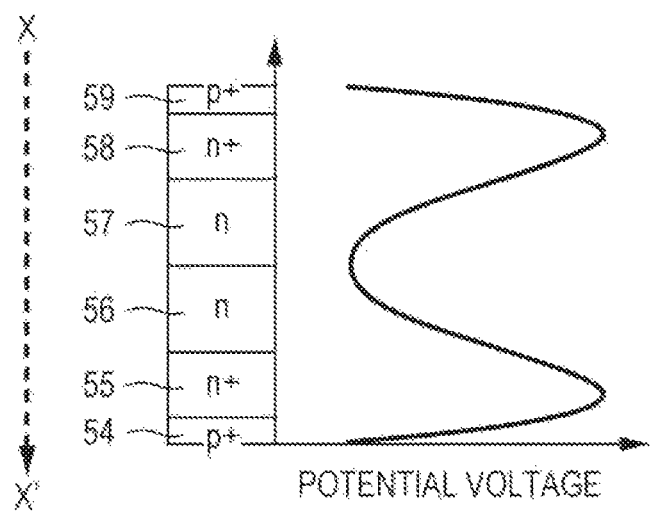
FIG. 5B is a potential profile in the depth direction in a photodiode of the solid state imaging device according to the first embodiment.

Next, FIGS. 5A and 5B illustrate principal portions making up one pixel of the solid-state imaging device according to the first embodiment. FIG. 5A is a cross-sectional view illustrating the configuration of the solid-state imaging device, and FIG. 5B is a potential profile in the depth direction in X-X' cross-section of a photodiode (PD) of the solid-state imaging device illustrated in FIG. 5A.

With a solid-state imaging device 50 illustrated in FIG. 5A, a first photodiode (PD 1) is formed on the surface on an opposite face (substrate front face) 51A side of the light incident face of a semiconductor substrate 51. A second photodiode (PD 2) is formed on the surface on a light incident face (substrate rear face) 51B side of the semiconductor substrate 51.

Also, a wiring layer 52 made up of an insulating layer and a wiring is provided onto the substrate front face 51A of the semiconductor substrate 51. Optical components such as a photoelectric conversion film, a color filter, a micro lens, and so forth which are not illustrated are mounted on the substrate rear face 51B of the semiconductor substrate 51 via an insulating layer 64.

The PD 1 includes, in order from the substrate front face 51A side, a first electroconductive type (p+ type) semiconductor region 54 having high concentration, a second electroconductive type (n+ type) semiconductor region 55 having high concentration, and a second electroconductive type (n type) semiconductor region 56.

The PD 2 includes, in order from the substrate rear face 51B side, a first electroconductive type (p+ type) semiconductor region 59 having high concentration, a second electroconductive type (n+ type) semiconductor region 58 having high concentration, and a second electroconductive type (n type) semiconductor region 57.

The n type semiconductor region 56b of the PD 1, and the n type semiconductor region 57 of the PD 2 are connected at the center of the semiconductor substrate 51, and the PD 1 and PD 2 are integrally formed.

The p+ type semiconductor regions 54 and 59 are impurity regions for suppressing occurrence of dark current at the PD1 or PD 2. The n+ type semiconductor regions 55 and 58 are charge accumulating regions, and the n type semiconductor regions 56 and 57 are photoelectric conversion regions.

With the solid-state imaging device 50, the first electroconductive type semiconductor region of the PD 2 made up of the n+ type semiconductor region 58 and n type semiconductor region 57 is configured so as to have impurity concentration that will be described in the following.

The first electroconductive type semiconductor region of the PD 2 includes an impurity on a face adjacent to the p+ type semiconductor region 59 with impurity concentration equal to or greater than a face adjacent to a layer opposite side of the p+ type semiconductor region 59. Here, with the configuration of the solid-state imaging device illustrated in FIG. 5A, the layer opposite side of the p+ type semiconductor region 59 is the n type semiconductor region 56.

That is to say, the impurity concentration at a joint face between the p+ type semiconductor region 59 and the n+ type semiconductor region 58, and the impurity concentration at a joint face between the n type semiconductor region 57 and the n type semiconductor region 56 of the PD 1 are compared. At this time, the impurity concentration at a joint face between the p+ type semiconductor region 59 and the n+ type semiconductor region 58 is equal to or greater than the impurity concentration at a joint face between the n type semiconductor region 57 and the n type semiconductor region 56 of the PD 1. In this way, the impurity concentration of the first electroconductive type semiconductor region (n+ type semiconductor region 58 and n type semiconductor region 57) of the PD 2 is adjusted.

With regard to the PD 1 as well, in the same way as with the above PD 2, the impurity concentration of the first electroconductive type semiconductor region (n+ type semiconductor region 58 and n type semiconductor region 57) of the PD 1 is adjusted. That is to say, the impurity concentration of the PD 1 is adjusted so that the impurity concentration of the p+ type semiconductor region 55 of the face adjacent to the p+ type semiconductor region 54 is equal to or greater than the impurity concentration of the n type semiconductor region 56 of the face adjacent to the n type semiconductor region 57.

Also, the solid-state imaging device 50 illustrated in FIG. 5A includes a vertical-type transistor (Tr) for reading out electric charges of the PD 1 and PD 2. The vertical-type Tr is configured of a transfer gate electrode 53 formed via the insulating film 63, and a floating diffusion (FD) 60 for accumulating transferred signal charges.

The transfer gate electrode 53 is configured of a planar gate electrode 53A formed on the semiconductor substrate 51, and a vertical-type gate electrode 53B formed in a columnar shape in the depth direction from the surface of the semiconductor substrate 51 below the planar gate electrode 53A.

The FD 60 is made up of a second electroconductive type (n+ type) semiconductor region having high concentration, and is formed on the surface of the semiconductor substrate 51 in a position facing the PD 1 and PD 2 via the transfer gate electrode 53.

Also, a first pixel separation portion 61 and a second pixel separation portion 62 are formed by a first electroconductive type (p type) semiconductor region as pixel separation regions for sectioning the increment pixels. The first and second pixel separation portions 61 and 62 are formed between adjacent pixels. The first pixel separation portion 61 is formed on the front face 51A side of the semiconductor substrate 51, and the second pixel separation portion 62 is formed on the rear face 51B side of the semiconductor substrate 51. The first pixel separation portion 61 and second pixel separation portion 62 are connected and integrated at the center of the semiconductor substrate 51. Also, the FD 60 is formed within the first pixel separation portion 61.

Next, description will be made regarding a potential profile in the depth direction in the X-X' cross-section of the PD 1 and PD 2 of the solid-state imaging device having the above configuration. As illustrated in FIG. 5B, with the PD 1 and PD 2, a sufficient potential region is formed up to a deep region.

Also, with the solid-state imaging device 50, the impurity concentration of the PD 2 is formed similar to the PD 1. Therefore, the potential of the n+ type semiconductor region 58 of the PD 2 is formed high in the same level as with the n+ type semiconductor region 55 of the PD 1.

Also, with the PD 2, the potential of the n+ type semiconductor region 58 is high, and the potential is gently lowered from the n+ type semiconductor region 58 to the n type semiconductor region 57 side. In this way, the potential profile is formed in accordance with the above impurity concentration of the PD2. That is to say, a connection face between the p+ type semiconductor region 59 and the n+ type semiconductor region 58 on the rear face 51B side of the semiconductor substrate 51 has an impurity of concentration equal to or greater than a connection face between the PD 1 and PD 2. Therefore, the potential of the n+ type semiconductor region 58 on the p+ type semiconductor region 59 side becomes high.

With the configuration of the above solid-state imaging device 50, positive voltage is applied to the transfer gate electrode 53 at the time of readout, whereby the potential (voltage) immediately below the transfer gate electrode 53 is changed. Signal charges accumulated in the PD 1 and PD 2 are passed through a region around the vertical-type gate electrode 53B of the transfer gate electrode 53 and transferred to the FD 60.

At this time, the impurity concentration of the PD 2 on the rear face side is high, and even with a configuration wherein charge transfer according to potential slope according to the related art is not performed, electric charges accumulated in the n+ type semiconductor region 58 of the PD 2 and the n type semiconductor region 57 with the gate electrode 53 are transferred to the FD 60 by the vertical-type Tr.

In this way, according to the configuration of the solid-state imaging device 50, the electric charges of the PD 2 formed with the same impurity concentration as with the PD 1 can be read out. Accordingly, the impurity concentration of the PD 2 formed on the rear face 51B can be increased, and accordingly, a steep PN junction is obtained between the p+ type semiconductor region 59 and the n+ type semiconductor region 58. The PN junction capacity of the PD 2 can be increased, and the saturation signal amount of the solid-state imaging device 50 can be increased.

3. Solid-State Imaging Device Manufacturing Method According to First Embodiment Next, an example of a solid-state imaging device manufacturing method according to the first embodiment will be described. Note that, with description of the following manufacturing method, the same configurations as with the configurations of the solid-state imaging device 50 according to the first embodiment illustrated in the above FIGS. 5A and 5B are denoted with the same reference numerals, and the details of the configurations will be omitted. Also, description will be omitted regarding the manufacturing method for the semiconductor substrate, wiring layers, other various types of transistors, and various elements formed on the solid-state imaging device. These can be manufactured by a method according to the related art.

Figure 6A:
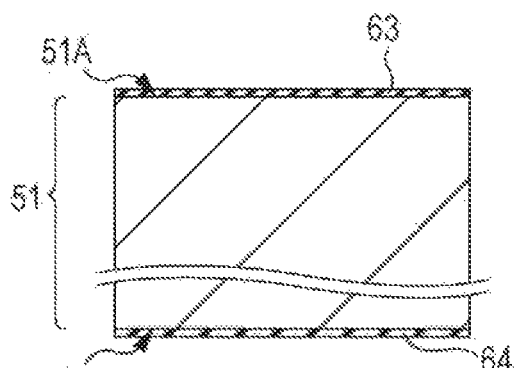
FIGS. 6A through 6D are manufacturing process diagrams of the solid-state imaging device according to the first embodiment.

First, as illustrated in FIG. 6A, the semiconductor substrate 51 is prepared. As for the semiconductor substrate 51, a Si substrate is employed, for example. Insulating layers 63 and 64 for surface protection made up of a thermally-oxidized film or the like are formed on the front face 51A and rear face 51B of the semiconductor substrate 51.

Figure 6B:
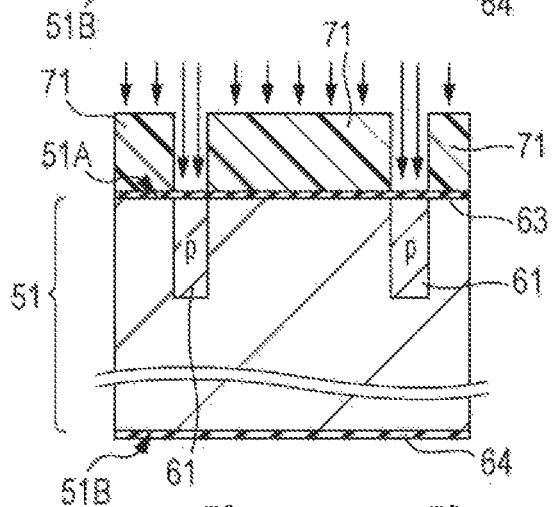

Next, as illustrated in FIG. 6B, a resist layer 71 is formed on the front face 51A of the semiconductor substrate 51. The resist layer 71 is formed with a pattern for opening a position where a pixel separation region for sectioning between pixels of the solid-state imaging device is formed, using the photolithographic technique.

Next, the first electroconductive type (p type) impurity is ion-injected into the semiconductor substrate 51 from the opening of the resist layer 71. According to this ion injection, the first pixel separation portion 61 is formed on the front face 51A side of the semiconductor substrate 51. Depth where the first pixel separation portion 61 is formed is around half of the thickness of the semiconductor substrate 51 at the time of finally forming the solid-state imaging device 50.

Figure 6C:
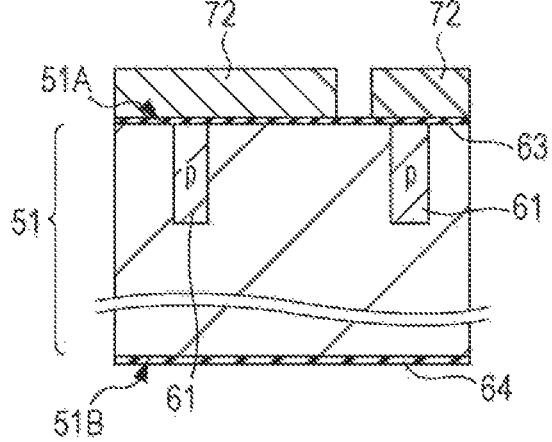

Next, as illustrated in FIG. 6C, a resist layer 72 is formed on the front face 51A of the semiconductor substrate 51. The resist layer 72 is formed with a pattern for opening a position where the vertical-type gate electrode 53B of the transfer gate electrode 53 of the solid-state imaging device is formed, using the photolithographic technique.

Figure 6D:
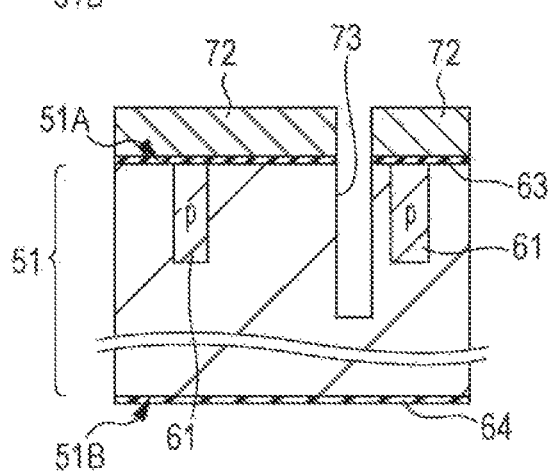
Figure 7E:
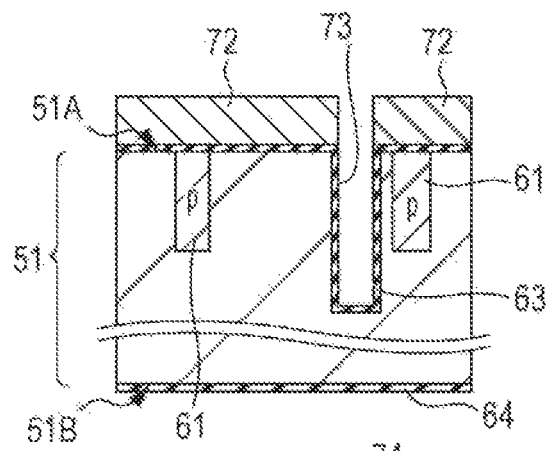
FIGS. 7E through 7H are manufacturing process diagrams of the solid-state imaging device according to the first embodiment.

Next, as illustrated in FIG. 6D, the semiconductor substrate 51 and insulating layer 63 are subjected to etching from the opening of the resist layer 72 using anisotropic etching. A trench 73 is formed on the semiconductor substrate 51. Further, as illustrated in FIG. 7E, an insulating layer 63 made up of a thermally-oxidized film or the like is formed on the semiconductor substrate 51 exposed within the trench 73.

Figure 7F:
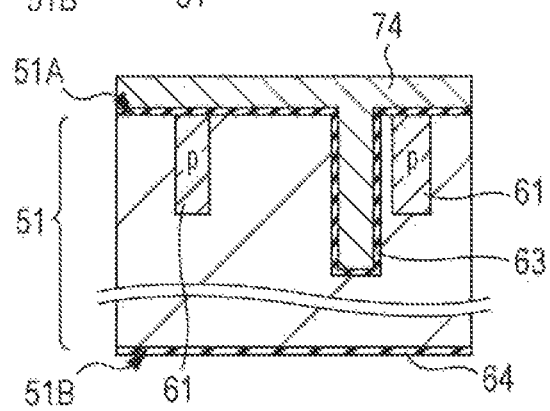

Next, after removing the resist layer 72, as illustrated in FIG. 7F, a gate electrode material layer 74 made up of polysilicon or the like is formed on the semiconductor substrate 51. With this gate electrode material layer 74, after the trench 73 of the semiconductor substrate 51 is embedded and formed, the surface is flattened using the CMP method or the like.

Figure 7G:
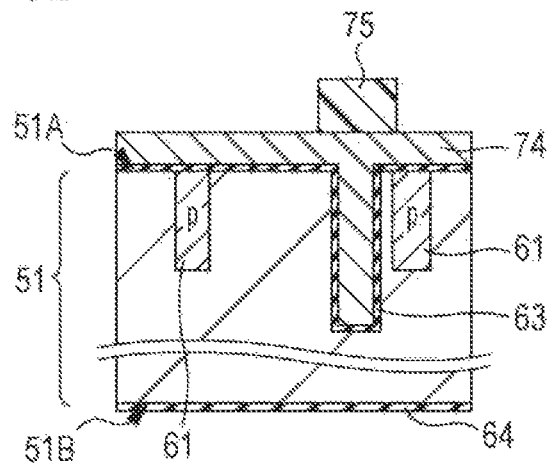

Next, as illustrated in FIG. 7G, a resist layer 75 is formed on the gate electrode material layer 74. The resist layer 75 is formed with pattern remaining on a position where the gate electrode 53 of the solid-state imaging device is formed, and particularly a region where the planar gate electrode 53A is formed, using the photolithographic technique.

Figure 7H:
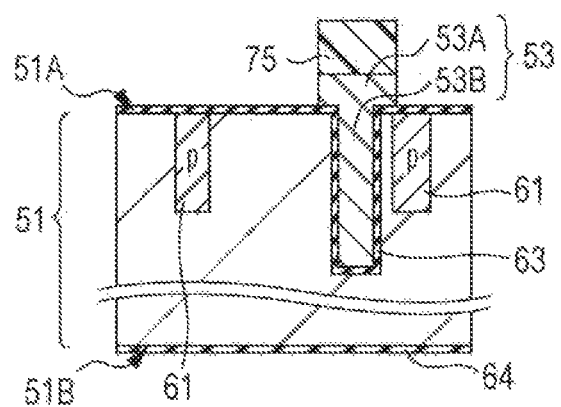

Next, as illustrated in FIG. 7H, the gate electrode material layer 74 is subjected to etching with the resist layer 75 as a mask. Thus, the gate electrode 53 is formed. With the gate electrode 53, a portion formed within the trench 73 of the semiconductor substrate 51 serves as a vertical-type gate electrode 53B, and a portion formed on the surface of the semiconductor substrate 51 serves as a planar gate electrode 53A.

Figure 8I:
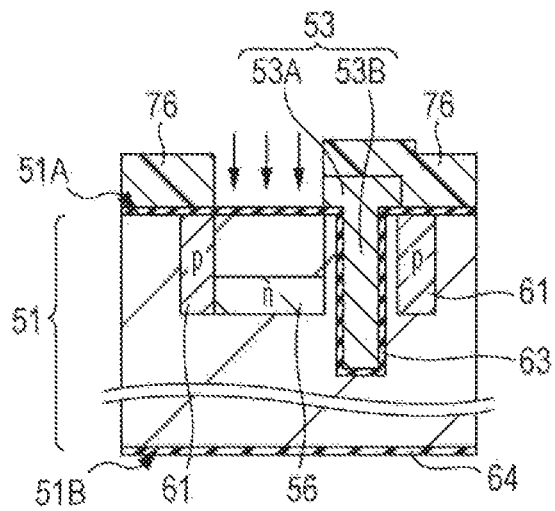
FIGS. 8I through 8K are manufacturing process diagrams of the solid-state imaging device according to the first embodiment.

Next, as illustrated in FIG. 8I, a resist layer 76 is formed on the semiconductor substrate 51. The resist layer 76 is formed with a pattern for opening a position where the PD 1 of the solid-state imaging device is formed, using the photolithographic technique.

Next, the second electroconductive type (n type) impurity is ion-injected into a deep position of the semiconductor substrate 51 from the opening of the resist layer 76. Ion injection is performed up to the depth of a half of the thickness of the semiconductor substrate 51 at the time of finally forming the solid-state imaging device 50. According to this process, a second electroconductive type (n type) semiconductor region 56 making up the PD 1 is formed in a deep portion of the semiconductor substrate 51.

Figure 8J:
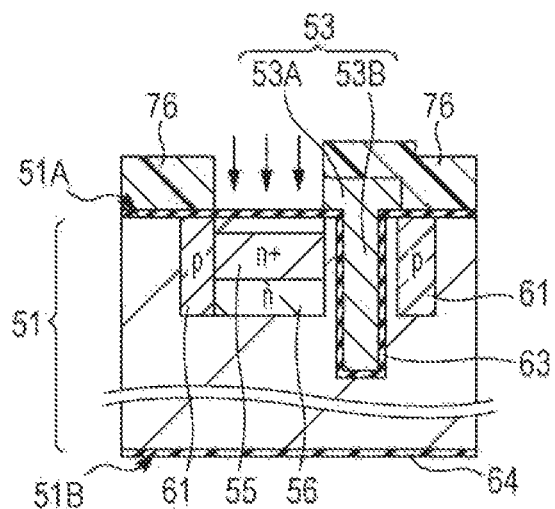

Next, as illustrated in FIG. 8J, the second electroconductive type (n type) impurity is ion-injected into a shallow region on the n-type semiconductor region 56 formed in the previous process from the opening of the resist layer 76. According to this ion injection, the second electroconductive type (n+ type) semiconductor region 56 having high concentration is formed.

Figure 8K:
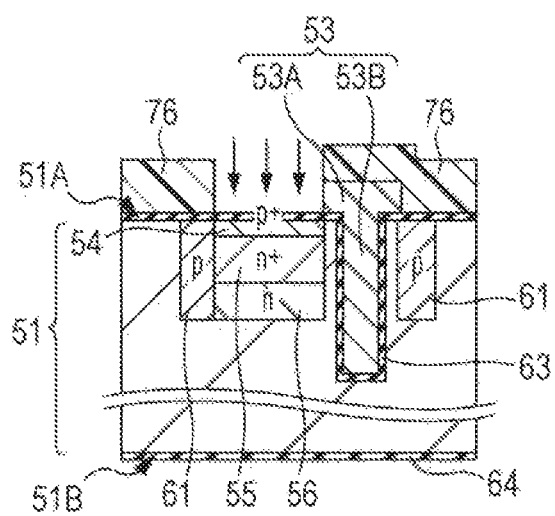

Next, as illustrated in FIG. 8K, the first electroconductive type (p type) impurity is ion-injected from the opening of the resist layer 76. According to this ion injection, the first electroconductive type (p+ type) semiconductor region 54 having high concentration is formed on the surface of the semiconductor substrate 51.

According to the above processes, the PD 1 is formed wherein the p+ type semiconductor region 54, n+ type semiconductor region 55, and n type semiconductor region 56 are laminated from the front face 51A side of the semiconductor substrate 51.

Figure 9L:
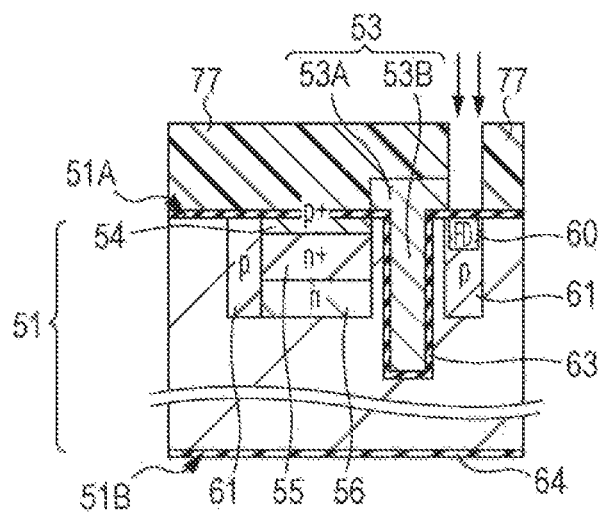
FIGS. 9L through 9N are manufacturing process diagrams of the solid-state imaging device according to the first embodiment.

Next, as illustrated in FIG. 9L, a resist layer 77 is formed on the front face 51A of the semiconductor substrate 51. The resist layer 77 is formed with a pattern for opening a position where the FD of the solid-state imaging device is formed, and specifically, the inside of the first pixel separation region 61 of a position facing the PD 1 via the gate electrode 53 is formed, using the photolithographic technique.

Next, the second electroconductive type (n type) impurity is ion-injected to the semiconductor substrate 51 from the opening of the resist layer 77. According to this ion injection, the FD 60 is formed within the first pixel separation portion 61 on the front face 51A side of the semiconductor substrate 51.

Figure 9M:
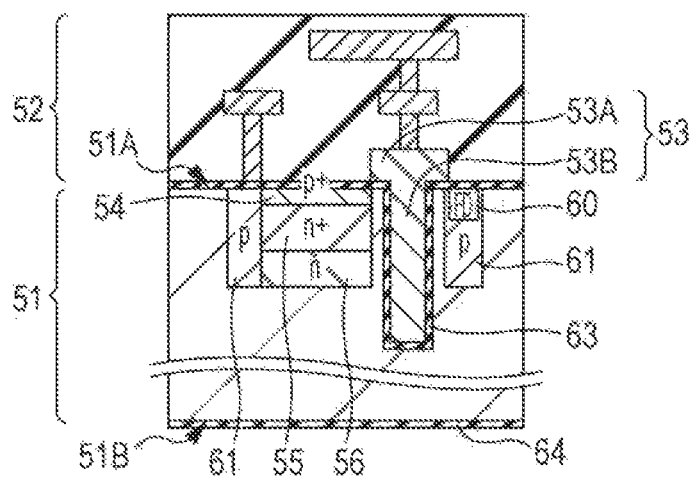

Next, as illustrated in FIG. 9M, a wiring layer 52 is formed on the front face 51A of the semiconductor substrate 51. The wiring layer 52 is formed by laminating an inter-layer insulating layer and an electroconductive layer. Also, an electroconductive layer to be connected to the gate electrode and a PD of the solid-state imaging device is formed by passing through the inter-layer insulating layer.

Figure 9N:
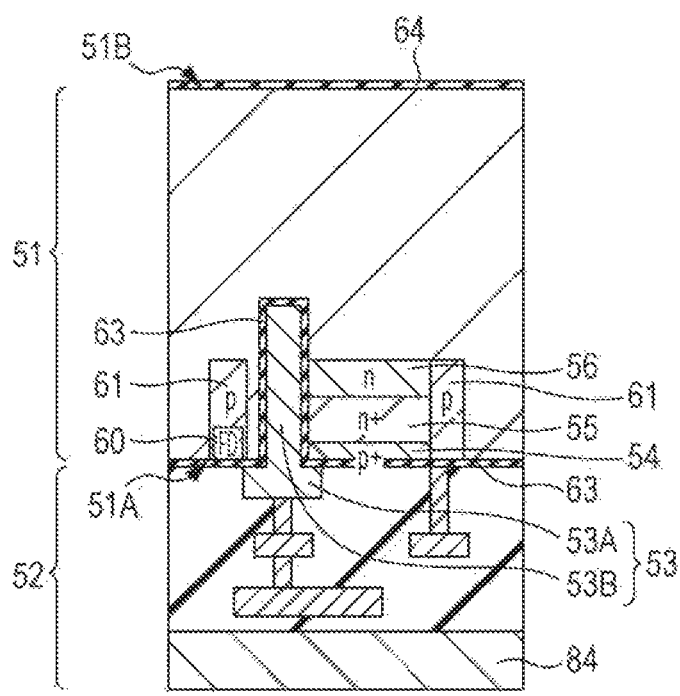
Figure 10O:
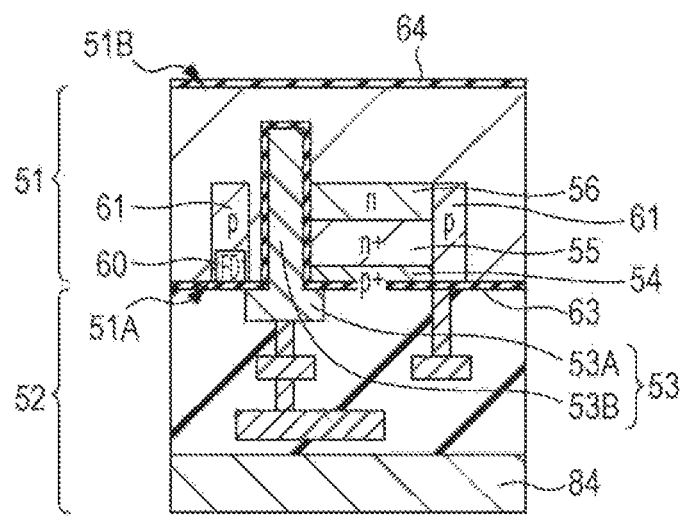
FIGS. 10O through 10Q are manufacturing process diagrams of the solid-state imaging device according to the first embodiment.

Next, as illustrated in FIG. 9N, a supporting substrate 84 is connected onto the wiring layer 52, and the semiconductor substrate 51 is reversed. Next, as illustrated in FIG. 10O, the rear face 51B side of the semiconductor substrate 51 is removed using the CMP or the like. The semiconductor substrate 51 is formed in predetermined thickness by removing the rear face 51B side of the semiconductor substrate 51.

Note that, at the time of removing the rear face 51B side of the semiconductor substrate 51, the insulating layer 64 is simultaneously removed. Therefore, after forming the semiconductor substrate 51 in predetermined thickness, the insulating layer 64 for surface protection made up of a thermally-oxidized film or the like is formed on the rear face 51B of the semiconductor substrate 51 again.

Figure 10P:
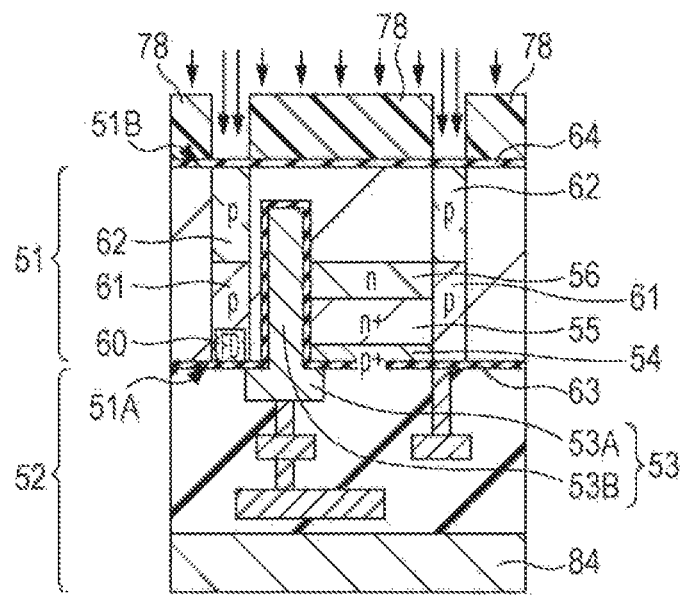

Next, as illustrated in FIG. 10P, a resist layer 78 is formed on the rear face 51B of the semiconductor substrate 51. The resist layer 78 is formed with a pattern for opening a position where a pixel separation region for sectioning between pixels of the solid-state imaging device is formed, using the photolithographic technique.

Next, the first electroconductive type (p type) impurity is ion-injected into the rear face 51B side of the semiconductor substrate 51 from the opening of the resist layer 78. According to this ion injection, the second pixel separation portion 62 is formed on the rear face 51B side of the semiconductor substrate 51. The second pixel separation portion 62 is formed from depth whereby the second pixel separation portion 62 comes into contact with the already formed first pixel separation portion 61, to the rear face 51B.

According to this process, the pixel separation region made up of the first pixel separation portion 61 and second pixel separation portion 62 is formed from the front face 51A to rear face 51B of the semiconductor substrate 51.

Figure 10Q:
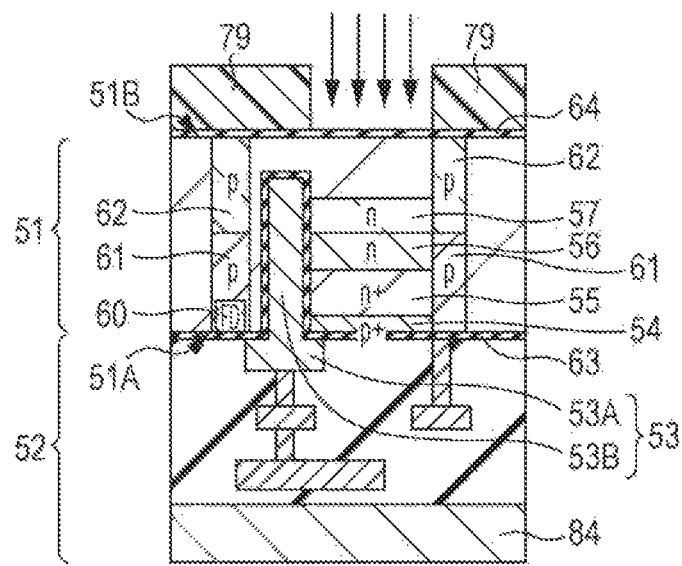

Next, as illustrated in FIG. 10Q, a resist layer 79 is formed on the rear face 51B of the semiconductor substrate 51. The resist layer 79 is formed with a pattern for opening a position where the PD 2 of the solid-state imaging device is formed, using the photolithographic technique.

Next, the second electroconductive type (n type) impurity is ion-injected into a deep position of the semiconductor substrate 51 from the opening of the resist layer 79. Ion injection is performed up to the depth of a half or so of the thickness of the semiconductor substrate 51 at the time of finally forming the solid-state imaging device 50. Next, the second electroconductive type (n type) semiconductor region 57 making up the PD 2 is formed in a position connecting to the n type semiconductor region 56 by diffusing the impurity up to a position connecting to the already formed n type semiconductor region 56 of the PD 1.

Figure 11R:
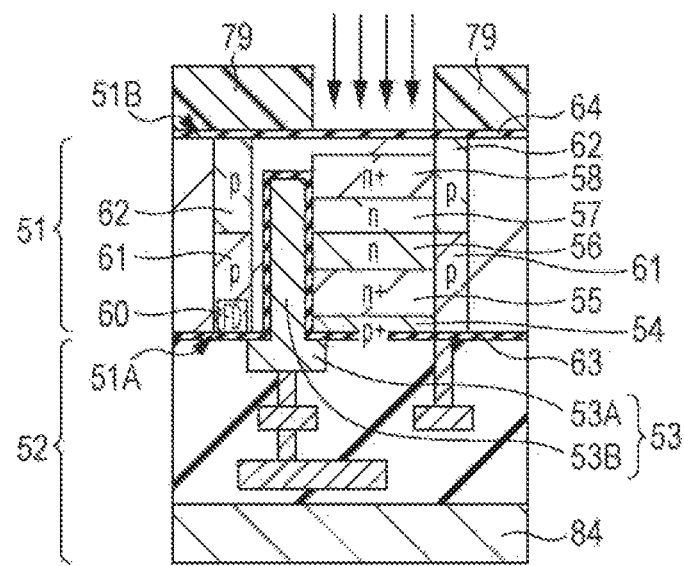
FIGS. 11R through 11T are manufacturing process diagrams of the solid-state imaging device according to the first embodiment.

Next, as illustrated in FIG. 11R, the second electroconductive type (n type) impurity is ion-injected into a shallow region on the n type semiconductor region 57 formed in the previous process from the opening of the resist layer 79. According to this ion injection, the second electroconductive type (n+ type) semiconductor region 58 having high concentration is formed.

Figure 11S:
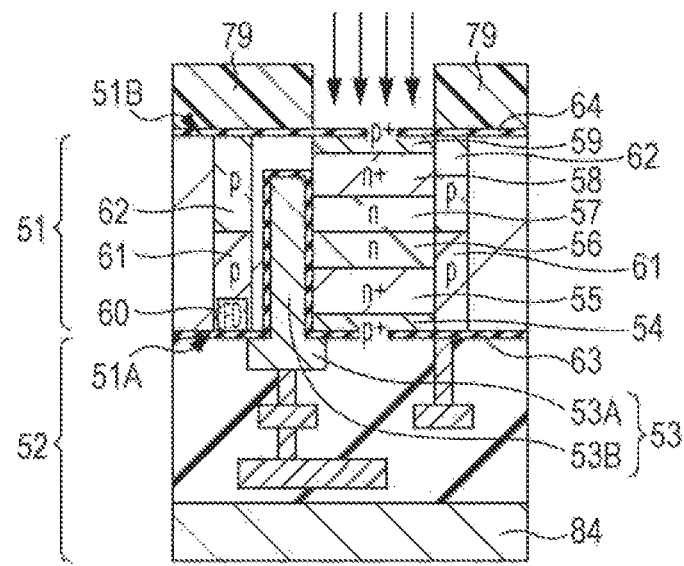

Next, as illustrated in FIG. 11S, the first electroconductive type (p type) impurity is ion-injected from the opening of the resist layer 79. According to this ion injection, the first electroconductive type (p+ type) semiconductor region 59 having high concentration is formed on the rear face 51B of the semiconductor substrate 51.

According to the above processes, there is formed the PD 2 having a configuration wherein the p+ type semiconductor region 59, n+ type semiconductor region 58, and n type semiconductor region 57 are laminated from the rear face 51B side of the semiconductor substrate 51.

Figure 11T:
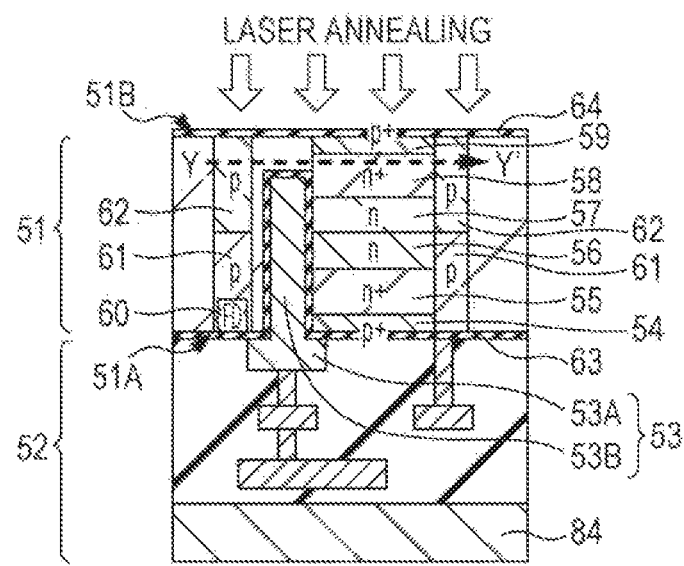

Next, as illustrated in FIG. 11T, the semiconductor substrate 51 where the PD 1 and PD 2 and so forth are formed is subjected to heat treatment according to laser annealing or the like from the rear face 51B side. For example, activation of an impurity formed within the semiconductor substrate 51 is performed by heat treatment of 1000° C.

According to the above processes, the solid-state imaging device according to the present embodiment can be manufactured.

With the above-mentioned solid-state imaging device manufacturing method according to the present embodiment, the PD 1 is formed by ion injection from the front face 51A side of the semiconductor substrate 51. Next, the PD 2 is formed by ion injection from the rear face 51B side of the semiconductor substrate 51.

In this way, the PD 1 to be formed on the front face 51A side of the semiconductor substrate 51 is formed by ion injection from the front face 51A side, whereby an impurity region having high concentration can be formed on the front face 51A side of the semiconductor substrate 51 without decreasing the concentration of the impurity.

Further, the PD 2 to be formed on the rear face 51B side of the semiconductor substrate 51 is formed by ion injection from the rear face 51B side, whereby an impurity region having high concentration can be formed on the rear face 51B side of the semiconductor substrate 51 without decreasing the concentration of the impurity.

Therefore, a steep PN junction is formed between the p+ type semiconductor regions 54 and 59 and the n+ type semiconductor regions 55 and 58. As a result thereof, the PN junction capacity between the PD 1 and PD 2 can be increased, and the saturation signal amount of the solid-state imaging device 50 can be increased.

Also, with a junction portion between the PD 1 and PD 2 of the center portion of the semiconductor substrate 51, the n type semiconductor regions 56 and 57 are formed by ion injection up to the depth of a half or so of the semiconductor substrate 51. Therefore, the depths of the PD 1 and PD 2 can be secured without performing ion injection having high concentration on the center portion of the semiconductor substrate 51 as compared to the front face and rear face sides. Accordingly, the accumulation amount of the signal charges can be increased.

Also, according to the above-mentioned manufacturing method according to the present embodiment, with a process for injecting a p type impurity to form a pixel separation region, ion injection from the front face 51A side of the semiconductor substrate 51, and ion injection from the rear face 51B are performed. According to each of ion injections, the first pixel separation portion 61 and second pixel separation portion 62 are formed up to the depth of a half or so, whereby diffusion of an impurity to be generated at the time of performing ion injection up to a deep region of the substrate can be suppressed.

Figure 12A:
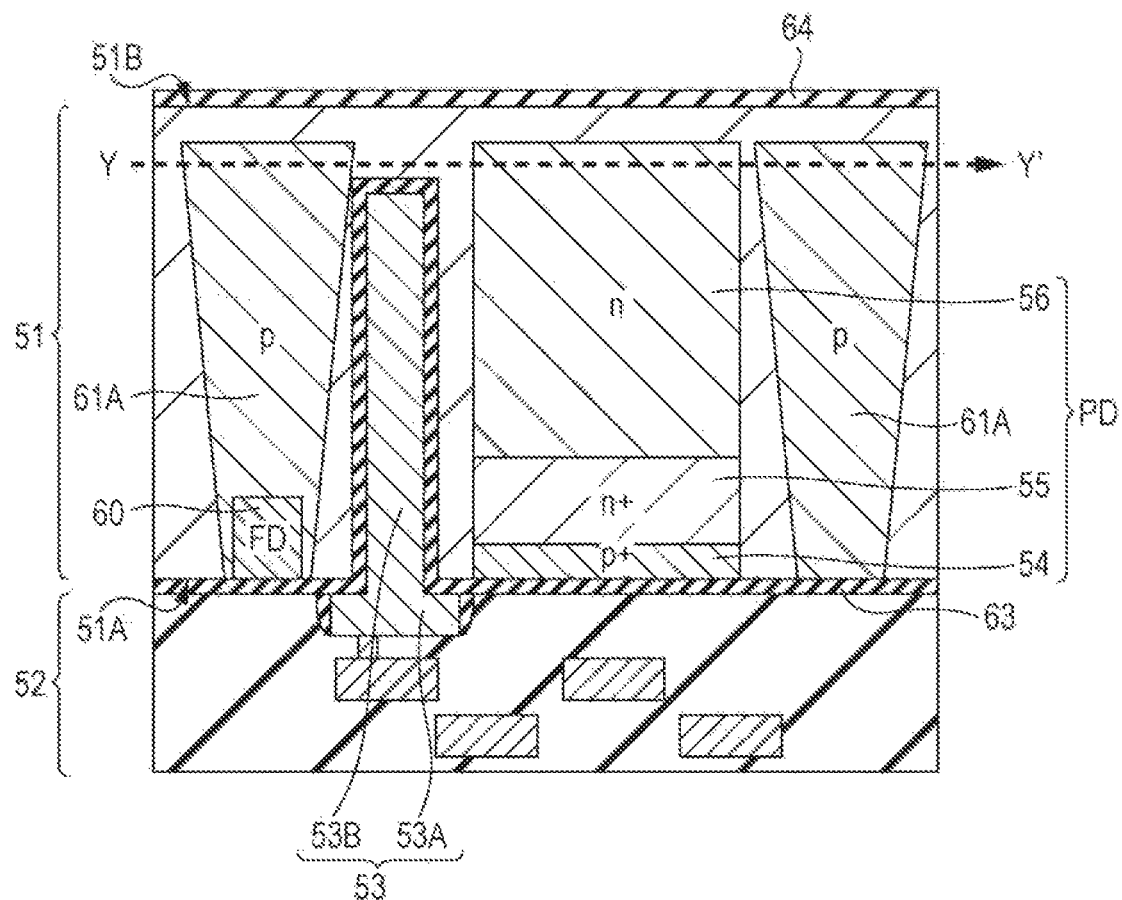
FIG. 12A is a cross-sectional view illustrating the configuration of the solid-state imaging device according to the first embodiment.
Figure 12B:
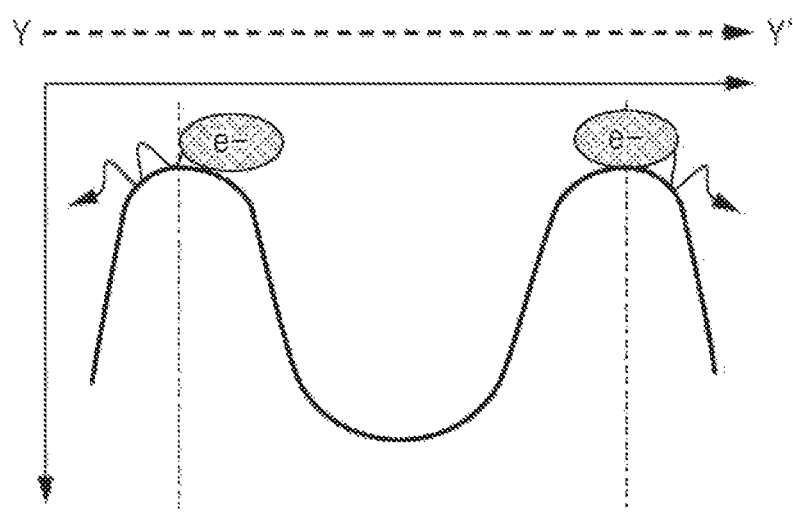
FIG. 12B is a potential profile in Y-Y' cross-section of the solid state imaging device illustrated in FIG. 12A.

For example, FIGS. 12A and 12B illustrate the schematic configuration of the solid-state imaging device in the case that a pixel separation region is formed by one process by performing ion injection up to the same depth as with the thickness of the semiconductor substrate. FIG. 12A is a cross-sectional view of the solid-state imaging device. FIG. 12B is a potential profile in Y-Y' cross-section of the solid-state imaging device illustrated in FIG. 12A.

With a pixel separation portion 61A made up of a p type impurity region, an ion injection cross-section is extended by diffusion of an impurity as the pixel separation portion 61A deepens from the surface of the semiconductor substrate. The diffused pixel separation region is low in impurity concentration, and accordingly, the potential slope is reduced as illustrated in FIG. 12B. The potential profile region on the light incident face side of the semiconductor substrate is then flattened. Therefore, electric charges (electron e−) generated at the pixel separation region readily moves to an adjacent pixel. This becomes a cause for increasing color mixture of the solid-state imaging device.

Figure 13:
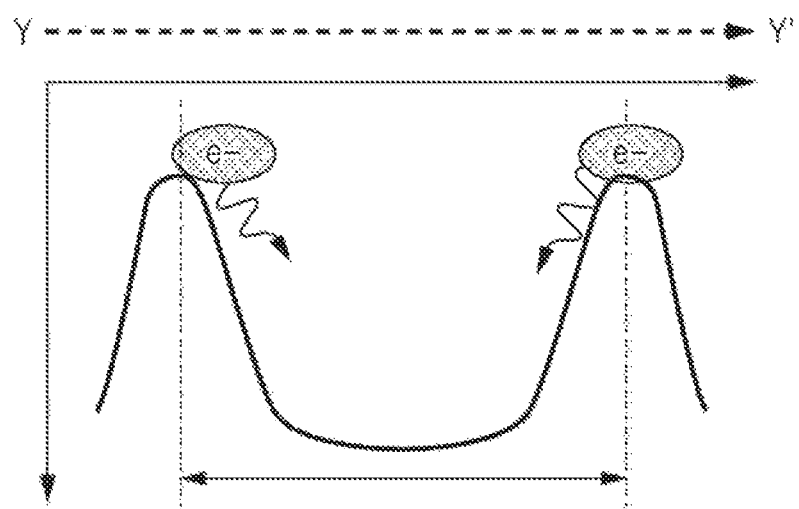
FIG. 13 is a potential profile in the Y-Y' cross-section of the solid state imaging device illustrated in FIG. 11T.

On the other hand, with the solid-state imaging device manufacturing method according to the present embodiment, diffusion of an impurity at a deep portion of the semiconductor substrate is suppressed by performing ion injection up to the depth of a half or so of the thickness of the semiconductor substrate from both faces of the semiconductor substrate. Therefore, the pixel separation region can be narrowed as compared to the above case illustrated in FIG. 12A. FIG. 13 illustrates a potential profile at the Y-Y' cross-section of the solid-state imaging device illustrated in FIG. 11T.

As illustrated in FIG. 13, the pixel separation region can be narrowed, and accordingly, a potential slope on the light incident face side of the semiconductor substrate is increased without deteriorating impurity concentration. In particular, the potential profile has a shape where the slope faces the photodiode side. Therefore, electric charges (electrons) generated at the pixel separation region can be moved to the photodiode side, and movement to an adjacent pixel can be suppressed. Accordingly, color mixture of the solid-state imaging device can be suppressed.

[First Modification]

Figure 14A:
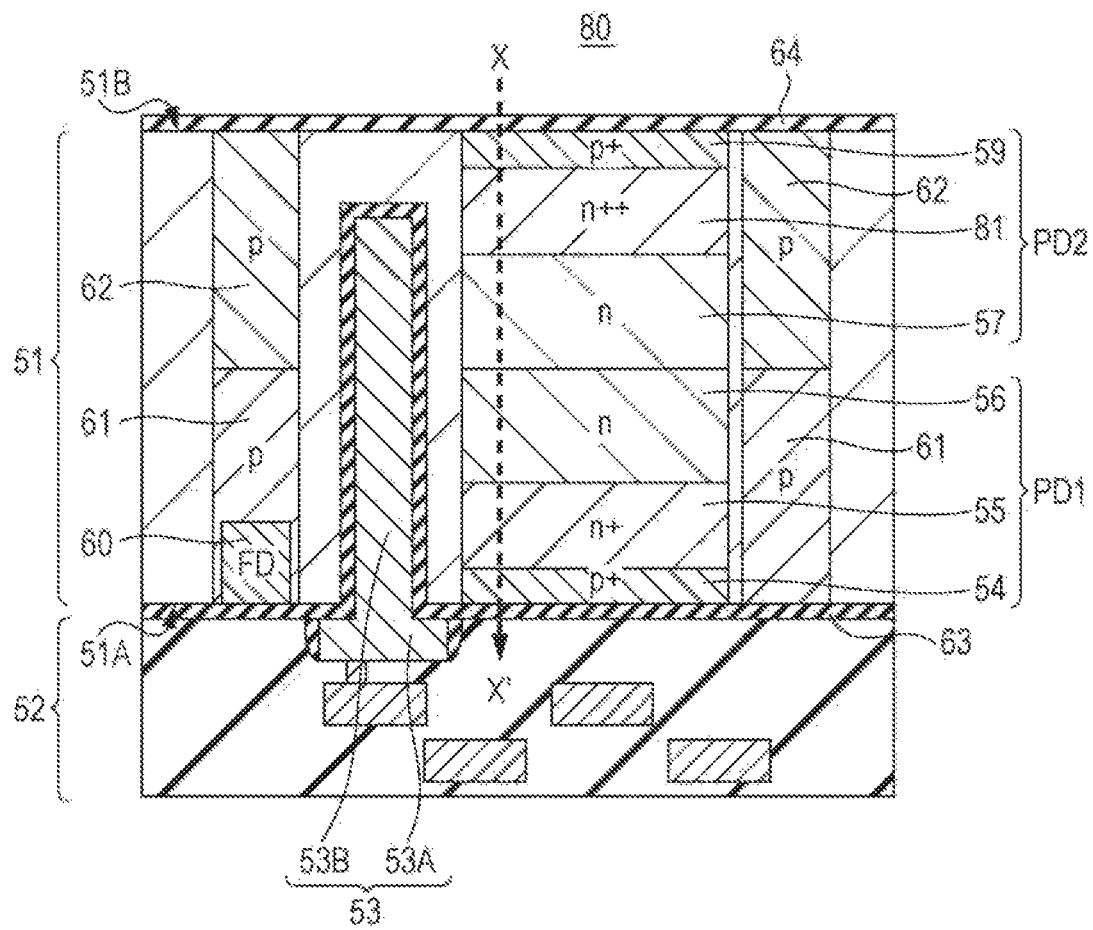
FIG. 14A is a cross-sectional view illustrating the configuration of a modification of the solid-state imaging device according to the first embodiment.
Figure 14B:
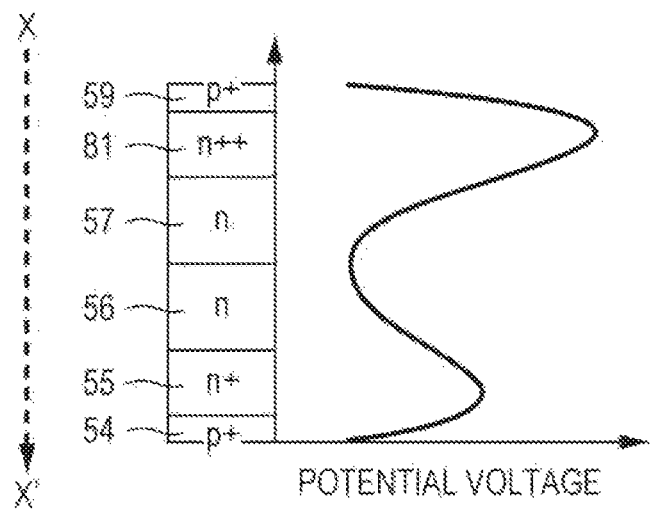
FIG. 14B is a potential profile in the depth direction in a photodiode of the modification of the solid state imaging device according to the first embodiment.

Next, FIGS. 14A and 14B illustrate the configuration of a solid-state imaging device according to a first modification of the first embodiment. FIG. 14A is a cross-sectional view illustrating the configuration of the solid-state imaging device, and FIG. 14B is a potential profile in the depth direction at X-X' cross-section of a photodiode (PD) of the solid-state imaging device illustrated in FIG. 14A.

With a solid-state imaging device 80 illustrated in FIG. 14A, a second electroconductive type (n++ type) semiconductor region 81 having higher concentration than the solid-state imaging device according to the first embodiment is formed on the PD 2 formed on the rear face 51B side of the semiconductor substrate 51. Note that configurations other than this n++ type semiconductor region 81 are the same configurations as with the above-mentioned first embodiment, and accordingly, description thereof will be omitted.

The PD 1 of the solid-state imaging device 80 illustrated in FIG. 14A includes, in order from the substrate front face 51A side, a first electroconductive type (p+ type) semiconductor region 54 having high concentration, a second electroconductive type (n+ type) semiconductor region 55 having high concentration, and a second electroconductive type (n++ type) semiconductor region 56.

The PD 2 includes, in order from the substrate rear face 51B side, a first electroconductive type (p+ type) semiconductor region 59 having high concentration, a second electroconductive type (n++ type) semiconductor region 81 having high concentration, and a second electroconductive type (n type) semiconductor region 57.

The n type semiconductor region 56 of the PD 1, and the n type semiconductor region 57 of the PD 2 are connected at the center of the semiconductor substrate 51, and the PD 1 and PD 2 are integrally formed.

With the solid-state imaging device 80 thus configured, a photoelectric conversion region of the PD 2 is formed by the n++ type semiconductor region 81 having high concentration. Therefore, as a potential profile being illustrated in FIG. 14B, the potential of the n++ type semiconductor region 81 of the PD 2 is formed higher than the n+ type semiconductor region 55 of the PD 1.

Accordingly, a steep PN junction is obtained between the p+ type semiconductor region 59 and n++ type semiconductor region 81 of the rear face 51B. The impurity concentration of the n++ type semiconductor region 81 is great, and accordingly, this PN junction capacity is also greater than that of the solid-state imaging device 50 according to the first embodiment illustrated in FIGS. 5A and 5B.

Accordingly, the PN junction capacity of the PD 2 can be increased, and the saturation signal amount of the solid-state imaging device 80 can be increased.

Also, even when a high-potential region is formed on the rear face 51B side, in the same way as with the first embodiment, a vertical-type transistor is formed, and accordingly, transfer of the signal charges of the PD 2 on the rear face 51B side can readily be performed.

[Second Modification]

Figure 15A:
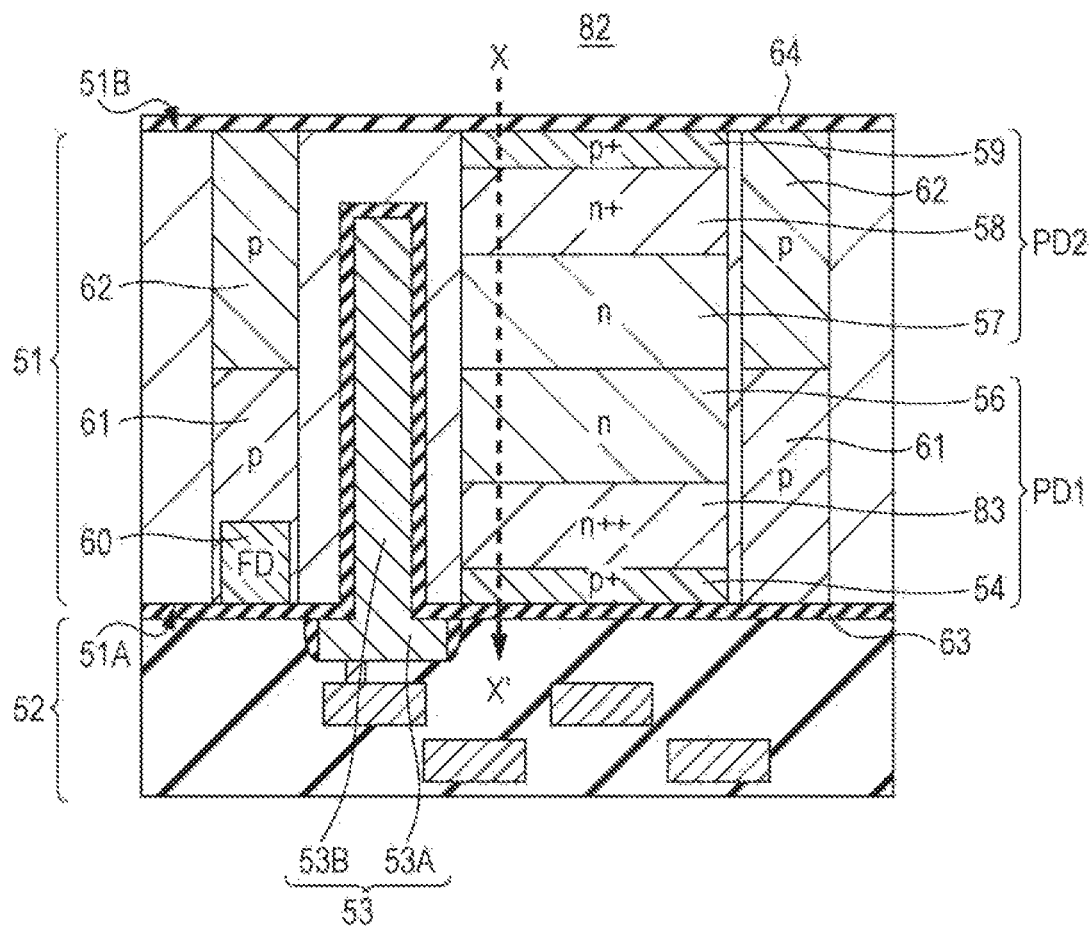
FIG. 15A is a cross-sectional view illustrating the configuration of a modification of the solid-state imaging device according to the first embodiment.
Figure 15B:
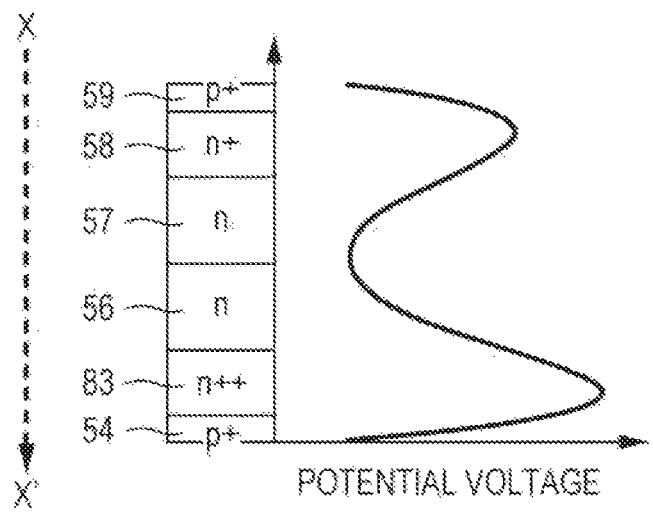
FIG. 15B is a potential profile in the depth direction in a photodiode of the modification of the solid state imaging device according to the first embodiment.

Next, FIGS. 15A and 15B illustrate the configuration of a solid-state imaging device according to a second modification of the first embodiment. FIG. 15A is a cross-sectional view illustrating the configuration of the solid-state imaging device, and FIG. 15B is a potential profile in the depth direction at X-X' cross-section of a photodiode (PD) of the solid-state imaging device illustrated in FIG. 15A.

With a solid-state imaging device 82 illustrated in FIG. 15A, a second electroconductive type (n++ type) semiconductor region 83 having higher concentration than the solid-state imaging device according to the first embodiment is formed on the PD 1 formed on the front face 51A side of the semiconductor substrate 51. Note that configurations other than this n++ type semiconductor region 83 are the same configurations as with the above-mentioned first embodiment, and accordingly, description thereof will be omitted.

The PD 1 of the solid-state imaging device 82 illustrated in FIG. 15A includes, in order from the substrate front face 51A side, a first electroconductive type (p+ type) semiconductor region 54 having high concentration, a second electroconductive type (n++ type) semiconductor region 83 having high concentration, and a second electroconductive type (n++ type) semiconductor region 56.

The PD 2 includes, in order from the substrate rear face 51B side, a first electroconductive type (p+ type) semiconductor region 59 having high concentration, a second electroconductive type (n+ type) semiconductor region 58 having high concentration, and a second electroconductive type (n type) semiconductor region 57.

The n type semiconductor region 56 of the PD 1, and the n type semiconductor region 57 of the PD 2 are connected at the center of the semiconductor substrate 51, and the PD 1 and PD 2 are integrally formed.

With the solid-state imaging device 82 thus configured, a photoelectric conversion region of the PD 1 is formed by the n++ type semiconductor region 83 having high concentration. Therefore, as a potential profile being illustrated in FIG. 15B, the potential of the n++ type semiconductor region 83 of the PD 1 is formed higher than the n+ type semiconductor region 58 of the PD 2.

Accordingly, a steep PN junction is obtained between the p+ type semiconductor region 54 and n++ type semiconductor region 83 of the front face 51A. The impurity concentration of the n++ type semiconductor region 83 is great, and accordingly, this PN junction capacity is also greater than that of the solid-state imaging device 50 according to the first embodiment illustrated in FIGS. 5A and 5B. Accordingly, the PN junction capacity of the PD 1 can be increased, and the saturation signal amount of the solid-state imaging device 82 can be increased.

Note that the solid-state imaging devices of the first and second modifications can be manufactured, with the above-mentioned solid-state imaging device manufacturing method according to the first embodiment, by adjusting injection amount at ion injection process of the second electroconductive type impurity illustrated in FIG. 8J or 11R.

4. Second Embodiment of Solid-State Imaging Device

Next, the configuration of a solid-state imaging device according to a second embodiment will be described.

Figure 16:
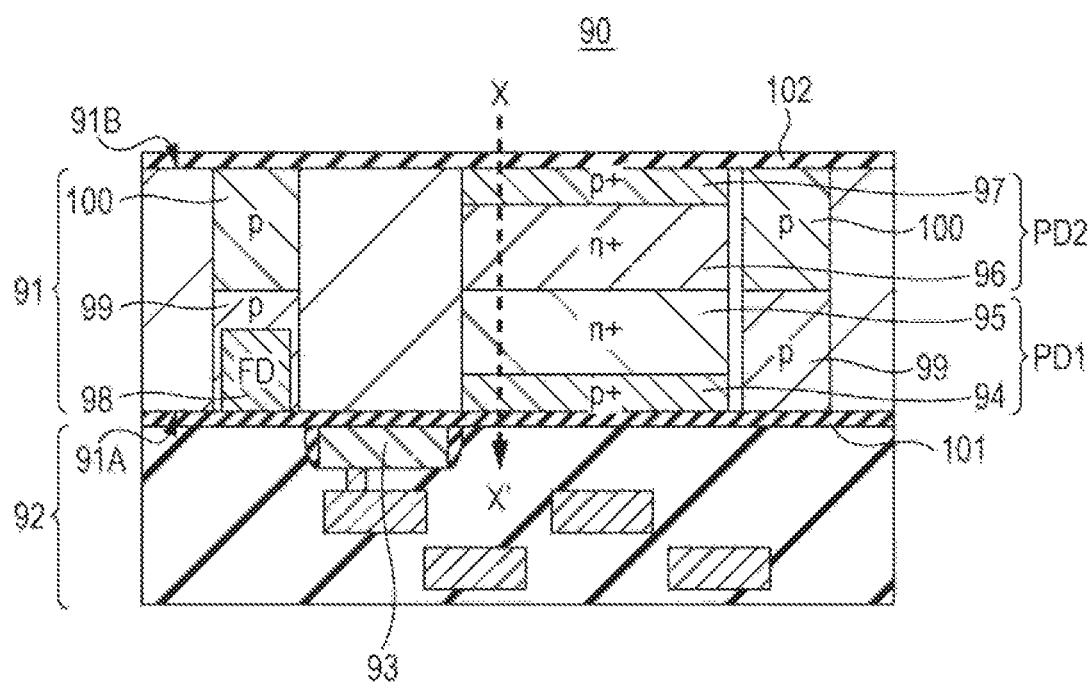
FIG. 16 is a cross-sectional view illustrating the configuration of a solid-state imaging device according to a second embodiment.

FIG. 16 illustrates principal portions making up one pixel of the solid-state imaging device according to the second embodiment. FIG. 16 is a cross-sectional view illustrating the configuration of the solid-state imaging device.

With a solid-state imaging device 90 illustrated in FIG. 16, a first photodiode (PD 1) is formed on the surface on an opposite face (substrate front face) 91A side of the light incident face of a semiconductor substrate 91. A second photodiode (PD 2) is formed on the surface on a light incident face (substrate rear face) 91B side of the semiconductor substrate 91.

Also, a wiring layer 92 made up of an insulating layer and a wiring is provided onto the substrate front face 91A of the semiconductor substrate 91. Optical components such as a photoelectric conversion film, a color filter, a micro lens, and so forth which are not illustrated are mounted on the substrate rear face 91B of the semiconductor substrate 91 via an insulating layer 102.

The PD 1 includes, in order from the substrate front face 91A side, a first electroconductive type (p+ type) semiconductor region 94 having high concentration, and a second electroconductive type (n+ type) semiconductor region 95 having high concentration.

The PD 2 includes, in order from the substrate rear face 91B, a first electroconductive type (p+ type) semiconductor region 97 having high concentration, and a second electroconductive type (n+ type) semiconductor region 96 having high concentration.

The n+ type semiconductor region 95 of the PD 1, and the n+ type semiconductor region 96 of the PD 2 are connected at the center of the semiconductor substrate 91, and the PD 1 and PD 2 are integrally formed.

The p+ type semiconductor regions 94 and 97 are impurity regions for suppressing occurrence of dark current at the PD1 or PD 2. The n+ type semiconductor regions 95 and 96 are charge accumulating regions.

Also, the n+ type semiconductor region 95 of the PD 1, and the n+ type semiconductor region 96 of the PD 2 are connected within the semiconductor substrate 91. The impurity concentration of the solid-state imaging device 90 is adjusted so that the impurity concentration at a connection face between the n+ type semiconductor region 95 and the n+ type semiconductor region 96 becomes equal to or greater than the impurity concentration of the n+ type semiconductor region 96 of a connection face with the p+ type semiconductor region 97 of the PD 2. Similarly, the impurity concentration is adjusted so that the impurity concentration at a connection face between the n+ type semiconductor region 95 and the n+ type semiconductor region 96 becomes equal to or greater than the impurity concentration of the n+ type semiconductor region 95 of a connection face with the p+ type semiconductor region 94 of the PD 1.

In this way, the n+ type semiconductor region 95 and the n+ type semiconductor region 96 of which the impurity concentrations on the center sides are adjusted are connected so as to have concentration equal to or greater than the front face 91A and rear face 91B of the semiconductor substrate 91, whereby a configuration wherein no potential barrier is formed can be realized.

Also, the solid-state imaging device 90 illustrated in FIG. 16 includes a transfer transistor (Tr) for reading out electric charges of the PD 1 and PD 2. The transfer Tr is configured of a transfer gate electrode 93 formed via the insulating film 101, and a floating diffusion (FD) 98 for accumulating transferred signal charges.

The FD 60 is made up of a second electroconductive type (n+ type) semiconductor region having high concentration, and is formed on the surface of the semiconductor substrate 91 in a position facing the PD 1 and PD 2 via the transfer gate electrode 93.

Also, a first pixel separation portion 99 and a second pixel separation portion 100 for sectioning the increment pixels are formed with a first electroconductive type (p type) semiconductor region. The first and second pixel separation portions 99 and 100 are formed between adjacent pixels. The first pixel separation portion 99 is formed on the front face 91A side of the semiconductor substrate 91, and the second pixel separation portion 100 is formed on the rear face 91B side of the semiconductor substrate 91. The first pixel separation portion 99 and second pixel separation portion 100 are connected and integrated at the center of the semiconductor substrate 91. Also, the FD 98 is formed within the first pixel separation portion 99.

The solid-state imaging device 90 according to the second embodiment has a configuration not including an n type semiconductor region serving as a photoelectric conversion region as compared to the above-mentioned solid-state imaging device according to the first embodiment. Also, the transfer gate electrode 93 is configured of a planar gate electrode alone formed on the semiconductor substrate 91, and does not include a vertical-type gate electrode formed in a columnar shape in the depth direction from the surface of the semiconductor substrate 91.

Figure 17A:
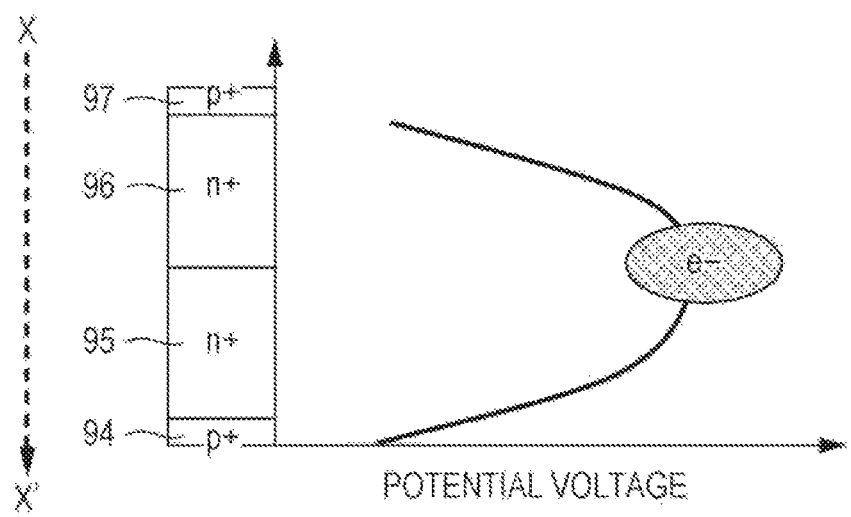
FIG. 17A is a potential profile at the time of accumulating electric charges of the solid-state imaging device according to the second embodiment.
Figure 17B:
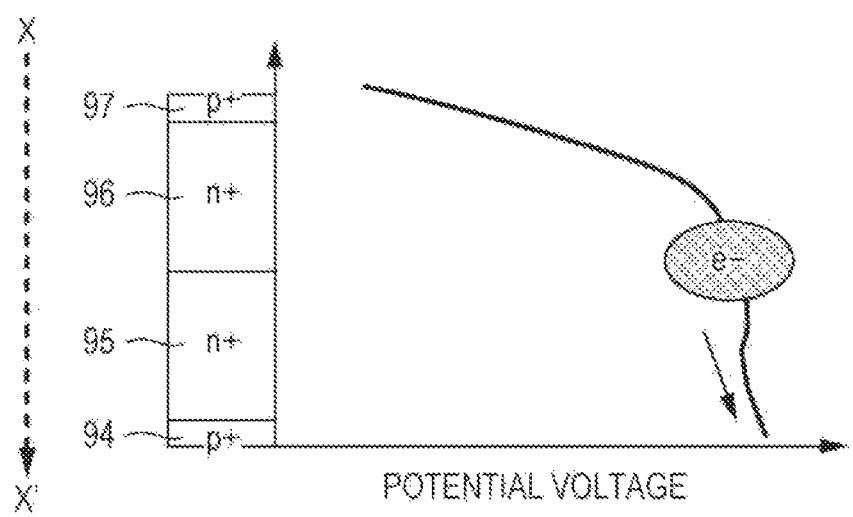
FIG. 17B is a potential profile at the time of transferring electric charges of the solid-state imaging device according to the second embodiment.

FIG. 17A illustrates a potential profile in the depth direction at the time of accumulating electric charges at X-X' cross-section of a photodiode (PD) of the solid-state imaging device 90 illustrated in FIG. 16. Also, FIG. 17B illustrates a potential profile in the depth direction at the time of transferring electric charges at X-X' cross-section of the photodiode (PD) of the solid-state imaging device 90 illustrated in FIG. 16.

The solid-state imaging device 90 is, as illustrated in FIG. 17A, a potential profile where the junction portion between the PD 1 and PD 2 of the center of the semiconductor substrate 91 is the highest.

With the PD 1, the potential of the connection face between the p+ type semiconductor region 94 and the n+ type semiconductor region 95 is low. The potential of the n+ type semiconductor region 95 becomes higher as the n+ type semiconductor region 95 comes closer to the center portion of the semiconductor substrate 91 from the p+ type semiconductor region 94. Also, with the PD 2, the potential of the connection face between the p+ type semiconductor region 97 and the n+ type semiconductor region 96 is low. The potential of the n+ type semiconductor region 96 becomes higher as the n+ type semiconductor region 96 comes closer to the center portion of the semiconductor substrate 91 from the p+ type semiconductor region 97.

In this way, instead of the front face 91A and rear face 91B of the semiconductor substrate 91, the n+ type semiconductor region 95 of the PD 1, and the n+ semiconductor region 96 of the PD 2, wherein an impurity having high concentration is injected on the center side, are connected, whereby a configuration wherein no potential barrier is formed can be realized.

Also, with the above-mentioned transfer transistor, at the time of reading out electric charges accumulated in the PDs, positive voltage is applied to the transfer gate electrode 93 to change the potential immediately below the transfer gate electrode 93. Signal charges accumulated in the PD 1 and PD 2 are passed through a channel region below the transfer gate electrode 93 and transferred to the FD 98.

At this time, according to the voltage applied to the transfer gate electrode 93, as illustrated in FIG. 17B, the potential of the p+ type semiconductor region 94 of the PD 1 closer to the transfer gate electrode 93 is raised. As a result thereof, a potential slope is formed from the PD 2 to the PD 1 side. Accordingly, with the solid-state imaging device 90, the electric charges accumulated in the PD 2 on the rear face 91B side of the semiconductor substrate 91 can be transferred to the FD 98 even when including no vertical-type gate electrode.

Also, in order to perform the above-mentioned charge transfer, the n+ type semiconductor region 95 of the PD 1, and the n+ type semiconductor region 96 of the PD 2 has to be connected in a suitable manner. When connection between the n+ type semiconductor region 95 and the n+ type semiconductor region 96 is poor, and there is a low-concentration region therebetween, a potential barrier is formed between the PD 1 and PD 2, which disturbs charge transfer.

Therefore, as described above, it is desirable to control an impurity distribution between the n+ type semiconductor region 95 of the PD 1, and the n+ type semiconductor region 96 of the PD 2 so as to obtain the highest impurity concentration at the connection face between the PD 1 and PD 2.

In order to connect the n+ type semiconductor region 95 of the PD 1, and the n+ type semiconductor region 96 of the PD 2 has to be connected in a suitable manner, the thickness of the semiconductor substrate 91 has to be thinned. For example, the thickness of the semiconductor substrate 91 is set to 1.0 μm through 3 μm or so, whereby the suitable configuration of the solid-state imaging device according to the present embodiment can be realized.

Note that, with the solid-state imaging device 90 thus configured, though an arrangement has been made wherein the center portion of the semiconductor substrate 91 is taken as the connection face of the PD 1 and PD 2, and the potential of this connection portion becomes the highest, the connection face between the PD 1 and PD 2 may not be the center portion of the semiconductor substrate 91, for example. Also, a position where the potential becomes the highest may also not be the center portion of the semiconductor substrate 91. As long as an arrangement wherein positive voltage is applied to the transfer gate electrode 93, and the electric charges accumulated in the PD 2 can be read out, a position where the potential becomes the highest may be shifted to the front face 91A side or rear face 91B side from the center of the semiconductor substrate 91. Also, a position where the potential becomes the highest may be shifted from the connection face between the PD 1 and PD 2 to the n+ type semiconductor region 96 or n+ type semiconductor region 95 side by changing the impurity concentration between the n+ type semiconductor region 96 and the n+ type semiconductor region 95.

5. Solid-State Imaging Device Manufacturing Method According to Second Embodiment Next, an example of a solid-state imaging device manufacturing method according to the second embodiment will be described. Note that, with description of the following manufacturing method, the same configurations as with the configurations of the solid-state imaging device 90 according to the second embodiment illustrated in the above FIG.

16 are denoted with the same reference numerals, and the details of the configurations will be omitted. Also, description will be omitted regarding the manufacturing method for the semiconductor substrate, wiring layers, other various types of transistors, and various elements formed on the solid-state imaging device. These can be manufactured by a method according to the related art.

Figure 18A:
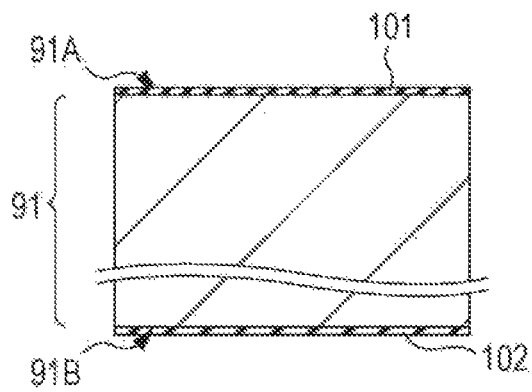
FIGS. 18A through 18C are manufacturing process diagrams of the solid-state imaging device according to the second embodiment.

First, as illustrated in FIG. 18A, the semiconductor substrate 91 is prepared. As for the semiconductor substrate 91, a Si substrate is employed, for example. Insulating layers 101 and 102 for surface protection made up of a thermally-oxidized film or the like are formed on the front face 91A and rear face 91B of the semiconductor substrate 91.

Figure 18B:
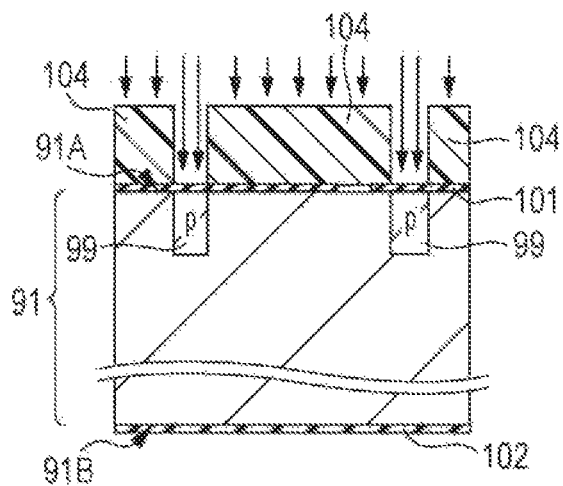

Next, as illustrated in FIG. 18B, a resist layer 104 is formed on the front face 91A of the semiconductor substrate 91. The resist layer 104 is formed with a pattern for opening a position where a pixel separation region for sectioning between pixels of the solid-state imaging device is formed, using the photolithographic technique.

Next, the p type impurity is ion-injected into the semiconductor substrate 91 from the opening of the resist layer 104. According to this ion injection, a first pixel separation portion 99 is formed on the front face 91A side of the semiconductor substrate 91. Depth where the first pixel separation portion 99 is formed is taken as a half or so of the thickness of the semiconductor substrate 91 at the time of finally forming the solid-state imaging device 90.

Figure 18C:
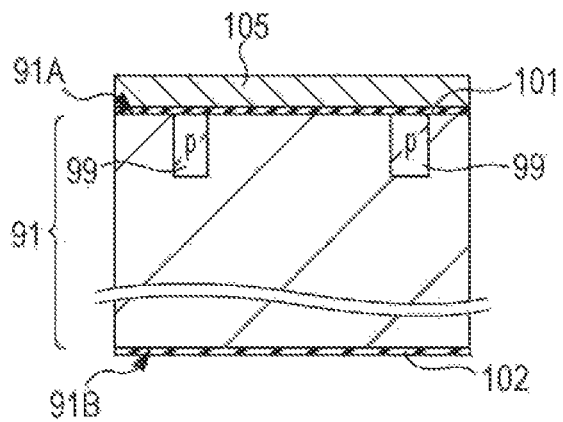
Figure 19D:
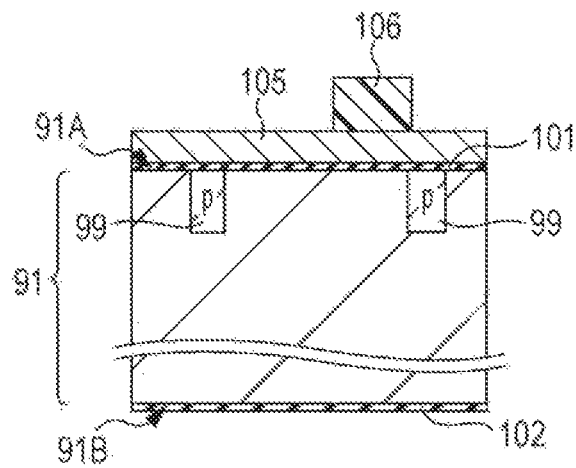
FIGS. 19D through 19F are manufacturing process diagrams of the solid-state imaging device according to the second embodiment.

Next, as illustrate in FIG. 18C, a gate electrode material layer 105 made up of polysilicon or the like is formed on the semiconductor substrate 91. Next, as illustrated in FIG. 19D, a resist layer 106 is formed on the gate electrode material layer 105. As for the resist layer 106, a position where the gate electrode 93 of the solid-state imaging device is formed is formed with a remaining pattern, using the photolithography technique.

Figure 19E:
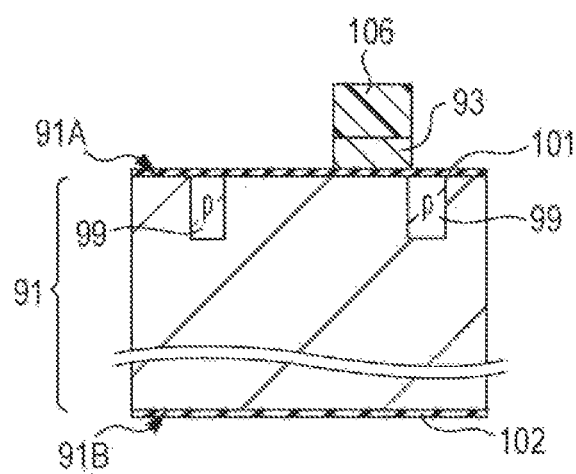

Next, as illustrated in FIG. 19E, the gate electrode material layer 105 is subjected to etching with the resist layer 106 as a mask. Thus, the gate electrode 93 is formed.

Figure 19F:
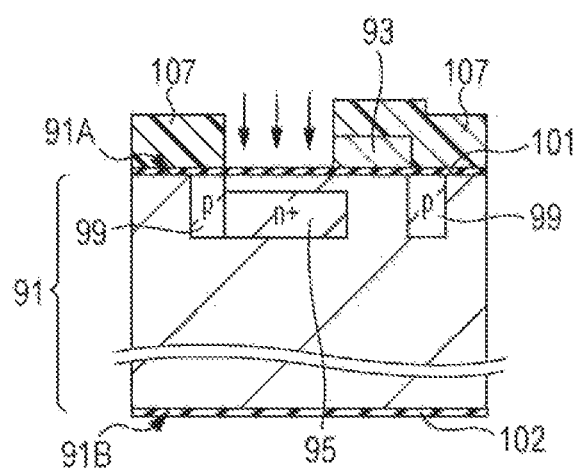

Next, as illustrated in FIG. 19F, a resist layer 107 is formed on the semiconductor substrate 91. The resist layer 107 is formed with a pattern for opening a position where the PD 1 of the solid-state imaging device is formed, using the photolithographic technique.

Next, an n type impurity is ion-injected at high density into a deep position of the semiconductor substrate 91 from the opening of the resist layer 107. Ion injection is performed up to the depth of a half or so of the thickness of the semiconductor substrate 91 at the time of finally forming the solid-state imaging device 90. According to this process, the n+ type semiconductor region 95 making up the PD 1 is formed in a deep portion of the semiconductor substrate 91.

Figure 20G:
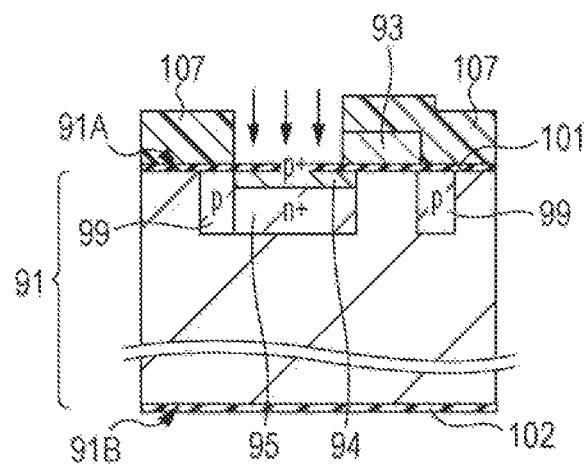
FIGS. 20G through 20I are manufacturing process diagrams of the solid-state imaging device according to the second embodiment.

Next, as illustrated in FIG. 20G, a p-type impurity is ion-injected into a shallow region on the n+ type semiconductor region 95 formed in the previous process from the opening of the resist layer 107. According to this ion injection, the p+ type semiconductor region 94 is formed on the surface of the semiconductor substrate 91.

According to the above processes, the PD 1 is formed wherein the p+ type semiconductor region 94 and n+ type semiconductor region 95 are laminated from the front face 91A side of the semiconductor substrate 91.

Figure 20H:
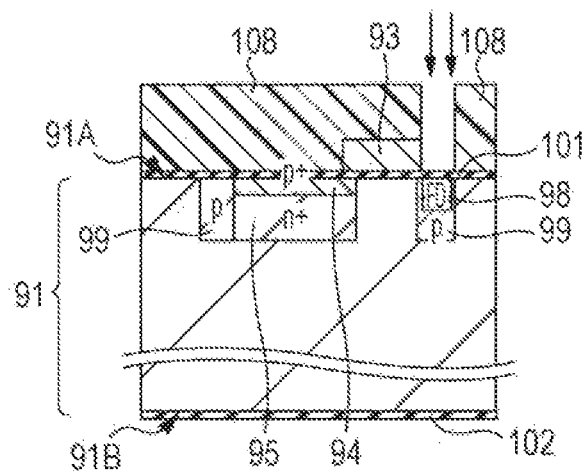

Next, as illustrated in FIG. 20H, a resist layer 108 is formed on the front face 91A of the semiconductor substrate 91. The resist layer 108 is formed with a pattern for opening a position where the FD 98 of the solid-state imaging device is formed, and specifically, the inside of the first pixel separation portion 99 of a position facing the PD 1 via the gate electrode 93, using the photolithographic technique.

Next, an n-type impurity is ion-injected into the semiconductor substrate 91 from the opening of the resist layer 108. According to this ion injection, the FD 98 is formed within the first pixel separation portion 99 on the front face 91A side of the semiconductor substrate 91.

Figure 20I:
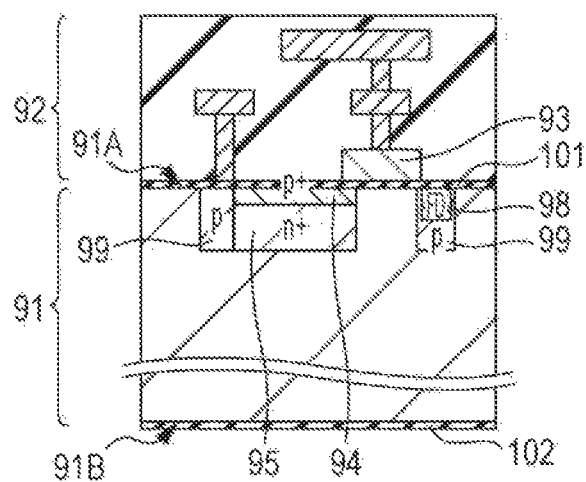

Next, as illustrated in FIG. 20I, a wiring layer 92 is formed on the front face 91A of the semiconductor substrate 91. The wiring layer 92 is formed by laminating an inter-layer insulating layer and an electroconductive layer. Also, an electroconductive layer to be connected to the gate electrode 93 of the solid-state imaging device 90 is formed by passing through the inter-layer insulating layer.

Figure 21J:
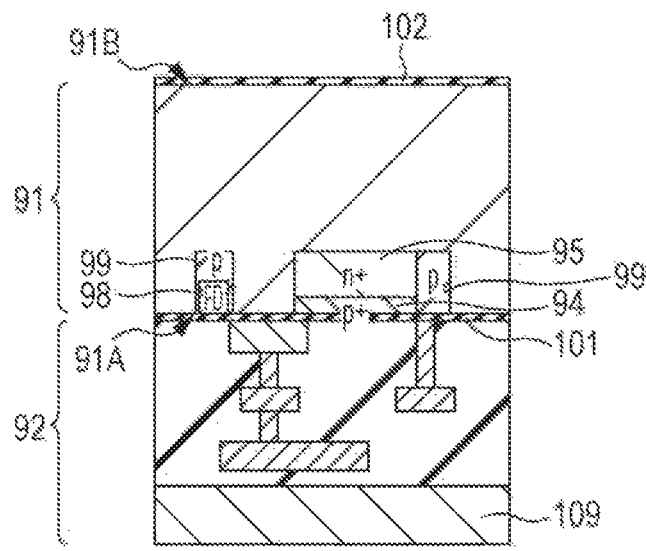
FIGS. 21J through 21L are manufacturing process diagrams of the solid-state imaging device according to the second embodiment.
Figure 21K:
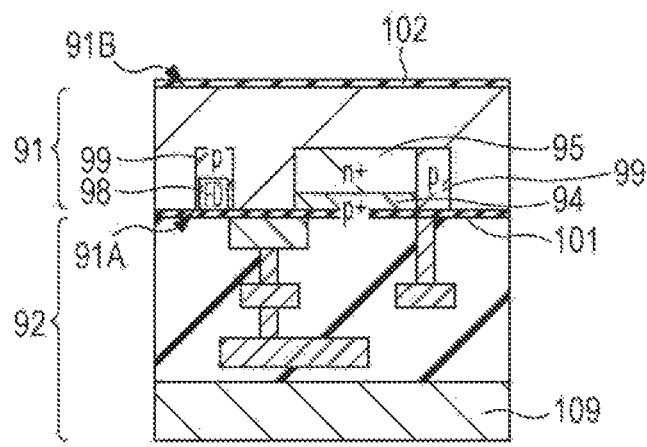

Next, as illustrated in FIG. 21J, a supporting substrate 109 is connected onto the wiring layer 92, and the semiconductor substrate 91 is reversed. Next, as illustrated in FIG. 21K, the rear face 91B side of the semiconductor substrate 91 is removed using the CMP or the like. The semiconductor substrate 91 is formed in predetermined thickness, e.g., 1 μm through 3 μm or so, by removing the rear face 91B side of the semiconductor substrate 91. The insulating layer 102 for surface protection made up of a thermally-oxidized film or the like is formed on the rear face 91B of the semiconductor substrate 91 again.

Figure 21L:
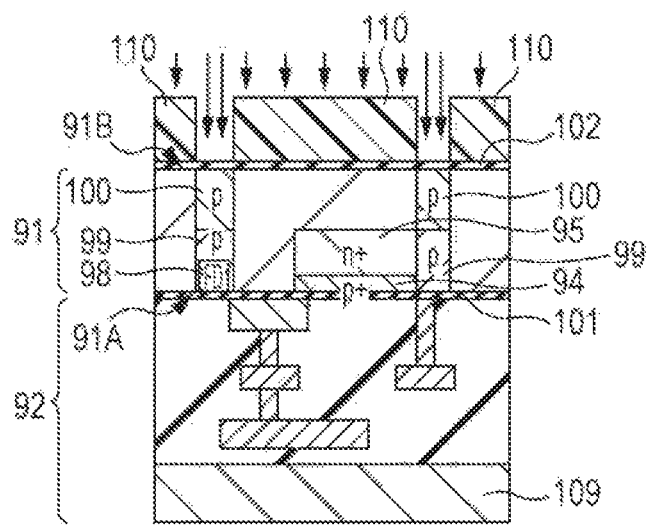

Next, as illustrated in FIG. 21L, a resist layer 110 is formed on the rear face 91B of the semiconductor substrate 91. The resist layer 110 is formed with a pattern for opening a position where a pixel separation region for sectioning between pixels of the solid-state imaging device is formed, using the photolithographic technique.

Next, a p type impurity is ion-injected into the rear face 91B side of the semiconductor substrate 91 from the opening of the resist layer 110. According to this ion injection, the second pixel separation portion 100 is formed on the rear face 91B side of the semiconductor substrate 91. The second pixel separation portion 100 is formed from depth whereby the second pixel separation portion 100 comes into contact with the already formed first pixel separation portion 99, to the rear face 91B.

According to this process, the pixel separation region made up of the first pixel separation portion 99 and second pixel separation portion 100 is formed from the front face 91A to rear face 91B of the semiconductor substrate 91.

Figure 22M:
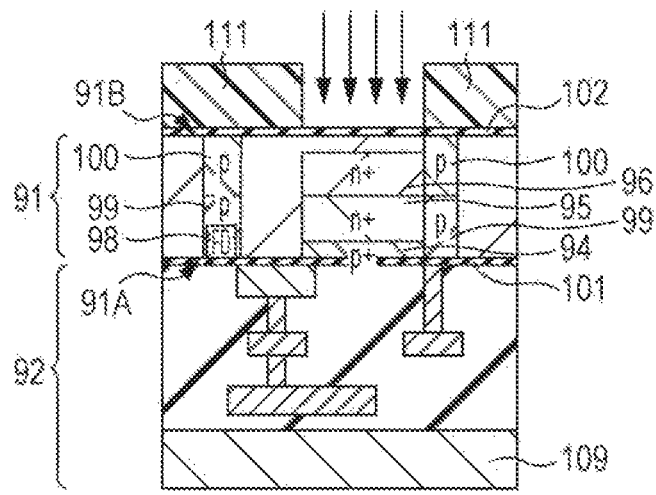
FIGS. 22M through 22O are manufacturing process diagrams of the solid-state imaging device according to the second embodiment.

Next, as illustrated in FIG. 22M, a resist layer 111 is formed on the rear face 91B of the semiconductor substrate 91. The resist layer 111 is formed with a pattern for opening a position where the PD 2 of the solid-state imaging device is formed, using the photolithographic technique.

Next, an n type impurity is ion-injected into a deep position of the semiconductor substrate 91 from the opening of the resist layer 111. Ion injection is performed up to the depth of a half or so of the thickness of the semiconductor substrate 91 at the time of finally forming the solid-state imaging device 90. Next, the n+ type semiconductor region 96 making up the PD 2 is formed in a position connected to the n− type semiconductor region 95 by diffusing the impurity up to a position connected to the already formed n+ type semiconductor region 95 of the PD 1.

Figure 22N:
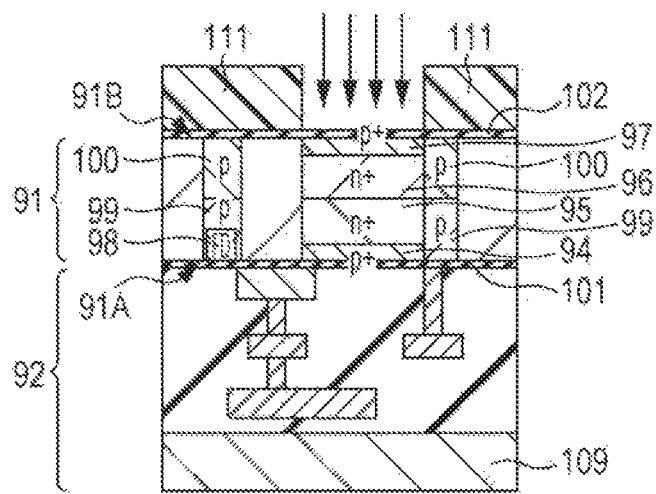

Next, as illustrated in FIG. 22N, a p type impurity is ion-injected into a shallow region on the n+ type semiconductor region 96 formed in the previous process from the opening of the resist layer 111. According to this ion injection, the p+ type semiconductor region 97 is formed on the rear face 91B of the semiconductor substrate 91.

According to the above processes, the PD 2 is formed wherein the p+ type semiconductor region 97 and n+ type semiconductor region 96 are laminated from the rear face 91B side of the semiconductor substrate 91.

Figure 22O:
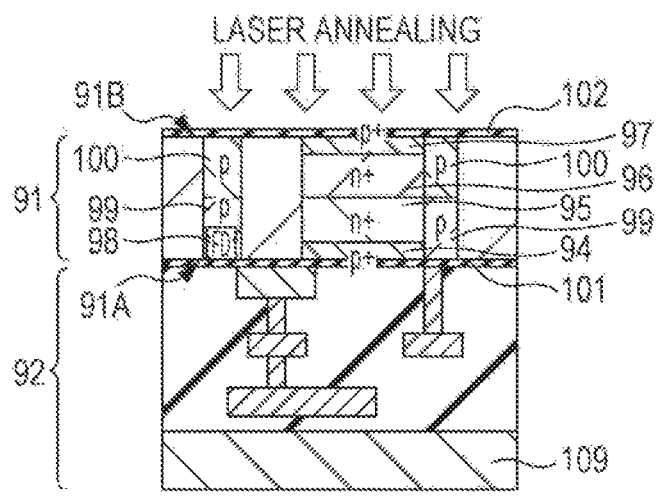

Next, as illustrated in FIG. 22O, the semiconductor substrate 91 where the PD 1 and PD 2 and so forth are formed is subjected to heat treatment according to laser annealing or the like from the rear face 91B side. For example, activation of an impurity formed within the semiconductor substrate 91 is performed by heat treatment of 1000° C.

According to the above processes, the solid-state imaging device according to the second embodiment can be manufactured.

With the above-mentioned solid-state imaging device manufacturing method according to the present embodiment, the PD 1 is formed by ion injection from the front face 91A side of the semiconductor substrate 91. Next, the PD 2 is formed by ion injection from the rear face 91B side of the semiconductor substrate 91. Thus, deterioration in concentration due to diffusion of an impurity at the time of enclosing ions into a deep portion of the semiconductor substrate 91 can be prevented. Accordingly, a steep PN junction can be formed between the p+ type semiconductor regions 94 and 97 and the n+ semiconductor regions 95 and 96, and the saturation signal amount of the PD of the solid-state imaging device 90 can be increased.

Also, the semiconductor substrate 91 is set to 1 through 3 μm in thickness, whereby there can be prevented occurrence of an impurity region having low concentration at the center of the semiconductor substrate 91 due to deterioration in concentration due to diffusion of an impurity. Therefore, an arrangement may be made wherein the n+ type semiconductor region 95 having high concentration of the PD 1, and the n+ type semiconductor region 96 having high concentration of the PD 2, are directly connected.

In this way, the n+ type semiconductor regions 95 and 96 having high concentration are connected, whereby a profile can be realized wherein no potential barrier occurs between the PD 1 and PD 2. According to such an arrangement, readout of accumulated charges of the PD 2 by the transfer gate electrode 93 can readily be performed, and accordingly, a gate electrode to be embedded in the depth direction of the semiconductor substrate 91 does not have to be formed. Accordingly, the solid-state imaging device manufacturing processes can be reduced in the number of processes, and can be simplified.

6. Third Embodiment of Solid-State Imaging Device

Next, the configuration of a solid-state imaging device according to a third embodiment will be described.

Figure 23:
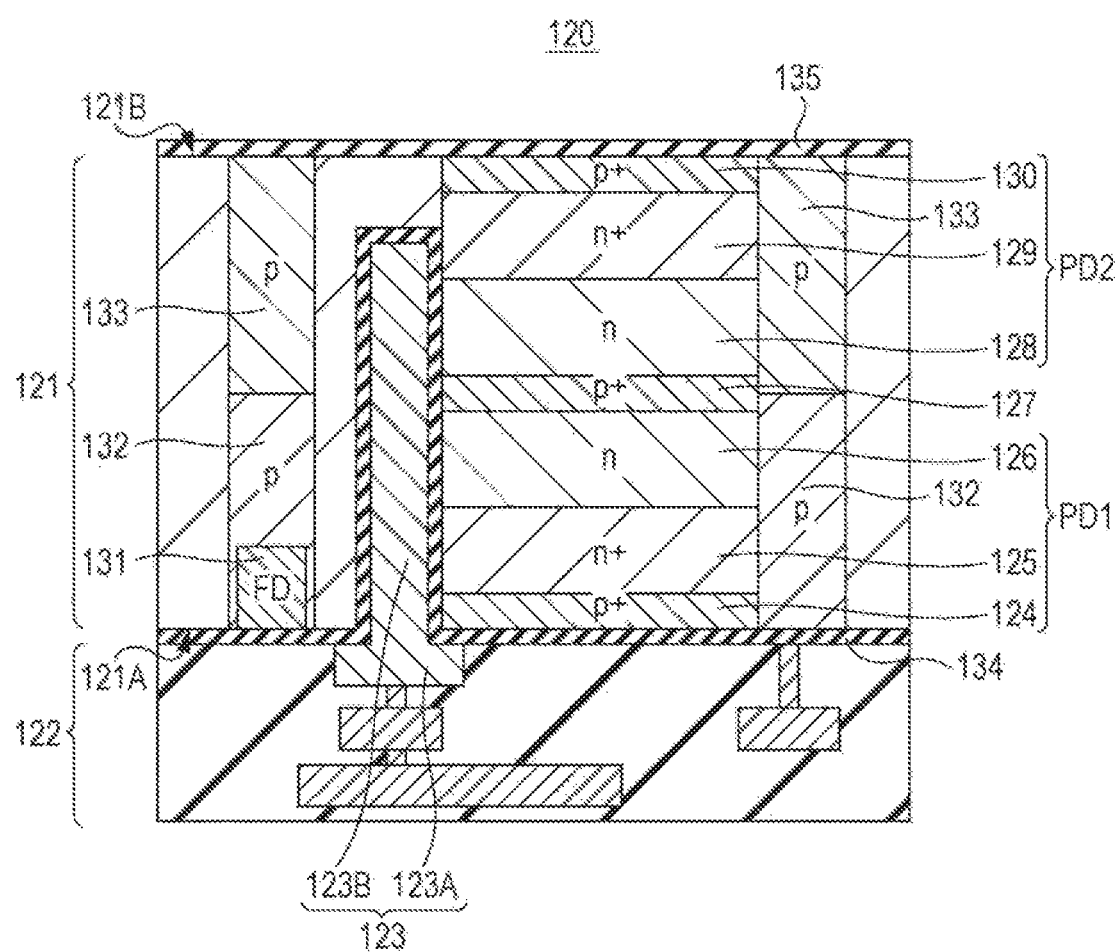
FIG. 23 is a cross-sectional view illustrating the configuration of a solid-state imaging device according to a third embodiment.

FIG. 23 illustrates principal portions making up one pixel of the solid-state imaging device according to the third embodiment. FIG. 23 is a cross-sectional view illustrating the configuration of the solid-state imaging device.

With a solid-state imaging device 120 illustrated in FIG. 23, a first photodiode (PD 1) is provided on the surface on an opposite face (substrate front face) 121A side of the light incident face of a semiconductor substrate 121. A second photodiode (PD 2) is formed on the surface on a light incident face (substrate rear face) 121B side of the semiconductor substrate 121. Furthermore, a first electroconductive type (p type) semiconductor region 127 is provided between the PD 1 and PD 2.

Also, with the solid-state imaging device 120, a wiring layer 122 made up of an insulating layer and a wiring is provided onto the substrate front face 121A of the semiconductor substrate 121. Optical components such as a photoelectric conversion film, a color filter, a micro lens, and so forth which are not illustrated are mounted on the substrate rear face 121B of the semiconductor substrate 121 via an insulating layer 135.

The PD 1 includes, in order from the substrate front face 121A, a first electroconductive type (p+ type) semiconductor region 124 having high concentration, a second electroconductive type (n+ type) semiconductor region 125 having high concentration, and a second electroconductive type (n type) semiconductor region 126.

The PD 2 includes, in order from the substrate rear face 121B, a first electroconductive type (p+ type) semiconductor region 130 having high concentration, a second electroconductive type (n+ type) semiconductor region 129 having high concentration, and a second electroconductive type (n type) semiconductor region 128.

The n type semiconductor region 126 of the PD 1, and the n type semiconductor region 128 of the PD 2 are connected to the first electroconductive type (p type) semiconductor region 127 provided between the PD 1 and PD 2, and the PD 1 and PD 2 are integrally formed.

The p+ type semiconductor regions 124 and 130 are impurity regions for suppressing occurrence of dark current at the PD1 or PD 2. The n+ type semiconductor regions 125 and 129 are charge accumulating regions, and the n type semiconductor regions 126 and 128 are photoelectric conversion regions.

Also, the solid-state imaging device 120 illustrated in FIG. 23 includes a vertical-type transistor (Tr) for reading out electric charges of the PD 1 and PD 2. The vertical-type Tr is configured of a transfer gate electrode 123 formed via the insulating film 134, and a floating diffusion (FD) 131 for accumulating transferred signal charges.

The transfer gate electrode 123 is configured of a planar gate electrode 123A formed on the semiconductor substrate 121, and a vertical-type gate electrode 123B formed in a columnar shape in the depth direction from the surface of the semiconductor substrate 121 below the planar gate electrode 123A.

The FD 131 is made up of a second electroconductive type (n+ type) semiconductor region having high concentration, and is formed on the surface of the semiconductor substrate 121 in a position facing the PD 1 and PD 2 via the transfer gate electrode 123.

Also, a first pixel separation portion 132 and a second pixel separation portion 133 for sectioning the increment pixels are formed with a first electroconductive (p type) semiconductor region. The first and second pixel separation portions 132 and 133 are formed between adjacent pixels. The first pixel separation portion 132 is formed on the front face 121A side of the semiconductor substrate 121, and the second pixel separation portion 133 is formed on the rear face 121B side of the semiconductor substrate 121. The first pixel separation portion 132 and second pixel separation portion 133 are connected and integrated at the center of the semiconductor substrate 121. Also, the FD 131 is formed within the first pixel separation portion 132.

The solid-state imaging device 120 according to the third embodiment has a configuration including a p type semiconductor region 127 serving between the PD 1 and PD 2 as compared to the above-mentioned solid-state imaging device according to the first embodiment. Therefore, with the PD 1, a PN junction between the n type semiconductor region 126 and p type semiconductor region 127 is formed. Also, with the PD 2, a PN junction between the n type semiconductor region 128 and p type semiconductor region 127 is formed.

In the same way as with the above-mentioned solid-state imaging device according to the first embodiment, according to an arrangement wherein the impurity concentration of the PD 2 to be formed on the rear face 121B is raised, a steep PN junction is obtained between the p+ type semiconductor region 130 and n+ type semiconductor region 129. The PN junction capacity of the PD 2 can be increased, and the saturation signal amount of the solid-state imaging device 120 can be increased.

Further, a PN junction is formed between the p type semiconductor region 127, and the n type semiconductor regions 126 and 128. Therefore, with the PD 1 and PD 2, the PN junction capacity can be increased as compared to the first embodiment.

Accordingly, the saturation signal amount of the solid-state imaging device 120 can be increased.

7. Solid-State Imaging Device Manufacturing Method According to Third Embodiment Next, an example of a solid-state imaging device manufacturing method according to the third embodiment will be described. Note that, with description of the following manufacturing method, the same configurations as with the configurations of the solid-state imaging device 120 according to the third embodiment illustrated in the above FIG. 23 are denoted with the same reference numerals, and the details of the configurations will be omitted. Also, description will be omitted regarding the manufacturing method for the semiconductor substrate, wiring layers, other various types of transistors, and various elements formed on the solid-state imaging device. These can be manufactured by a method according to the related art.

Figure 24A:
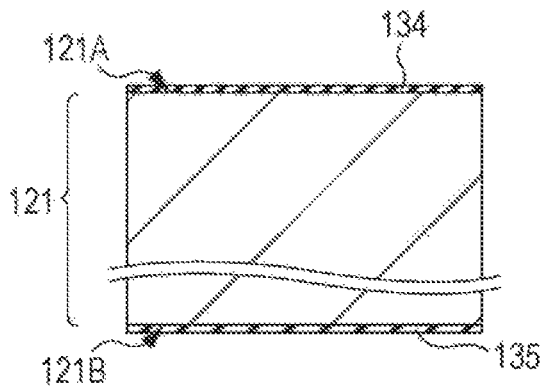
FIGS. 24A through 24C are manufacturing process diagrams of the solid-state imaging device according to the third embodiment.

First, as illustrated in FIG. 24A, the semiconductor substrate 121 is prepared. As for the semiconductor substrate 121, a Si substrate is employed, for example. Insulating layers 134 and 135 for surface protection made up of a thermally-oxidized film or the like are formed on the front face 121A and rear face 121B of the semiconductor substrate 121.

Figure 24B:
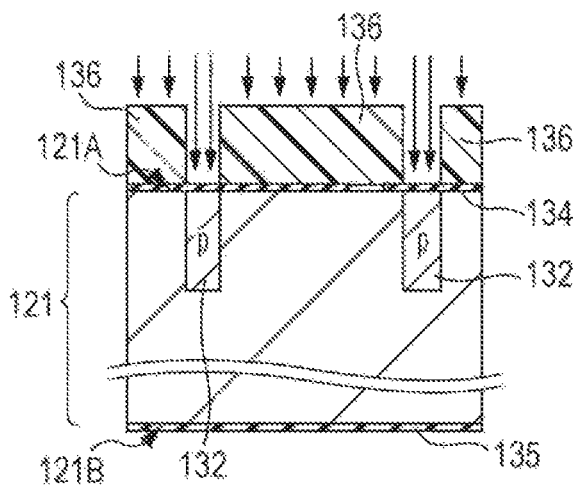

Next, as illustrated in FIG. 24B, a resist layer 136 is formed on the front face 121A of the semiconductor substrate 121. The resist layer 136 is formed with a pattern for opening a position where a pixel separation region for sectioning between pixels of the solid-state imaging device is formed, using the photolithographic technique.

Next, the first electroconductive type (p type) impurity is ion-injected into the semiconductor substrate 121 from the opening of the resist layer 136. According to this ion injection, the first pixel separation portion 132 is formed on the front face 121A side of the semiconductor substrate 121. Depth where the first pixel separation portion 132 is formed is taken as a half or so of the thickness of the semiconductor substrate 121 at the time of finally forming the solid-state imaging device 120.

Figure 24C:
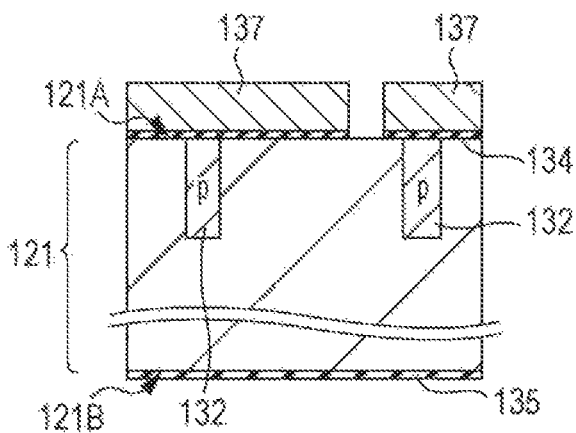

Next, as illustrated in FIG. 24C, a resist layer 137 is formed on the front face 121A of the semiconductor substrate 121. The resist layer 137 is formed with a pattern for opening a position where the vertical-type gate electrode 123B of the transfer gate electrode 123 of the solid-state imaging device is formed, using the photolithographic technique.

Figure 25D:
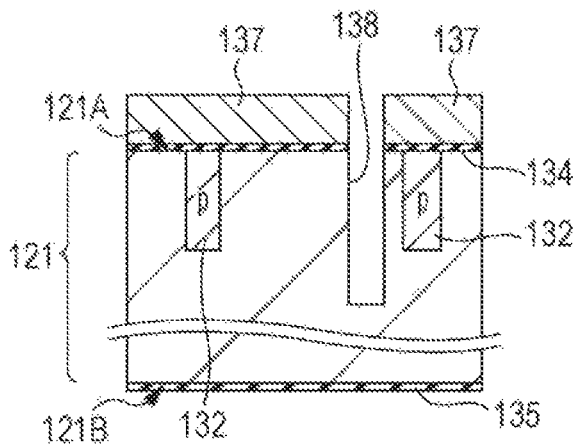
FIGS. 25D through 25F are manufacturing process diagrams of the solid-state imaging device according to the third embodiment.
Figure 25E:
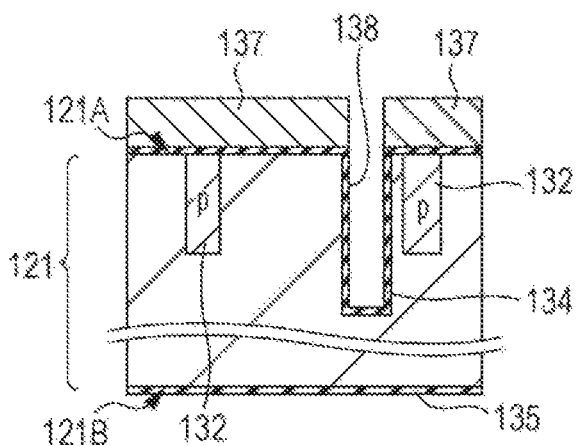

Next, as illustrated in FIG. 25D, the semiconductor substrate 121 and insulating layer 134 are subjected to etching from the opening of the resist layer 137 using anisotropic etching. A trench 138 is formed on the semiconductor substrate 121. Further, as illustrated in FIG. 25E, an insulating layer 134 made up of a thermally-oxidized film or the like is formed on the semiconductor substrate 121 exposed within the trench 138.

Figure 25F:
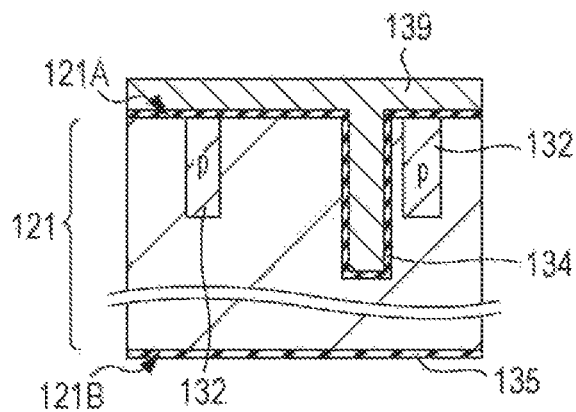

Next, after removing the resist layer 137, as illustrated in FIG. 25F, a gate electrode material layer 139 made up of polysilicon or the like is formed on the semiconductor substrate 121. With this gate electrode material layer 139, after the trench 138 of the semiconductor substrate 121 is embedded and formed, the surface is flattened using the CMP method or the like.

Figure 26G:
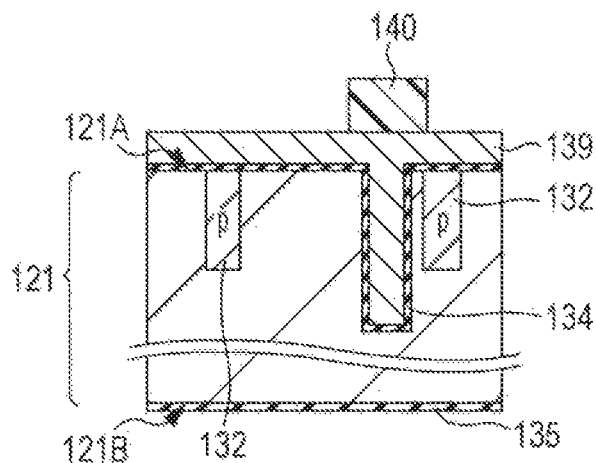
FIGS. 26G through 26I are manufacturing process diagrams of the solid-state imaging device according to the third embodiment.

Next, as illustrated in FIG. 26G, a resist layer 140 is formed on the gate electrode material layer 139. The resist layer 140 is formed with a pattern remaining on a position where the gate electrode 123 of the solid-state imaging device is formed, and particularly on a region where the planar gate electrode 123A is formed, using the photolithographic technique.

Figure 26H:
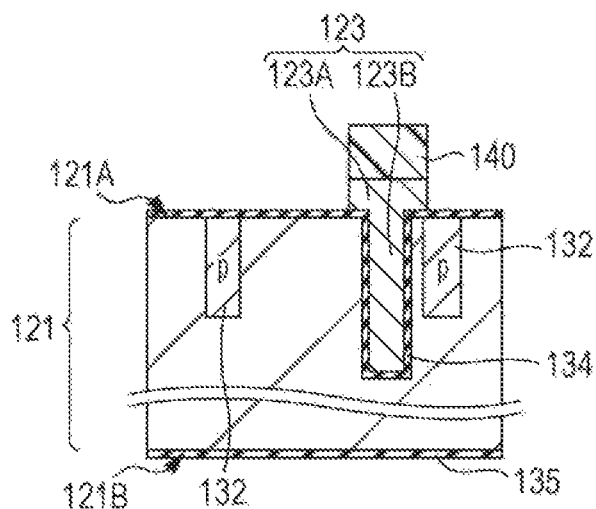

Next, as illustrated in FIG. 26H, the gate electrode material layer 139 is subjected to etching with the resist layer 140 as a mask. Thus, the gate electrode 123 is formed. With the gate electrode 123, a portion formed within the trench 138 of the semiconductor substrate 121 becomes a vertical-type gate electrode 123B, and a portion formed on the surface of the semiconductor substrate 121 becomes a planar gate electrode 123A.

Figure 26I:
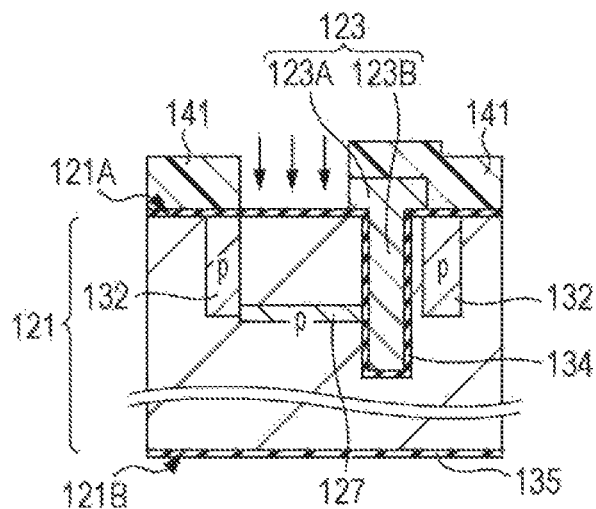

Next, as illustrated in FIG. 26I, a resist layer 141 is formed on the semiconductor substrate 121. The resist layer 141 is formed with a pattern for opening a position where the PD 1 of the solid-state imaging device is formed, using the photolithographic technique.

Next, a p type impurity is ion-injected into a deep position of the semiconductor substrate 121 from the opening of the resist layer 141. Ion injection is performed on a position where a half of the thickness of the semiconductor substrate 121 is taken as the center at the time of finally forming the solid-state imaging device 120. According to this process, a p type semiconductor region 127 is formed in a deep portion of the semiconductor substrate 121.

Figure 27J:
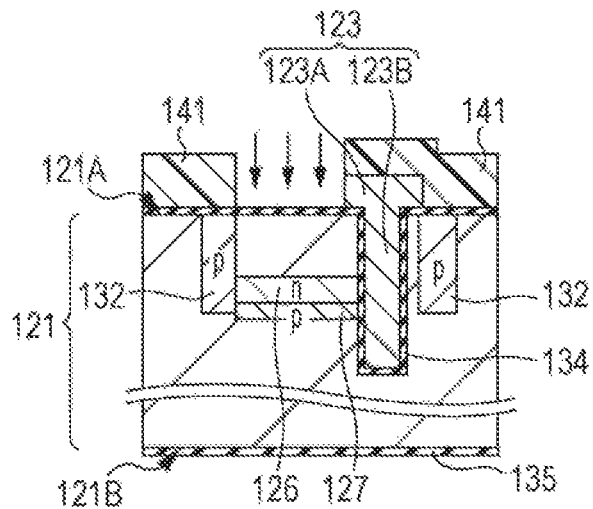
FIGS. 27J through 27L are manufacturing process diagrams of the solid-state imaging device according to the third embodiment.

Next, as illustrated in FIG. 27J, an n type impurity is ion-injected onto the p type semiconductor region 127 formed in the previous process from the opening of the resist layer 141. According to this process, then type semiconductor region 126 making up the PD 1 is formed in a deep portion of the semiconductor substrate 121.

Figure 27K:
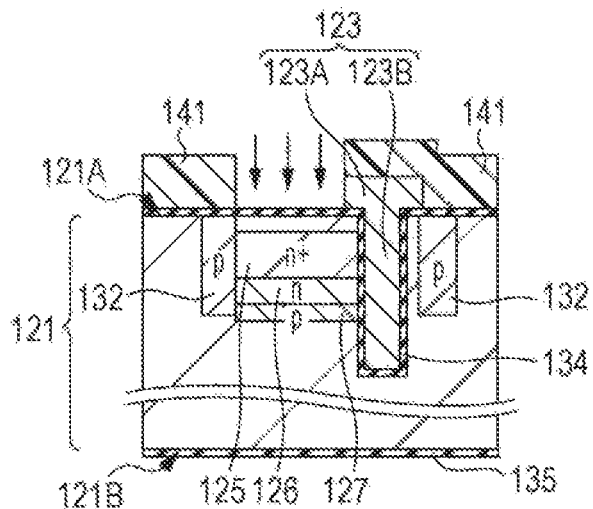

Next, as illustrated in FIG. 27K, an n type impurity is ion-injected into a shallow region on the n type semiconductor region 126 formed in the previous process from the opening of the resist layer 141. According to this ion injection, the n+ type semiconductor region 125 is formed.

Figure 27L:
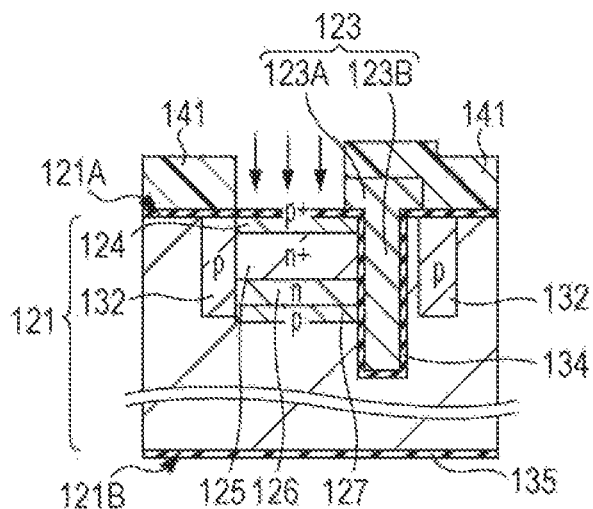

Next, as illustrated in FIG. 27L, a p type impurity is ion-injected from the opening of the resist layer 141. According to this ion injection, the p+ type semiconductor region 124 is formed on the surface of the semiconductor substrate 121.

According to the above processes, the PD 1 having a configuration wherein the p+ type semiconductor region 124, n+ type semiconductor region 125, and n type semiconductor region 126 are laminated from the front face 121A side of the semiconductor substrate 121, and the p type semiconductor region 127 are formed.

Figure 28M:
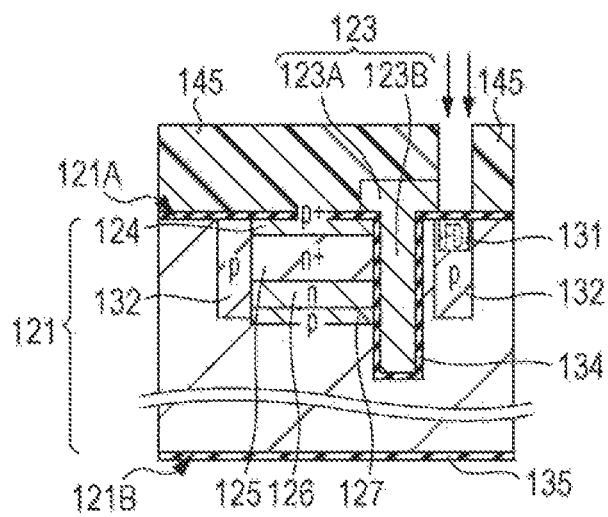
FIGS. 28M through 28O are manufacturing process diagrams of the solid-state imaging device according to the third embodiment.

Next, as illustrated in FIG. 28M, a resist layer 145 is formed on the front face 121A of the semiconductor substrate 121. The resist layer 145 is formed with a pattern for opening a position where the FD 131 is formed, and specifically, the inside of the first pixel separation portion 132 of a position facing the PD 1 of the solid-state imaging device via the gate electrode 123, using the photolithographic technique.

Next, a second electroconductive type (n type) impurity is ion-injected into the semiconductor substrate 121 from the opening of the resist layer 145. According to this ion injection, the FD 131 is formed within the first pixel separation portion 132 on the front face 121A side of the semiconductor substrate 121.

Figure 28N:
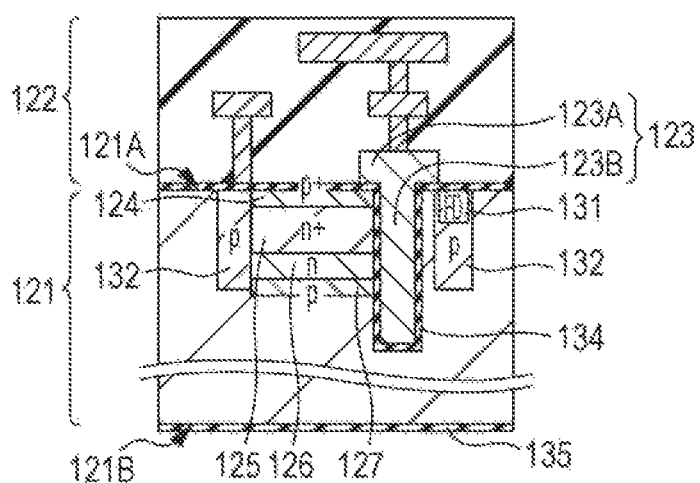

Next, as illustrated in FIG. 28N, a wiring layer 122 is formed on the front face 121A of the semiconductor substrate 121. The wiring layer 122 is formed by laminating an inter-layer insulating layer and an electroconductive layer. Also, an electroconductive layer to be connected to the gate electrode or PD or the like of the solid-state imaging device is formed by passing through the inter-layer insulating layer.

Figure 28O:
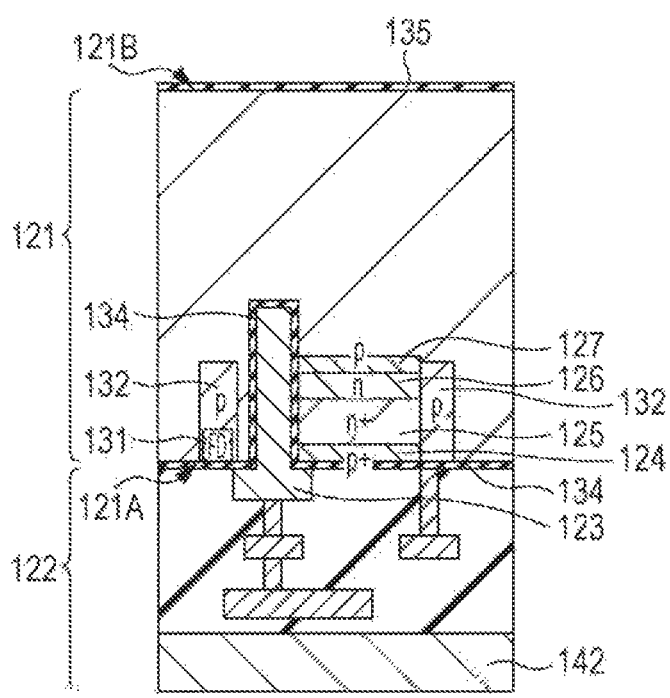
Figure 29P:
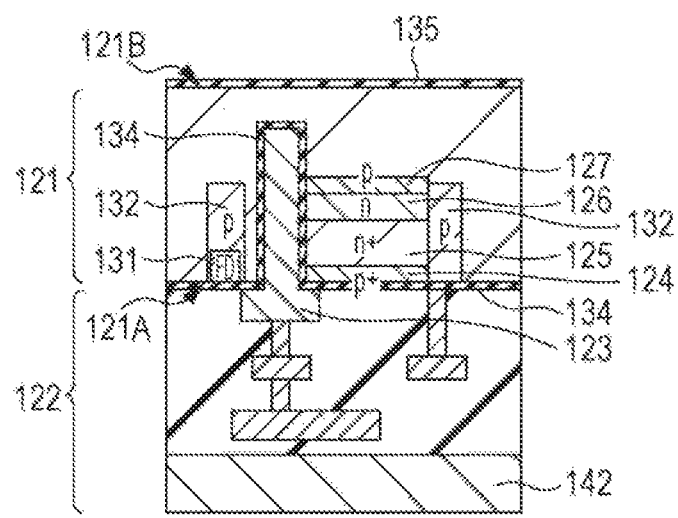
FIGS. 29P through 29R are manufacturing process diagrams of the solid-state imaging device according to the third embodiment.

Next, as illustrated in FIG. 28O, a supporting substrate 142 is connected onto the wiring layer 122, and the semiconductor substrate 121 is reversed. Next, as illustrated in FIG. 29P, the rear face 121B side of the semiconductor substrate 121 is removed using the CMP or the like. The semiconductor substrate 121 is formed in predetermined thickness by removing the rear face 121B side of the semiconductor substrate 121. The insulating layer 135 for surface protection made up of a thermally-oxidized film or the like is formed on the rear face 121B of the semiconductor substrate 121 again.

Figure 29Q:
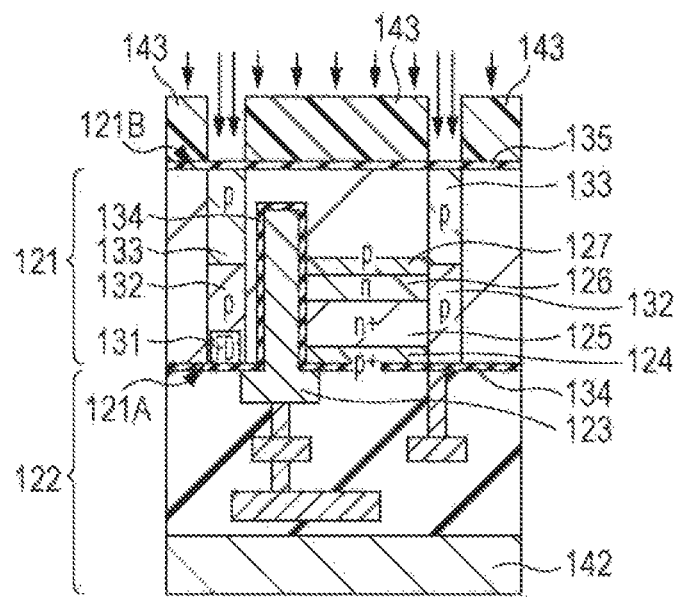

Next, as illustrated in FIG. 29Q, a resist layer 143 is formed on the rear face 121B of the semiconductor substrate 121. The resist layer 143 is formed with a pattern for opening a position where a pixel separation region for sectioning between pixels of the solid-state imaging device is formed, using the photolithographic technique.

Next, a p type impurity is ion-injected into the rear face 121B side of the semiconductor substrate 121 from the opening of the resist layer 143. According to this ion injection, the second pixel separation portion 133 is formed on the rear face 121B side of the semiconductor substrate 121. The second pixel separation portion 133 is formed from depth whereby the second pixel separation portion 133 comes into contact with the already formed first pixel separation portion 132, to the rear face 15B.

According to this process, the pixel separation region made up of the first pixel separation portion 132 and second pixel separation portion 133 is formed from the front face 121A to rear face 121B of the semiconductor substrate 121.

Figure 29R:
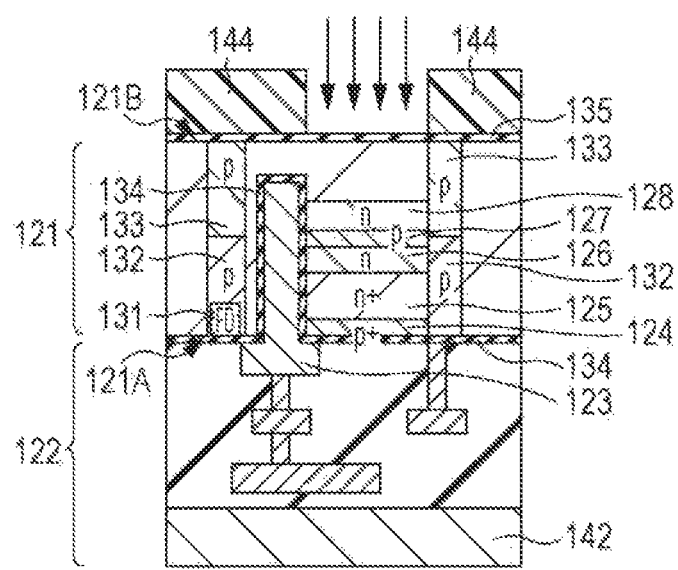

Next, as illustrated in FIG. 29R, a resist layer 144 is formed on the rear face 121B of the semiconductor substrate 121. The resist layer 144 is formed with a pattern for opening a position where the PD 2 of the solid-state imaging device is formed, using the photolithographic technique.

Next, an n type impurity is ion-injected into a deep position of the semiconductor substrate 121 from the opening of the resist layer 144. Ion injection is performed up to the depth of a half or so of the thickness of the semiconductor substrate 121 at the time of finally forming the solid-state imaging device 120. Next, the n type semiconductor region 128 making up the PD 2 is formed in a position connecting to the p type semiconductor region 127 by diffusing the impurity up to a position connecting to the already formed p type semiconductor region 127.

Figure 30S:
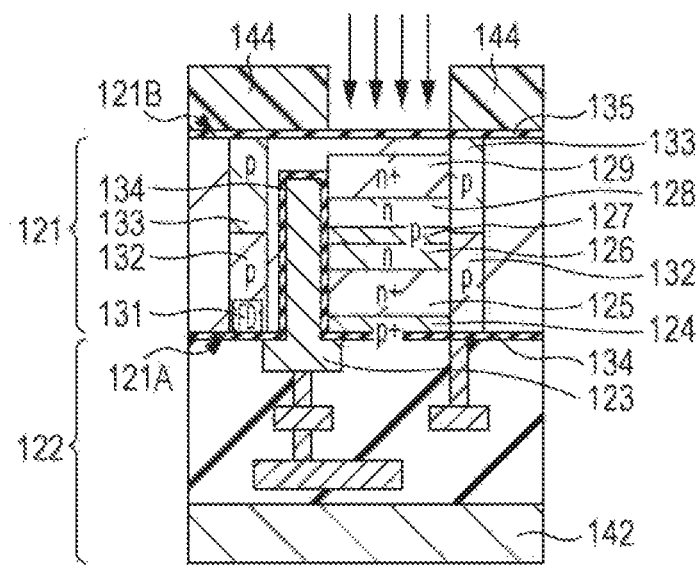
FIGS. 30S through 30U are manufacturing process diagrams of the solid-state imaging device according to the third embodiment.

Next, as illustrated in FIG. 30S, an n type impurity is ion-injected into a shallow region on the n type semiconductor region 128 formed in the previous process from the opening of the resist layer 144. According to this ion injection, the n+ type semiconductor region 129 is formed.

Figure 30T:
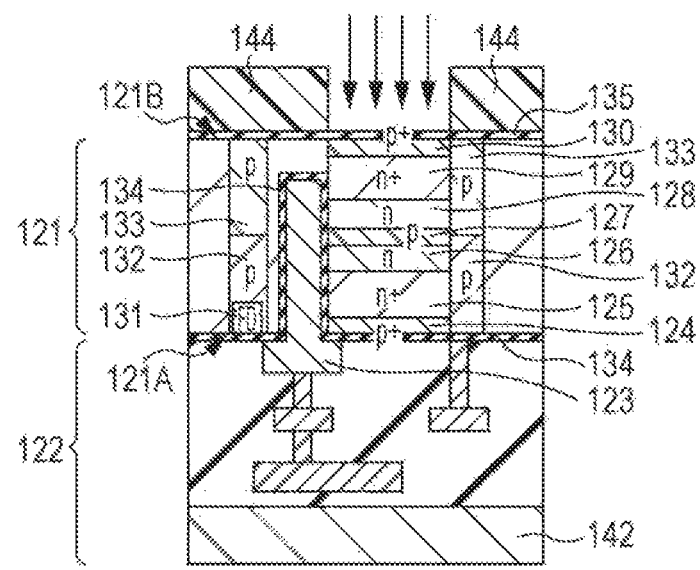

Next, as illustrated in FIG. 30T, a p type impurity is ion-injected from the opening of the resist layer 144. According to this ion injection, the p+ type semiconductor region 130 having high concentration is formed on the rear face 121B of the semiconductor substrate 121.

According to the above processes, the PD 2 is formed wherein the p+ type semiconductor region 130, n+ type semiconductor region 129, and n+ type semiconductor region 128 are laminated from the rear face 121B side of the semiconductor substrate 121.

Figure 30U:
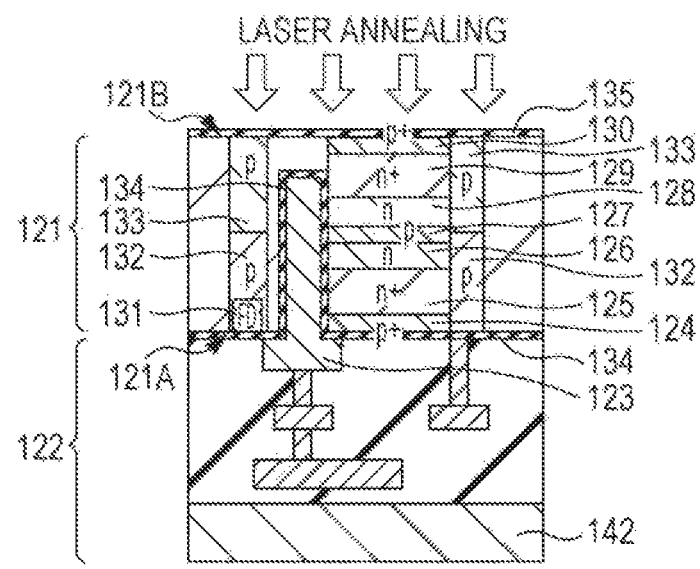

Next, as illustrated in FIG. 30U, the semiconductor substrate 121 where the PD 1 and PD 2 and so forth are formed is subjected to heat treatment according to laser annealing or the like from the rear face 121B side. For example, activation of an impurity formed within the semiconductor substrate 121 is performed by heat treatment of 1000° C.

According to the above processes, the solid-state imaging device according to the third embodiment can be manufactured.

With the above-mentioned solid-state imaging device manufacturing method according to the present embodiment, the PD 1 and PD 2 are formed by ion injection from the front face 121A side and rear face 121B side of the semiconductor substrate 121. Also, the p type semiconductor region 127 is formed between the PD 1 and PD 2 by ion injection, thereby connecting the n type semiconductor region 126 and n type semiconductor region 128.

Diffusion for ion injection can be controlled in the event of depth between the PD 1 and PD 2 enough for forming the p type semiconductor region 127. Therefore, deterioration in the concentration of the p type semiconductor region 127 due to diffusion of an impurity does not matter. Therefore, with a portion connected to the PD 1 and PD 2, increase in capacity due to a PN junction between the p type semiconductor region 127 and then type semiconductor regions 126 and 128 is enabled. Accordingly, there can be manufactured the solid-state imaging device 50 of which the saturation signal amount is increased as compared to the sold-state imaging device according to the first embodiment.

8. Fourth Embodiment of Solid-State Imaging Device

Next, the configuration of a solid-state imaging device according to a fourth embodiment will be described.

Figure 31:
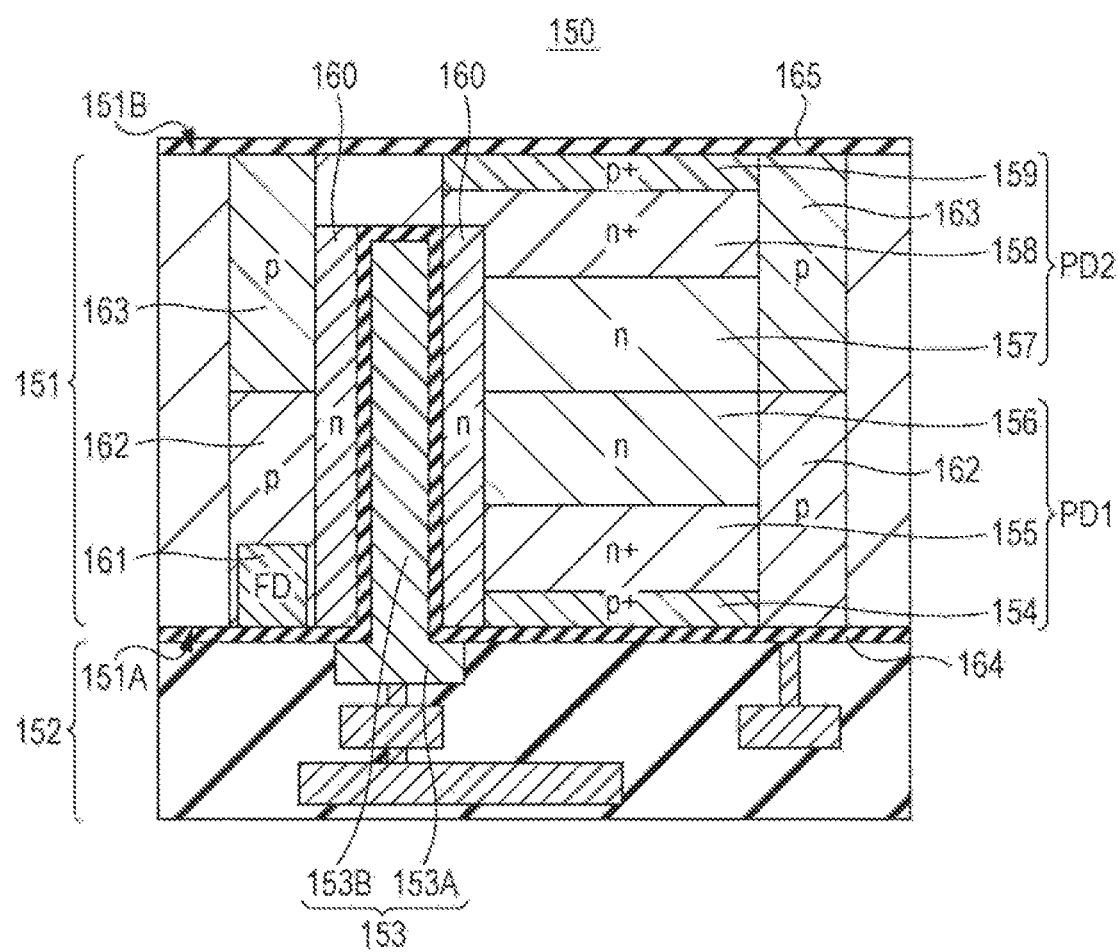
FIG. 31 is a cross-sectional view illustrating the configuration of a solid-state imaging device according to a fourth embodiment.

FIG. 31 illustrates principal portions making up one pixel of the solid-state imaging device according to the fourth embodiment. FIG. 31 is a cross-sectional view illustrating the configuration of the solid-state imaging device.

With a solid-state imaging device 150 illustrated in FIG. 31, a first photodiode (PD 1) is provided on the surface on an opposite face (substrate front face) 151A side of the light incident face of a semiconductor substrate 151. A second photodiode (PD 2) is formed on the surface on a light incident face (substrate rear face) 151B side of the semiconductor substrate 151.

Also, a wiring layer 152 made up of an insulating layer and a wiring is provided onto the substrate front face 151A of the semiconductor substrate 151. Optical components such as a photoelectric conversion film, a color filter, a micro lens, and so forth which are not illustrated are mounted on the substrate rear face 151B of the semiconductor substrate 151 via an insulating layer 165.

The PD 1 includes, in order from the substrate front face 151A side, a first electroconductive type (p+ type) semiconductor region 154 having high concentration, a second electroconductive type (n+ type) semiconductor region 155 having high concentration, and a second electroconductive type (n type) semiconductor region 156.

The PD 2 includes, in order from the substrate rear face 151B, a first electroconductive type (p+ type) semiconductor region 159 having high concentration, a second electroconductive type (n+ type) semiconductor region 158 having high concentration, and a second electroconductive type (n type) semiconductor region 157.

The n type semiconductor region 156 of the PD 1, and the n type semiconductor region 157 of the PD 2 are connected at the center of the semiconductor substrate 151, and the PD 1 and PD 2 are integrally formed.

The p+ type semiconductor regions 154 and 159 are impurity regions for suppressing occurrence of dark current at the PD1 or PD 2. The n+ type semiconductor regions 155 and 158 are charge accumulating regions, and the n type semiconductor regions 156 and 157 are photoelectric conversion regions.

Also, the solid-state imaging device 150 illustrated in FIG. 31 includes a vertical-type transistor (Tr) for reading out electric charges of the PD 1 and PD 2. The vertical-type Tr is configured of a transfer gate electrode 153 formed via the insulating layer 164, and a floating diffusion (FD) 161 for accumulating transferred signal charges.

The transfer gate electrode 153 is configured of a planar gate electrode 153A formed on the semiconductor substrate 121, and a vertical-type gate electrode 153B formed in a columnar shape in the depth direction from the face of the semiconductor substrate 121 below the planar gate electrode 153A.

The FD 161 is made up of a second electroconductive type (n+ type) semiconductor region having high concentration, and is formed on the surface of the semiconductor substrate 151 in a position facing the PD 1 and PD 2 via the transfer gate electrode 153.

Also, a first pixel separation portion 162 and a second pixel separation portion 163 for sectioning the increment pixels are formed with a first electroconductive type (p type) semiconductor region. The first and second pixel separation portions 162 and 163 are formed between adjacent pixels. The first pixel separation portion 162 is formed on the front face 151A side of the semiconductor substrate 151, and the second pixel separation portion 163 is formed on the rear face 151B side of the semiconductor substrate 151. The first pixel separation portion 162 and second pixel separation portion 163 are connected and integrated at the center of the semiconductor substrate 151. Also, the FD 161 is formed within the first pixel separation portion 162.

A second electroconductive type (n type) semiconductor region 160 is provided around the vertical-type gate electrode 153B below the planar gate electrode 153A. The n type semiconductor region 160 surrounds the vertical-type gate electrode 153B, and formed from the surface of the semiconductor substrate 151 to depth in proximity to the n+ type semiconductor region 158 of the PD 2. The n type semiconductor region 160 is a region serving as an overflow path for excess charges from the PD 1 and PD 2 to the FD 161, or a channel at the time of charge transfer.

With the configuration of the above solid-state imaging device 150, positive voltage is applied to the transfer gate electrode 153 at the time of readout, the potential (voltage) below the planar gate electrode 153A and circumference of the vertical-type gate electrode 153B is changed. Then type semiconductor region 160 is provided to the region where the potential is changed, thereby transferring signal charges accumulated in the PD 1 and PD 2 to the FD 161 passing through then type semiconductor region 160.

With the configuration of the solid-state imaging device 150, the n type semiconductor regions 156 and 157 are formed for smoothing the potential slope. Thus, the accumulated charges of the PD 2 can readily be transferred to the FD. Further, the solid-state imaging device 150 includes the n type semiconductor region 160, and accordingly, the n type semiconductor region 160 is in proximity to the n+ type semiconductor region 158 of the PD 2, whereby charge transfer from the PD 1 and PD 2 to the FD 161 can readily be performed. Therefore, for example, even when the n type semiconductor regions 156 and 157 are not included, or even when the impurity concentrations of the n type semiconductor regions 156 and 157 are low, the accumulated charges of the PD 2 are transferred to the FD 161 passing through the n type semiconductor region 160, and accordingly, the accumulated charges of the PD 2 can be read out.

Also, an arrangement may be made in the same way as with the above third embodiment wherein a p type semiconductor region is formed between the PD 1 and PD 2. For example, in the case of a configuration wherein a p type semiconductor region is provided between the n type semiconductor regions 156 and 157, the saturation signal amount can be increased. Further, the n type semiconductor region 160 is provided around the vertical-type gate electrode 153B, and accordingly, when voltage is applied to the transfer gate electrode 153 at the time of readout, the potential of the n type semiconductor region 160 is changed. According to this change of the potential of the n type semiconductor region 160, transfer of electric charges from the PD 2 to the FD 161 can readily be performed.

9. Solid-State Imaging Device Manufacturing Method According to Fourth Embodiment Next, an example of a solid-state imaging device manufacturing method according to the fourth embodiment will be described. Note that, with description of the following manufacturing method, the same configurations as with the configurations of the solid-state imaging device 150 according to the fourth embodiment illustrated in the above FIG. 31 are denoted with the same reference numerals, and the details of the configurations will be omitted. Also, description will be omitted regarding the manufacturing method for the semiconductor substrate, wiring layers, other various types of transistors, and various elements formed on the solid-state imaging device. These can be manufactured by a method according to the related art.

Figure 32A:
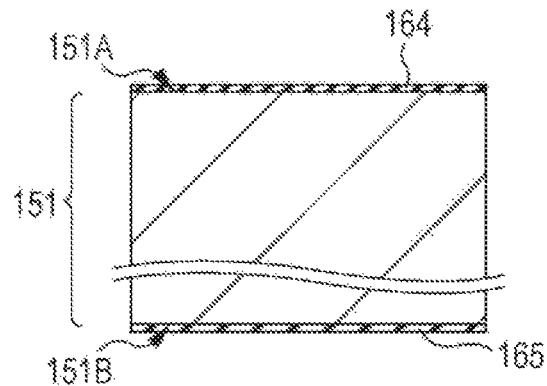
FIGS. 32A through 32C are manufacturing process diagrams of the solid-state imaging device according to the fourth embodiment.

First, as illustrated in FIG. 32A, the semiconductor substrate 151 is prepared. As for the semiconductor substrate 151, a Si substrate is employed, for example. Insulating layers 164 and 165 for surface protection made up of a thermally-oxidized film or the like are formed on the front face 151A and rear face 151B of the semiconductor substrate 151.

Figure 32B:
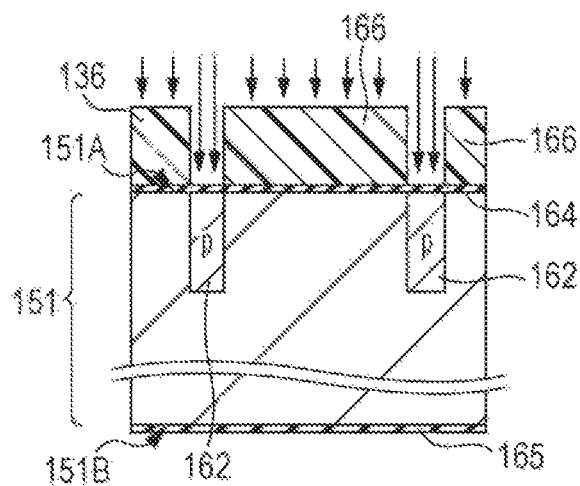

Next, as illustrated in FIG. 32B, a resist layer 166 is formed on the front face 151A of the semiconductor substrate 151. The resist layer 166 is formed with a pattern for opening a position where a pixel separation region for sectioning between pixels of the solid-state imaging device is formed, using the photolithographic technique.

Next, a p type impurity is ion-injected into the semiconductor substrate 151 from the opening of the resist layer 166. According to this ion injection, the first pixel separation portion 162 is formed on the front face 151A side of the semiconductor substrate 151. Depth where the first pixel separation portion 162 is formed is taken as a half or so of the thickness of the semiconductor substrate 151 at the time of finally forming the solid-state imaging device 150.

Figure 32C:
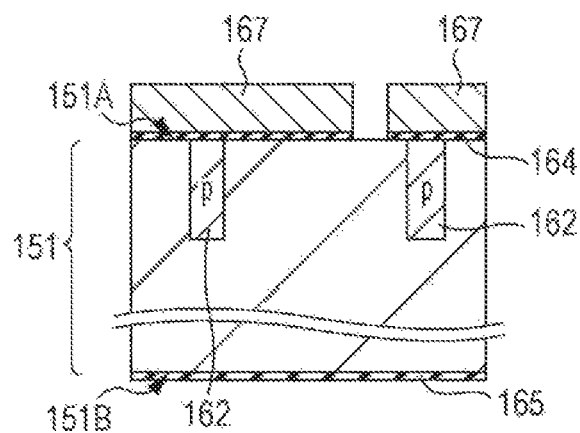

Next, as illustrated in FIG. 32C, a resist layer 167 is formed on the front face 151A of the semiconductor substrate 151. The resist layer 167 is formed with a pattern for opening a position where the vertical-type gate electrode 153B of the transfer gate electrode 153 of the solid-state imaging device is formed, using the photolithographic technique.

Figure 33D:
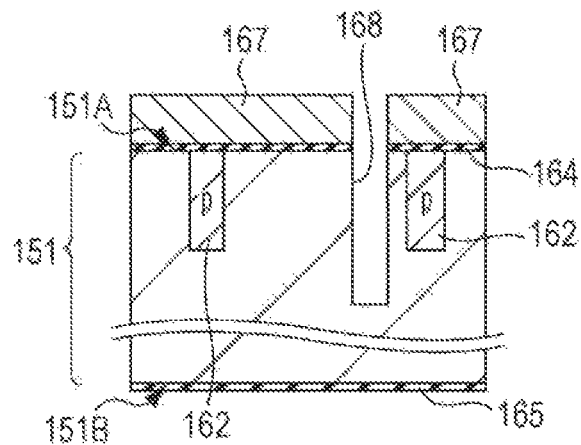
FIGS. 33D through 33F are manufacturing process diagrams of the solid-state imaging device according to the fourth embodiment.
Figure 33E:
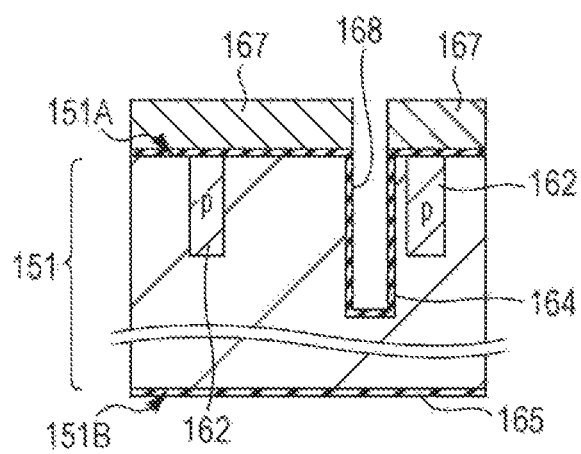

Next, as illustrated in FIG. 33D, the semiconductor substrate 151 and insulating layer 164 are subjected to etching from the opening of the resist layer 167 using anisotropic etching. A trench 168 is formed on the semiconductor substrate 151. Further, as illustrated in FIG. 33E, an insulating layer 164 made up of a thermally-oxidized film or the like is formed on the semiconductor substrate 151 exposed within the trench 168.

Figure 33F:
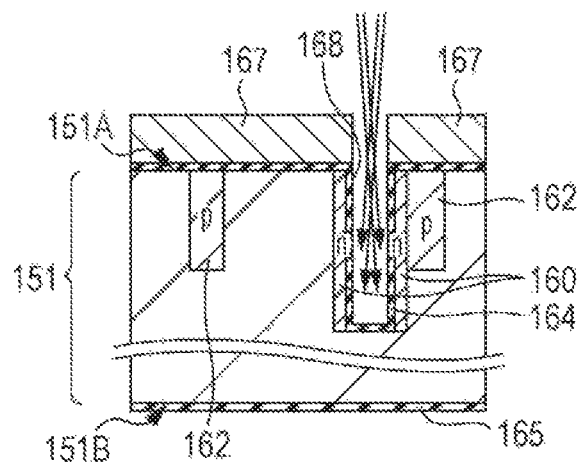

Next, as illustrated in FIG. 33F, an n type impurity is ion-injected into the side wall of the trench 168 from an oblique direction as illustrated with an arrow in the drawing. According to this ion injection, the n type semiconductor region 160 is formed on the semiconductor substrate 151 of the side wall of the trench 168. The n type semiconductor region 160 is formed on a region between the trench 168, and the PD 1 to be formed and the first pixel separation portion 162.

Figure 34G:
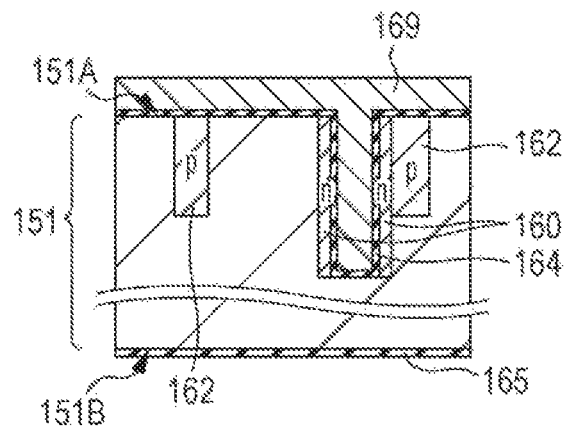
FIGS. 34G through 34I are manufacturing process diagrams of the solid-state imaging device according to the fourth embodiment.

Next, after removing the resist layer 167, as illustrated in FIG. 34G, a gate electrode material layer 169 made up of polysilicon or the like is formed on the semiconductor substrate 151. With this gate electrode material layer 169, after the trench 168 of the semiconductor substrate 151 is embedded and formed, the surface is flattened using the CMP method or the like.

Figure 34H:
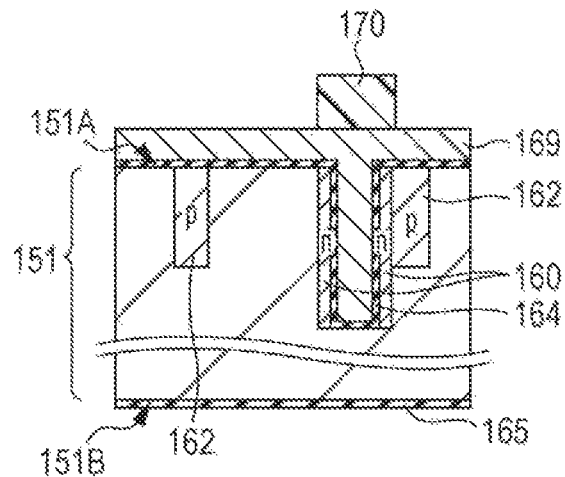

Next, as illustrated in FIG. 34H, a resist layer 170 is formed on the gate electrode material layer 169. The resist layer 170 is formed with a pattern remaining on a position where the gate electrode 153 of the solid-state imaging device is formed, and particularly on a region where the planar gate electrode 153A is formed, using the photolithographic technique.

Figure 34I:
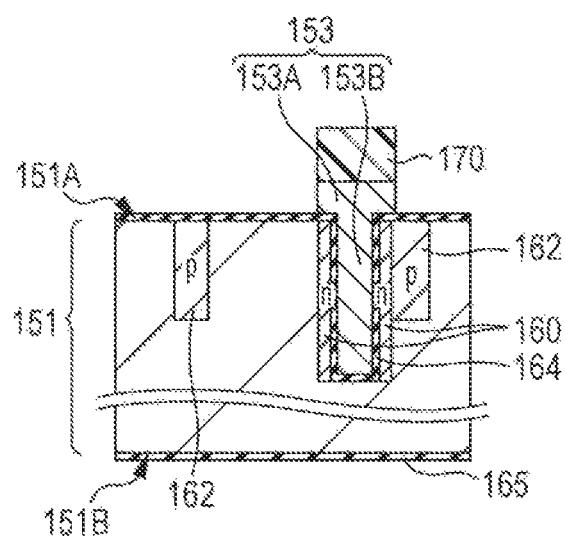

Next, as illustrated in FIG. 34I—, the gate electrode material layer 169 is subjected to etching with the resist layer 170 as a mask. Thus, the gate electrode 153 is formed. With the gate electrode 153, a portion formed within the trench 168 of the semiconductor substrate 151 serves as a vertical-type gate electrode 153B, and a portion formed on the surface of the semiconductor substrate 151 serves as a planar gate electrode 153A.

Figure 35J:
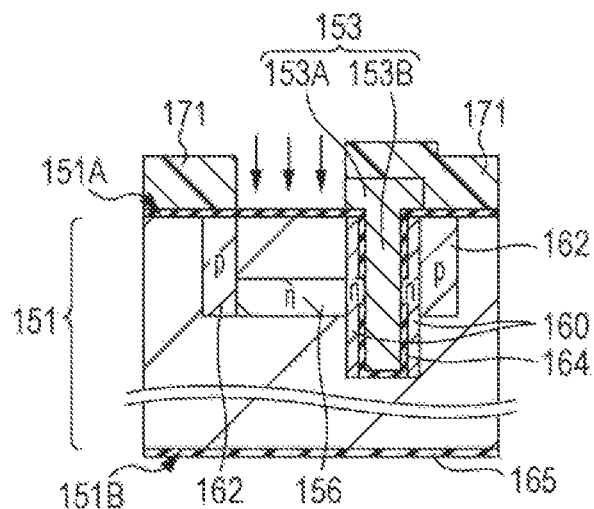
FIGS. 35J through 35L are manufacturing process diagrams of the solid-state imaging device according to the fourth embodiment.

Next, as illustrated in FIG. 35J, a resist layer 171 is formed on the semiconductor substrate 151. The resist layer 171 is formed with a pattern for opening a position where the PD 1 of the solid-state imaging device is formed, using the photolithographic technique.

Next, an n type impurity is ion-injected into a deep position of the semiconductor substrate 151 from the opening of the resist layer 171. Ion injection is performed on a position where a half of the thickness of the semiconductor substrate 151 at the time of finally forming the solid-state imaging device 150 serves as the center. According to this process, the n type semiconductor region 156 is formed in a deep portion of the semiconductor substrate 151.

Figure 35K:
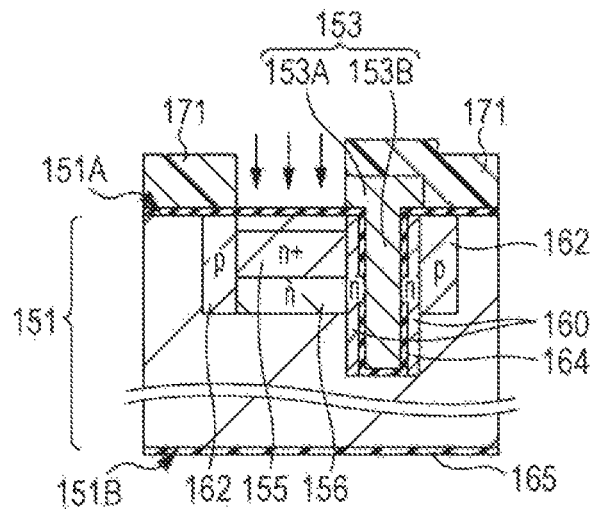

Next, as illustrated in FIG. 35K, an n type impurity is ion-injected into a shallow region on the n type semiconductor region 156 formed in the previous process from the opening of the resist layer 171. According to this ion injection, the n+ type semiconductor region 155 is formed.

Figure 35L:
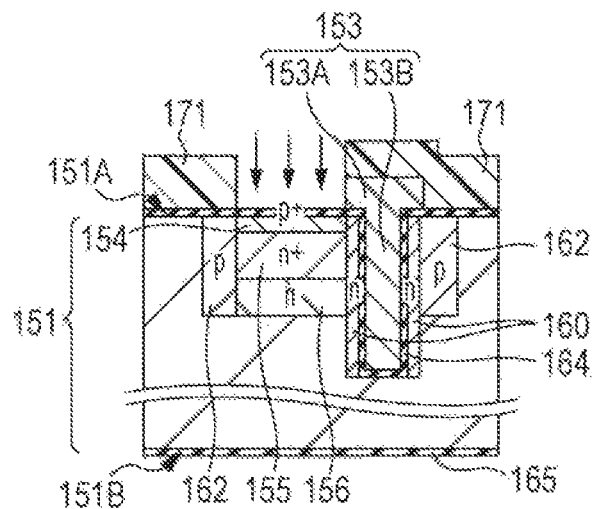

Next, as illustrated in FIG. 35L, a p type impurity is ion-injected from the opening of the resist layer 171. According to this ion injection, the p+ type semiconductor region 154 is formed on the surface of the semiconductor substrate 151.

According to the above processes, the PD 1 is formed wherein the p+ type semiconductor region 154, n+ type semiconductor region 155, and n type semiconductor region 156 are laminated from the front face 151A side of the semiconductor substrate 151.

Figure 36M:
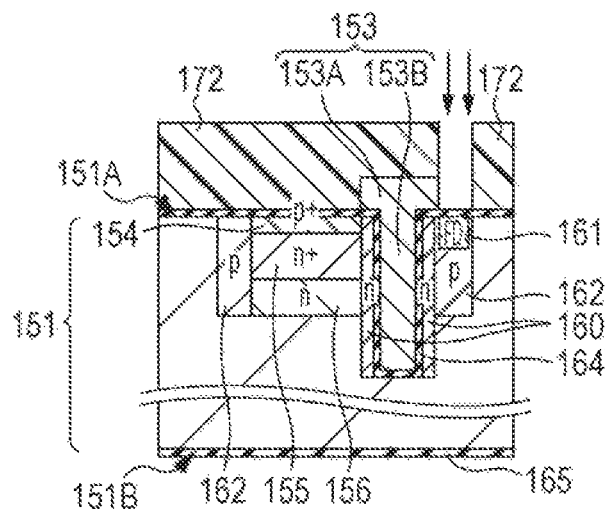
FIGS. 36M through 36O are manufacturing process diagrams of the solid-state imaging device according to the fourth embodiment.

Next, as illustrated in FIG. 36M, a resist layer 172 is formed on the front face 151A of the semiconductor substrate 151. The resist layer 172 is formed with a pattern for opening a position where the FD 161 of the solid-state imaging device is formed, and specifically, the inside of the first pixel separation portion 162 of a position facing the PD 1 via the gate electrode 153, using the photolithographic technique.

Next, an n-type impurity is ion-injected into the semiconductor substrate 151 from the opening of the resist layer 172. According to this ion injection, the FD 161 is formed within the first pixel separation portion 162 on the front face 151A side of the semiconductor substrate 151.

Figure 36N:
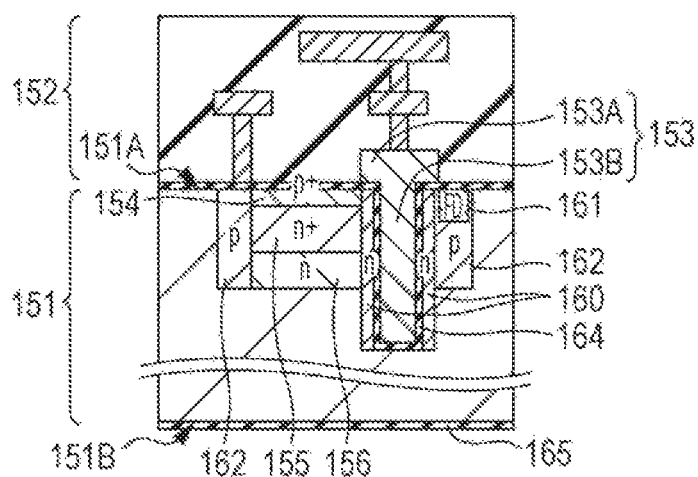

Next, as illustrated in FIG. 36N, a wiring layer 152 is formed on the front face 151A of the semiconductor substrate 151. The wiring layer 152 is formed by laminating an inter-layer insulating layer and an electroconductive layer. Also, an electroconductive layer to be connected to the gate electrode or PD or the like of the solid-state imaging device is formed by passing through the inter-layer insulating layer.

Figure 36O:
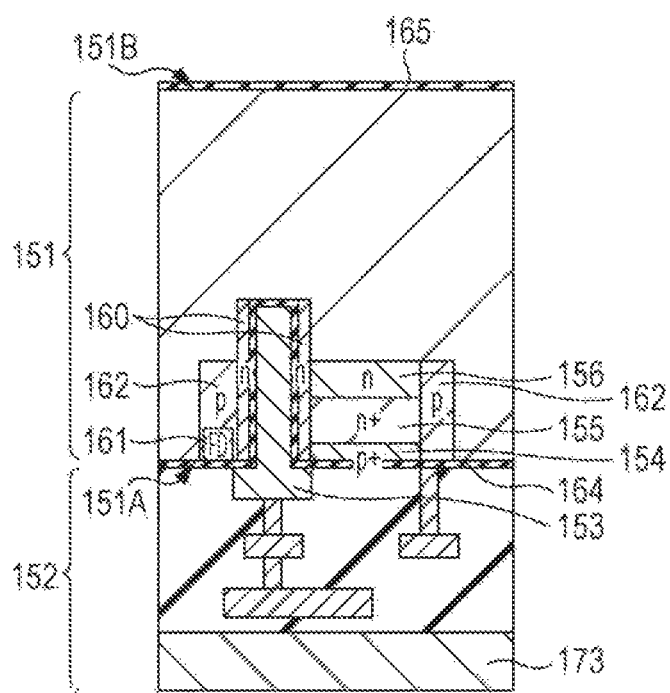
Figure 37P:
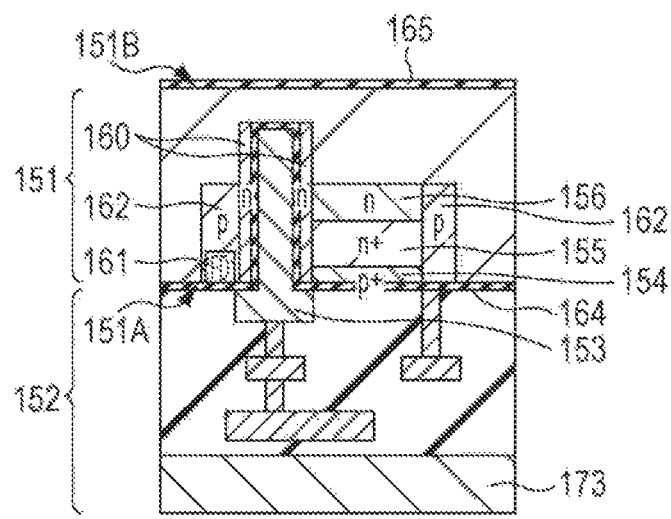
FIGS. 37P through 37R are manufacturing process diagrams of the solid-state imaging device according to the fourth embodiment.

Next, as illustrated in FIG. 36O, a supporting substrate 173 is connected onto the wiring layer 152, and the semiconductor substrate 151 is reversed. Next, as illustrated in FIG. 37P, the rear face 151B side of the semiconductor substrate 151 is removed using the CMP or the like. The semiconductor substrate 151 is formed in predetermined thickness by removing the rear face 151B side of the semiconductor substrate 151. The insulating layer 165 for surface protection made up of a thermally-oxidized film or the like is formed on the rear face 151B of the semiconductor substrate 151 again.

Figure 37Q:
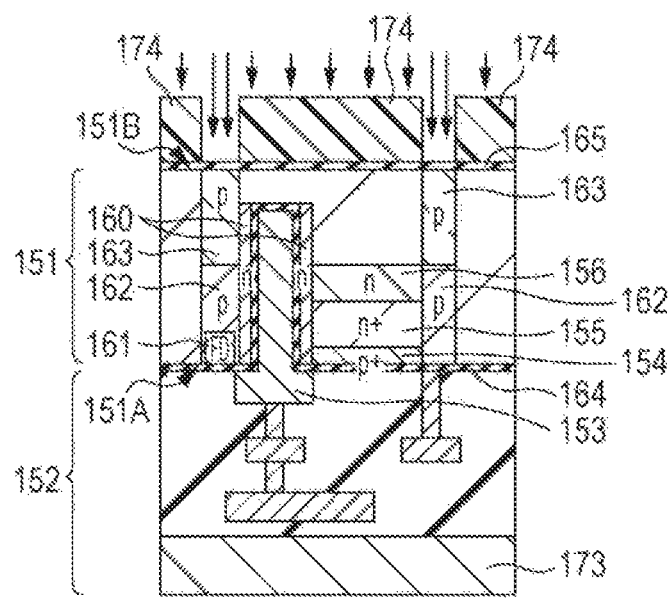

Next, as illustrated in FIG. 37Q, a resist layer 174 is formed on the rear face 151B of the semiconductor substrate 151. The resist layer 174 is formed with a pattern for opening a position where a pixel separation region for sectioning between pixels of the solid-state imaging device is formed, using the photolithographic technique.

Next, a p type impurity is ion-injected into the rear face 151B side of the semiconductor substrate 151 from the opening of the resist layer 174. According to this ion injection, the second pixel separation portion 163 is formed on the rear face 151B side of the semiconductor substrate 151. The second pixel separation portion 163 is formed from depth whereby the second pixel separation portion 162 comes into contact with the already formed first pixel separation portion 162, to the rear face 151B.

According to this process, the pixel separation region made up of the first pixel separation portion 162 and second pixel separation portion 163 is formed from the front face 151A to rear face 151B of the semiconductor substrate 151.

Figure 37R:
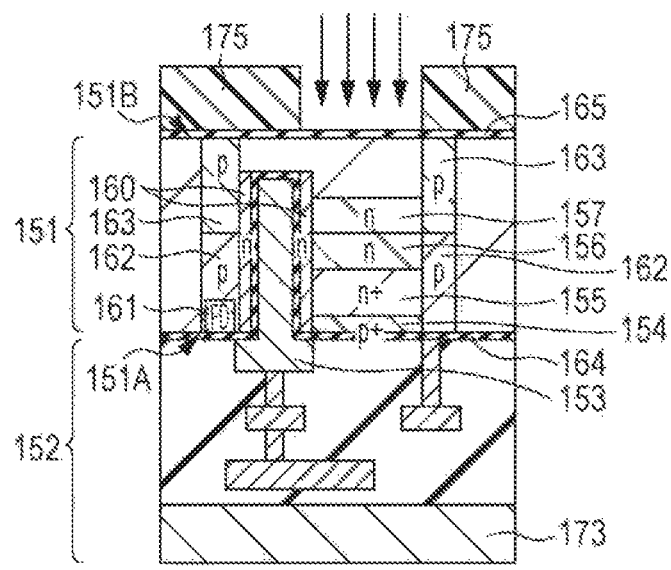

Next, as illustrated in FIG. 37R, a resist layer 175 is formed on the rear face 151B of the semiconductor substrate 151. The resist layer 175 is formed with a pattern for opening a position where the PD 2 of the solid-state imaging device is formed, using the photolithographic technique.

Next, an n type impurity is ion-injected into a deep position of the semiconductor substrate 151 from the opening of the resist layer 175. Ion injection is performed up to the depth of a half or so of the thickness of the semiconductor substrate 151 at the time of finally forming the solid-state imaging device 150. Next, the n type semiconductor region 157 making up the PD 2 is formed in a position connecting to the n type semiconductor region 156 by diffusing the impurity up to a position connecting to the already formed n type semiconductor region 156.

Figure 38S:
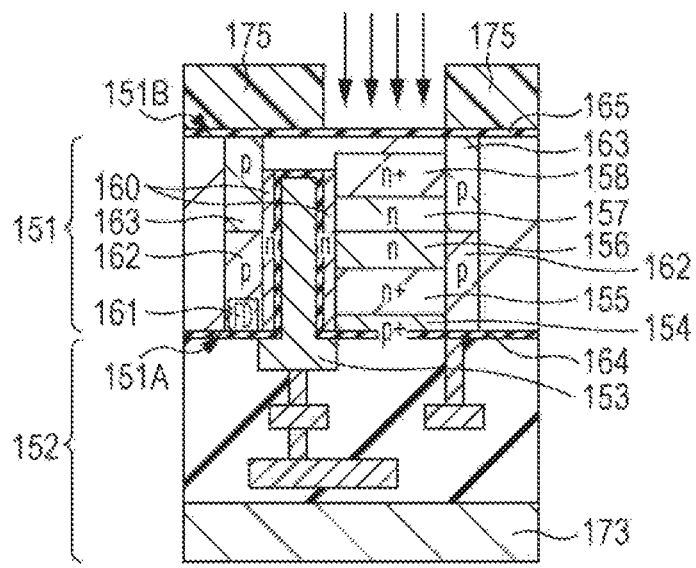
FIGS. 38S through 38U are manufacturing process diagrams of the solid-state imaging device according to the fourth embodiment.

Next, as illustrated in FIG. 38S, an n type impurity is ion-injected into a shallow region on the n type semiconductor region 157 formed in the previous process from the opening of the resist layer 175. According to this ion injection, the n+ type semiconductor region 158 is formed.

Figure 38T:
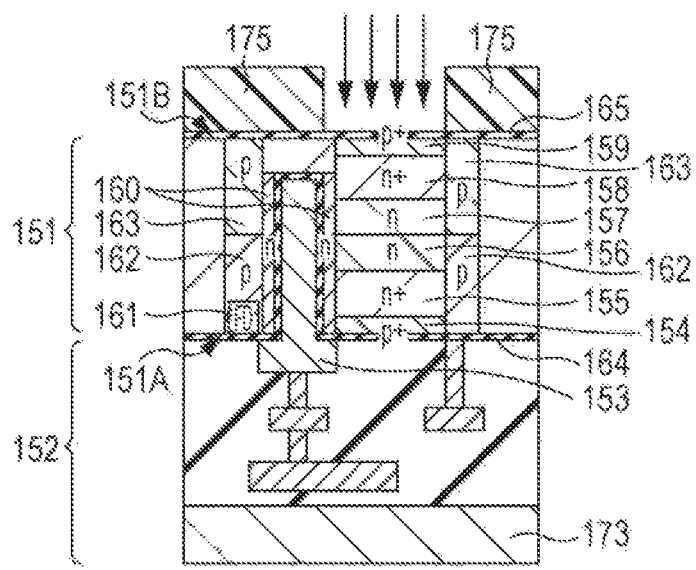

Next, as illustrated in FIG. 38T, a p type impurity is ion-injected from the opening of the resist layer 175. According to this ion injection, the p+ type semiconductor region 159 is formed on the rear face 151B of the semiconductor substrate 151.

According to the above processes, the PD 2 is formed wherein the p+ type semiconductor region 159, n+ type semiconductor region 158, and n type semiconductor region 157 are laminated from the rear face 151B side of the semiconductor substrate 151.

Figure 38U:
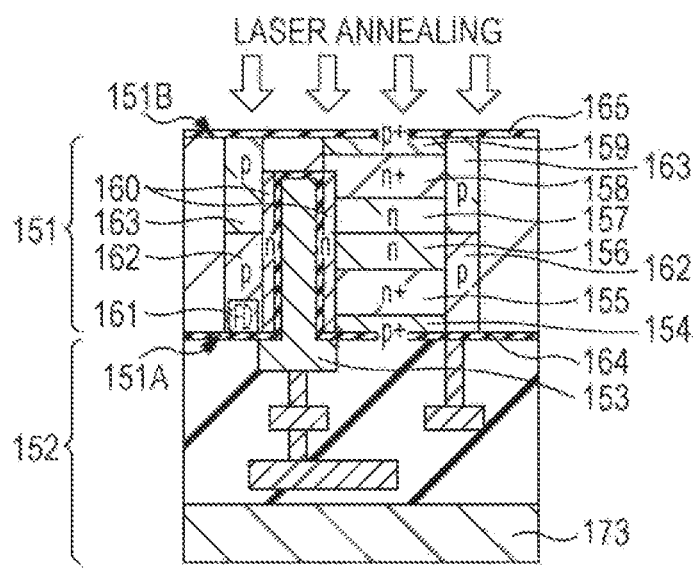

Next, as illustrated in FIG. 38U, the semiconductor substrate 151 where the PD 1 and PD 2 and so forth are formed is subjected to heat treatment according to laser annealing or the like from the rear face 151B side. For example, activation of an impurity formed within the semiconductor substrate 151 is performed by heat treatment of 1000° C.

According to the above processes, the solid-state imaging device according to the fourth embodiment can be manufactured.

With the above-mentioned solid-state imaging device manufacturing method according to the present embodiment, the PD 1 and PD 2 are formed by ion injection from the front face 151A side and rear face 151B side of the semiconductor substrate 151. Also, the n type semiconductor region 160 is formed on the circumference of the vertical-type gate electrode 153B by ion injection for connecting the PD 1 and PD 2. According to this solid-state imaging device manufacturing method, the solid-state imaging device 150 can be manufactured whereby transfer of the accumulated charges of the PD 2 to the FD 161 can readily be performed, in comparison with the solid-state imaging device according to the first embodiment.

10. Fifth Embodiment of Solid-State Imaging Device

Figure 39:
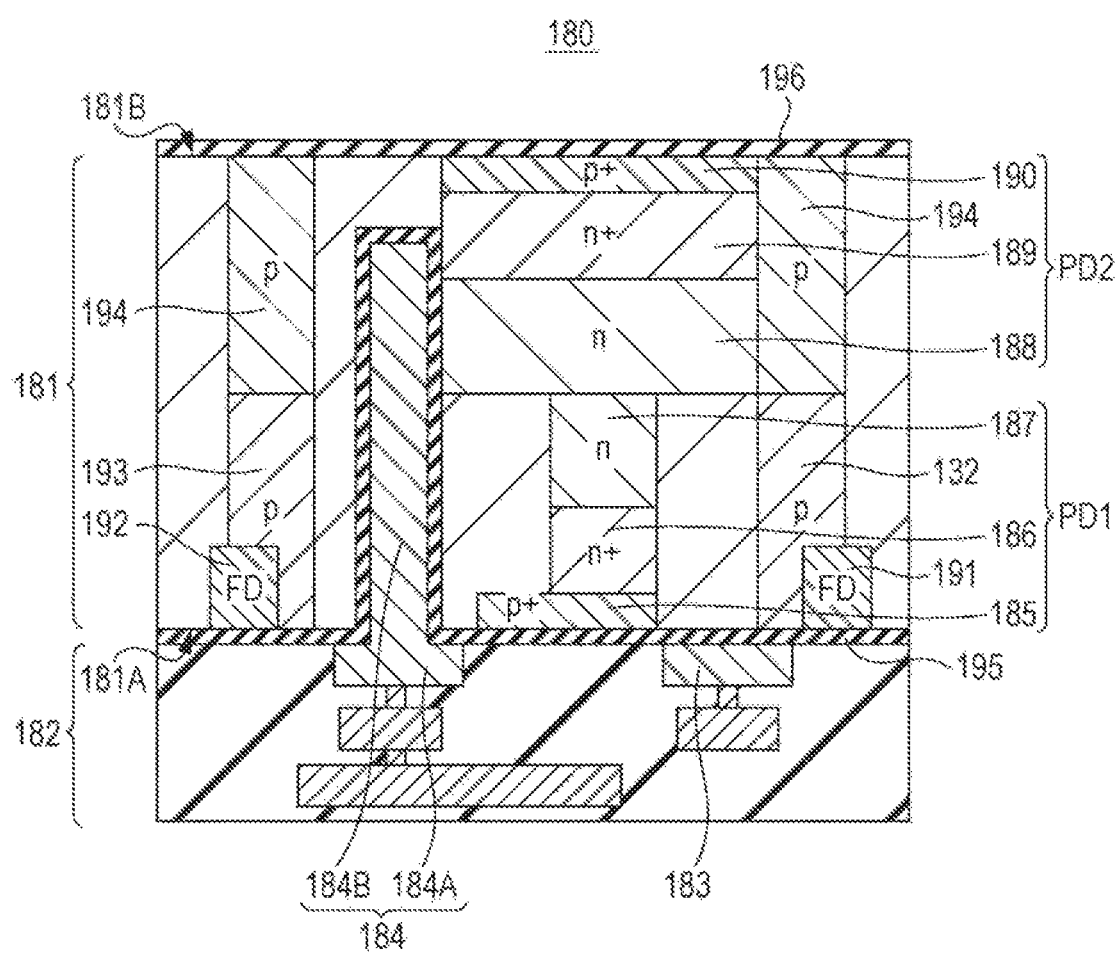
FIG. 39 is a cross-sectional view illustrating the configuration of a solid-state imaging device according to a fifth embodiment.

Next, FIG. 39 illustrates principal portions making up one pixel of a solid-state imaging device according to a fifth embodiment.

With a solid-state imaging device 180 illustrated in FIG. 39, a wiring layer 182 made up of an insulating layer and a wiring is provided onto a substrate front face 181A of a semiconductor substrate 181. Optical components such as a photoelectric conversion film, a color filter, a micro lens, and so forth which are not illustrated are mounted on a substrate rear face 181B of the semiconductor substrate 181 via an insulating layer 196.

Also, with the solid-state imaging device 180, a first photodiode (PD 1) is provided onto the surface on the opposite face (substrate front face) 181A side from the light incident face of the semiconductor substrate 181. A second photodiode (PD 2) is formed on the surface on light incident face (substrate rear face) 181B side of the semiconductor substrate 181.

The PD 1 includes, in order from the substrate front face 181A, a first electroconductive type (p+ type) semiconductor region 185 having high concentration, a second electroconductive type (n+ type) semiconductor region 186 having high concentration, and a second electroconductive type (n type) semiconductor region 187.

The PD 2 includes, in order from the substrate rear face 181B, a first electroconductive type (p+ type) semiconductor region 190 having high concentration, a second electroconductive type (n+ type) semiconductor region 189 having high concentration, and a second electroconductive type (n type) semiconductor region 188.

The n type semiconductor region 187 of the PD 1, and the n type semiconductor region 188 of the PD 2 are connected at the center of the semiconductor substrate 181. Accordingly, the PD 1 and PD 2 are integrally formed.

The p+ type semiconductor regions 185 and 190 are impurity regions for suppressing occurrence of dark current at the PD1 or PD 2. The n+ type semiconductor regions 186 and 189 are charge accumulating regions, and the n type semiconductor regions 187 and 188 are photoelectric conversion regions.

Also, the solid-state imaging device 180 illustrated in FIG. 39 includes a first transfer transistor (Tr) for reading out electric charges of the PD 1, and a second transfer transistor (Tr) for reading out electric charges of the PD 2.

The first transfer Tr is a planar Tr made up of a first transfer gate electrode 183 formed via an insulating layer 195, and a first floating diffusion (FD) 191 for accumulating transferred signal charges.

The first FD 191 is made up of a second electroconductive type (n+ type) semiconductor region having high concentration, and is formed on the surface of the semiconductor substrate 181 in a position facing the PD 1 via the first transfer gate electrode 183.

The second transfer Tr is a vertical-type Tr made up of a second transfer gate electrode 184 formed via the insulating layer 195, and a second floating diffusion (FD) 192 for accumulating transferred signal charges.

The second transfer gate electrode 184 is configured of a planar gate electrode 184A formed on the semiconductor substrate 181, and a vertical-type gate electrode 184B formed in a columnar shape in the depth direction from the surface of the semiconductor substrate 181 below the planar gate electrode 184A.

The second FD 192 is made up of a second electroconductive type (n+ type) semiconductor region having high concentration, and is formed on the surface of the semiconductor substrate 181 in a position facing the PD 2 via the second transfer gate electrode 184.

Also, the first FD 191 and second FD 192 are formed in mutually facing positions via the PD 1 and PD 2, respectively.

The PD 2 is formed generally on the entire surface between the second pixel separation portion 194 and vertical-type gate electrode 184B.

The PD 1 is formed in a region between the first transfer gate electrode 183 and the planar gate electrode 184A of the second transfer gate electrode 184 at the center of the PD 2.

Also, with the n+ type semiconductor region 186 and n type semiconductor region 187, the first transfer gate electrode 183 side is formed along the edge portion of the p+ type semiconductor region 185. Also, the second transfer gate electrode 184 side is formed with an interval enough for preventing electric charges from being transferred from the PD 1 to the PD 2 at the time of applying voltage for readout to the second transfer gate electrode 184.

Also, a first pixel separation portion 193 and second pixel separation portion 194 for sectioning the increment pixels are formed with a first electroconductive type (p type) semiconductor region. The first and second pixel separation portions 193 and 194 are formed between adjacent pixels. The first pixel separation portion 193 is formed on the front face 181A side of the semiconductor substrate 181, and the second pixel separation portion 194 is formed on the rear face 181B of the semiconductor substrate 181. The first and second pixel separation portions 193 and 194 are connected at the center of the semiconductor substrate 181 and are integrated. Also, the first FD 191 is formed in proximity to the first pixel separation portion 193 on the first transfer gate electrode 183 side. The second FD 192 is formed in proximity to the first pixel separation portion 193 on the second transfer gate electrode 184 side.

With the solid-state imaging device 180 thus configured, signal charges accumulated in the PD 1 are transferred to the first FD 191 by voltage being applied to the first transfer gate electrode 183. Also, signal charges accumulated in the PD 2 are transferred to the second FD 192 by voltage being applied to the second transfer gate electrode 184.

In this way, the solid-state imaging device 180 is configured wherein the PD 1 and PD 2 are read out by separate transistors, respectively.

With the solid-state imaging device 180, the impurity concentration of the PD 2 is formed in the same way as with the PD 1. Therefore, the potential of the n+ type semiconductor region 189 of the PD 2 is formed high in the same way as with the n+ type semiconductor region 186 of the PD 1. As a result thereof, with the PD 1 and PD 2, a sufficient potential region up to a deep region is formed.

With the above-mentioned configuration of the solid-state imaging device 180, the potential (voltage) immediately below the transfer gate electrode 183 is changed by positive voltage being applied to the first transfer gate electrode 183 at the time of readout. The signal charges accumulated in the PD 1 are passed through below the first transfer gate electrode 183 and transferred to the first FD 191.

Similarly, the potential (voltage) immediately below the transfer gate electrode 184 is changed by positive voltage being applied to the second transfer gate electrode 184. The signal charges accumulated in the PD 2 are passed through peripheral regions of the vertical-type gate electrode 184B of the second transfer gate electrode 184 and transferred to the second FD 192.

Even with a configuration wherein the impurity concentration of the PD 2 on the rear face side is high, and charge transfer depending on a potential slope according to the related art is not be performed, according to the vertical-type Tr, electric charges accumulated in the n+ type semiconductor region 189 and n type semiconductor region 188 of the PD 2 are transferred to the second FD 192. In this way, according to the configuration of the solid-state imaging device 180, the electric charges of the PD 2 formed with the same impurity concentration as with the PD 1 can be read out.

Also, in order to read out the electric charges of the PD 1, the planar Tr is formed in the semiconductor substrate 181, and in order to read out the electric charges of the PD2, the vertical-type Tr is formed in the semiconductor substrate 181. Therefore, the PD 1 and PD 2 can be read out separately.

For example, an arrangement may be made wherein light on the long-wavelength side is detected at the PD 1, and light on the short-wavelength side is detected at the PD 2. Also, a photoelectric conversion film is provided onto the rear face 181B of the semiconductor substrate 181, whereby light with intermediate wavelength of the PD 1 and PD 2 can also be detected.

Accordingly, a color filter can be removed from the configuration of the solid-state imaging device, and accordingly, light use efficiency can be improved.

11. Solid-State Imaging Device Manufacturing Method According to Fifth Embodiment Next, an example of a solid-state imaging device manufacturing method according to the fifth embodiment will be described. Note that, with description of the following manufacturing method, the same configurations as with the configurations of the solid-state imaging device 180 according to the fifth embodiment illustrated in the above FIG. 39 are denoted with the same reference numerals, and the details of the configurations will be omitted. Also, description will be omitted regarding the manufacturing method for the semiconductor substrate, wiring layers, other various types of transistors, and various elements formed on the solid-state imaging device. These can be manufactured by a method according to the related art.

Figure 40A:
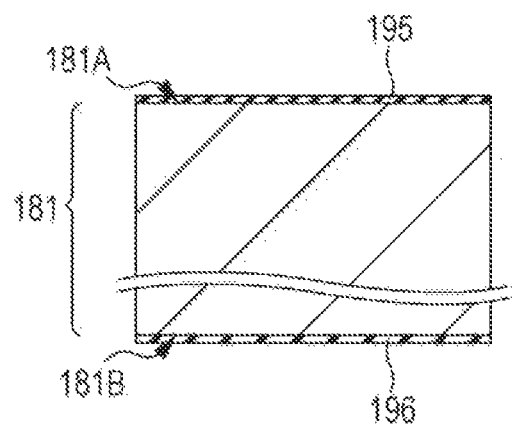
FIGS. 40A through 40C are manufacturing process diagrams of the solid-state imaging device according to the fifth embodiment.

First, as illustrated in FIG. 40A, the semiconductor substrate 181 is prepared. As for the semiconductor substrate 181, a Si substrate is employed, for example. Insulating layers 195 and 196 for surface protection made up of a thermally-oxidized film or the like are formed on the front face 181A and rear face 181B of the semiconductor substrate 181.

Figure 40B:
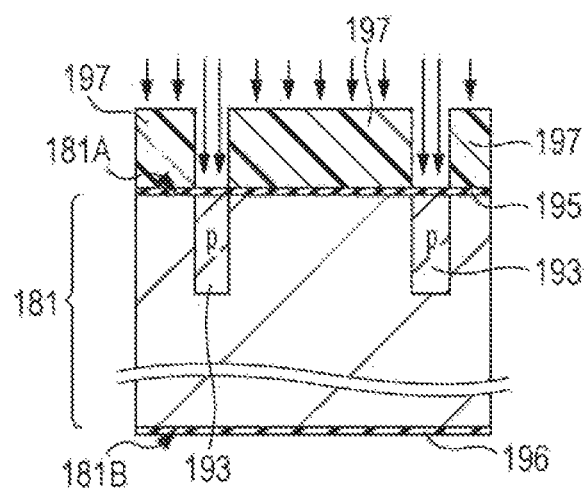

Next, as illustrated in FIG. 40B, a resist layer 197 is formed on the front face 181A of the semiconductor substrate 181. The resist layer 197 is formed with a pattern for opening a position where a pixel separation region for sectioning between pixels of the solid-state imaging device is formed, using the photolithographic technique.

Next, a p type impurity is ion-injected into the semiconductor substrate 181 from the opening of the resist layer 197. According to this ion injection, the first pixel separation portion 193 is formed on the front face 181A side of the semiconductor substrate 181. Depth where the first pixel separation portion 193 is formed is taken as a half or so of the thickness of the semiconductor substrate 181 at the time of finally forming the solid-state imaging device 180.

Figure 40C:
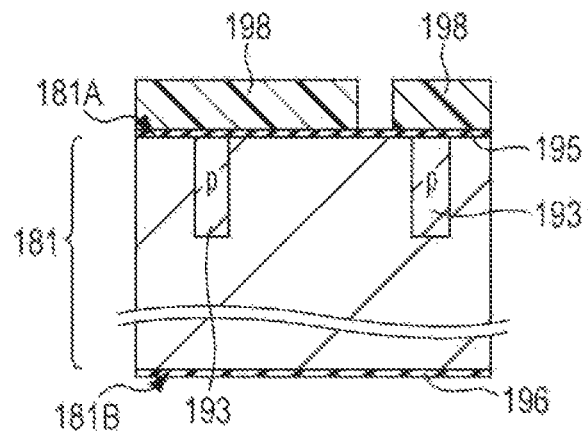

Next, as illustrated in FIG. 40C, a resist layer 198 is formed on the face 181A of the semiconductor substrate 181. The resist layer 198 is formed with a pattern for opening a position where the vertical-type gate electrode 184B of the second transfer gate electrode 184 of the solid-state imaging device is formed, using the photolithographic technique.

Figure 41D:
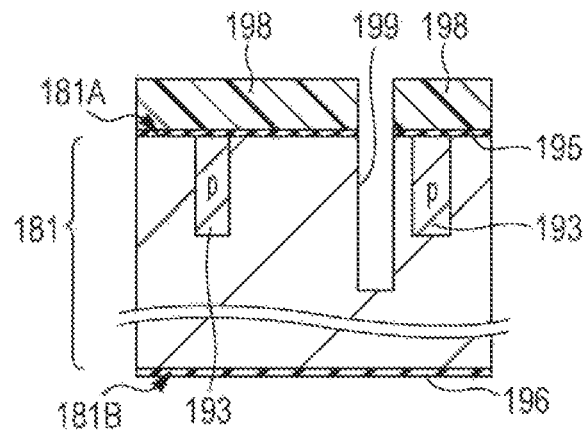
FIGS. 41D through 41F are manufacturing process diagrams of the solid-state imaging device according to the fifth embodiment.
Figure 41E:
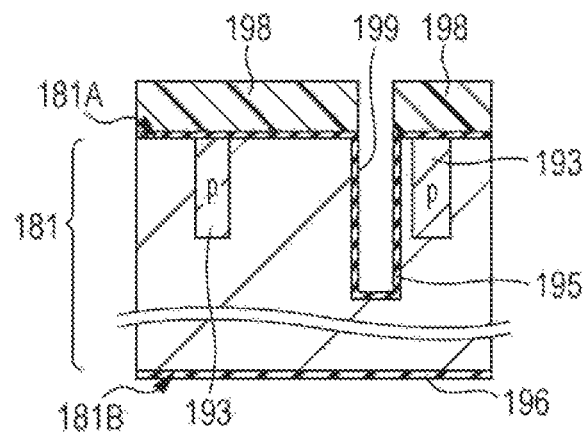

Next, as illustrated in FIG. 41D, the semiconductor substrate 181 and insulating layer 195 are subjected to etching from the opening of the resist layer 198 using anisotropic etching. A trench 199 is formed on the semiconductor substrate 181. Further, as illustrated in FIG. 41E, an insulating layer 195 made up of a thermally-oxidized film or the like is formed on the semiconductor substrate 181 exposed within the trench 199.

Figure 41F:
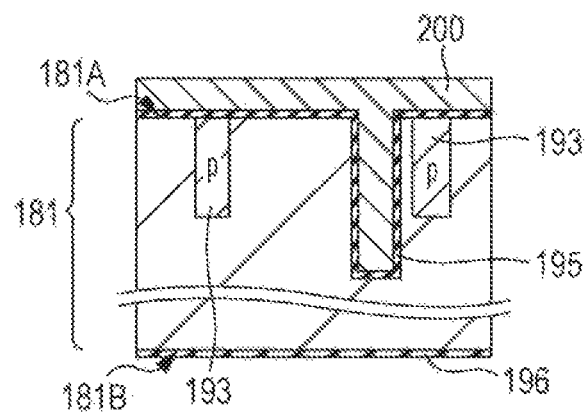

Next, after removing the resist layer 195, as illustrated in FIG. 41F, a gate electrode material layer 200 made up of polysilicon or the like is formed on the semiconductor substrate 181. With this gate electrode material layer 200, after the trench 199 of the semiconductor substrate 181 is embedded and formed, the surface is flattened using the CMP method or the like.

Figure 42G:
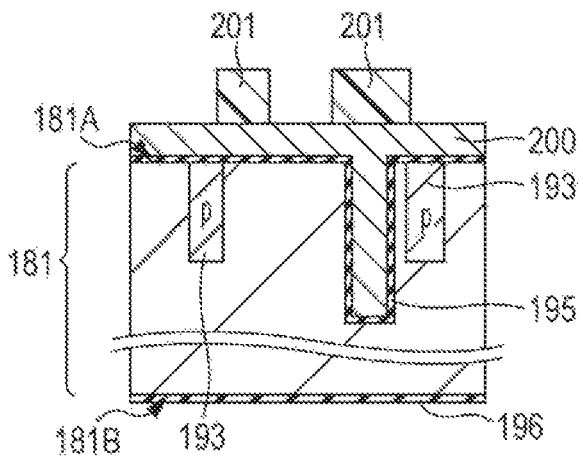
FIGS. 42G through 42I are manufacturing process diagrams of the solid-state imaging device according to the fifth embodiment.

Next, as illustrated in FIG. 42G, a resist layer 201 is formed on the gate electrode material layer 200. The resist layer 201 is formed with a pattern remaining on a position where the first transfer gate electrode 183 and second transfer gate electrode 184 are formed, using the photolithographic technique.

Figure 42H:
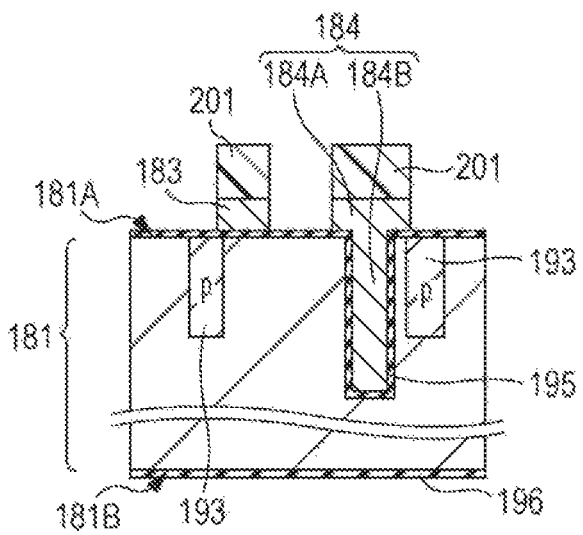

Next, as illustrated in FIG. 42H, the gate electrode material layer 200 is subjected to etching with the resist layer 201 as a mask. Thus, the first transfer gate electrode 183 and second transfer gate electrode 184 are formed. With the second transfer gate electrode 184, a portion formed within the trench 199 of the semiconductor substrate 181 serves as a vertical-type gate electrode 184B, and a portion formed on the surface of the semiconductor substrate 181 serves as a planar gate electrode 184A.

Figure 42I:
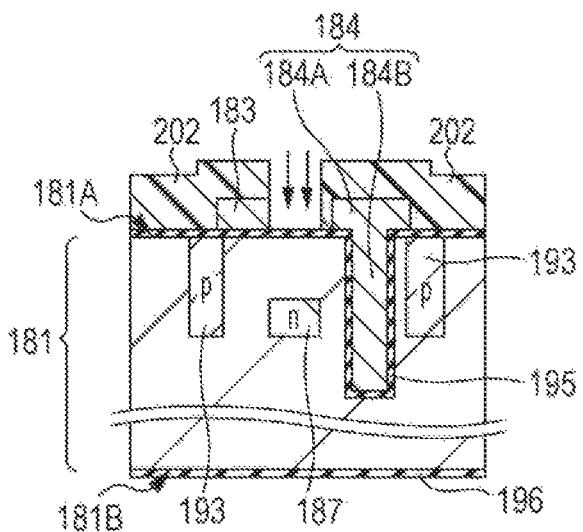

Next, as illustrated in FIG. 42I, a resist layer 202 is formed on the semiconductor substrate 181. The resist layer 202 is formed with a pattern for opening a position where the n+ type semiconductor region 186 and n type semiconductor region 187 of the PD 1 of the solid-state imaging device is formed, using the photolithographic technique.

Next, an n type impurity is ion-injected into a deep position of the semiconductor substrate 181 from the opening of the resist layer 202. Ion injection is performed up to the depth of a half or so of the thickness of the semiconductor substrate 181 at the time of finally forming the solid-state imaging device 180. According to this process, the n type semiconductor region 187 making up the PD 1 is formed in a deep portion of the semiconductor substrate 181.

Figure 43J:
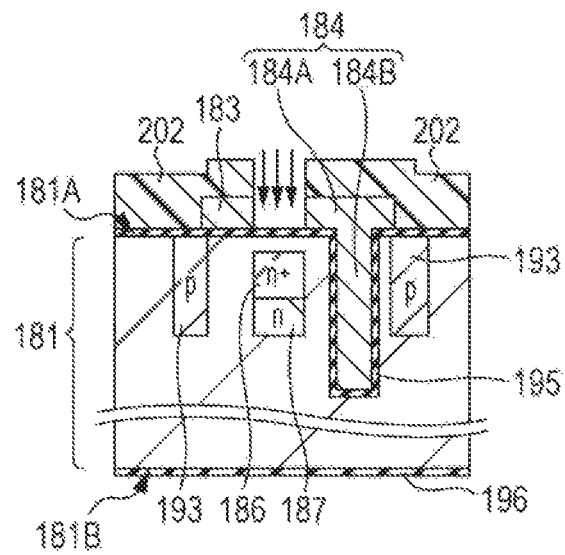
FIGS. 43J through 43L are manufacturing process diagrams of the solid-state imaging device according to the fifth embodiment.

Next, as illustrated in FIG. 43J, an n type impurity is ion-injected into a shallow region on the n type semiconductor region 187 formed in the previous process from the opening of the resist layer 202. According to this ion injection, the n+ type semiconductor region 186 is formed.

Figure 43K:
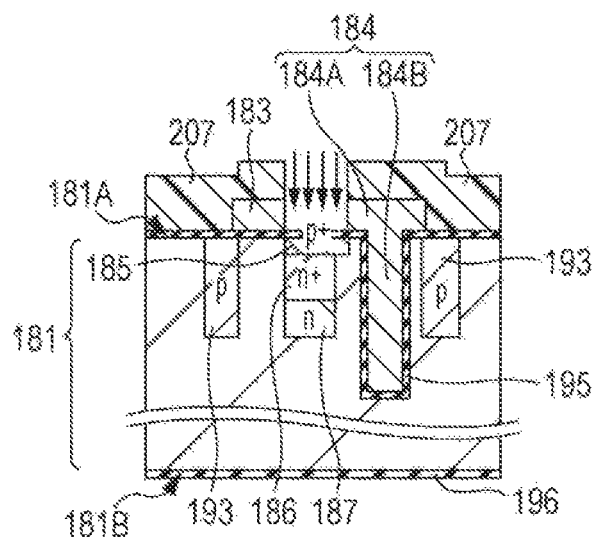

Next, as illustrated in FIG. 43K, a resist layer 207 is formed on the semiconductor substrate 181. The resist layer 207 is formed with a pattern for opening a position where the p+ type semiconductor region 185 of the PD 1 of the solid-state imaging device is formed, using the photolithographic technique. A p type impurity is ion-injected from the opening of the resist layer 207. According to this ion injection, the first electroconductive type (P+ type) semiconductor region 185 is formed on the surface of the semiconductor substrate 181.

According to the above processes, the PD 1 is formed wherein the p+ type semiconductor region 185, n+ type semiconductor region 186, and n type semiconductor region 187 are laminated from the front face 181A side of the semiconductor substrate 181.

Also, with the above-mentioned PD 1 formation process, as for ion injection of the n type impurity, in addition to the pattern of the resist layer 202, self alignment using the first transfer gate electrode 183 is performed. Also, as for ion injection of the p type impurity, self alignment using the first transfer gate electrode 183 and second transfer gate electrode 184 is performed.

Figure 43L:
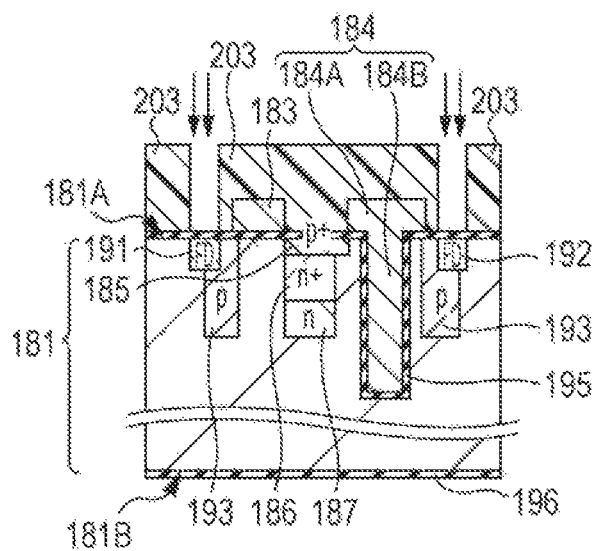

Next, as illustrated in FIG. 43L, a resist layer 203 is formed on the front face 181A of the semiconductor substrate 181. The resist layer 203 is formed in a position where the first FD 191 and second FD 192 of the solid-state imaging device is formed, using the photolithographic technique. Specifically, the resist layer 203 is formed with a pattern for opining the outer sides of the first pixel separation portions 193 and 194 in a position facing the PD 1 via the first transfer gate electrode 183 and second transfer gate electrode 184.

Next, an n type impurity is ion-injected into the semiconductor substrate 181 from the opening of the resist layer 203. According to this ion injection, the first FD 191 and second FD 192 are formed on the front face 181A side of the semiconductor substrate 181.

Figure 44M:
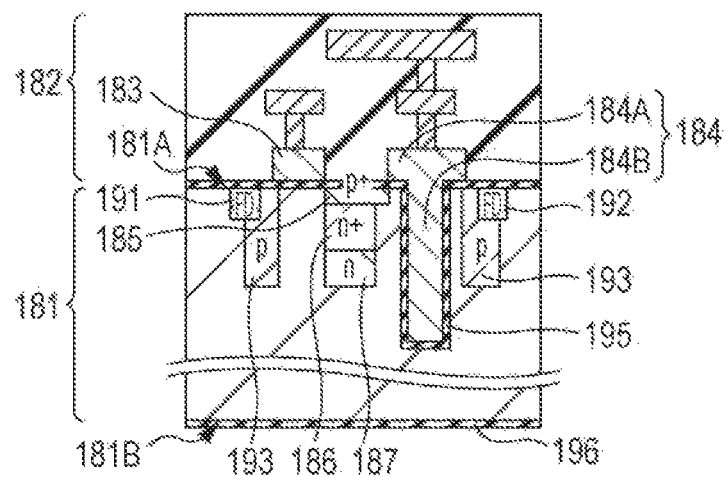
FIGS. 44M through 44O are manufacturing process diagrams of the solid-state imaging device according to the fifth embodiment.

Next, as illustrated in FIG. 44M, a wiring layer 182 is formed on the front face 181A of the semiconductor substrate 181. The wiring layer 182 is formed by laminating an inter-layer insulating layer and an electroconductive layer. Also, the electroconductive layer to be connected to the gate electrode or PD or the like of the solid-state imaging device is formed by passing through the inter-layer insulating layer.

Figure 44N:
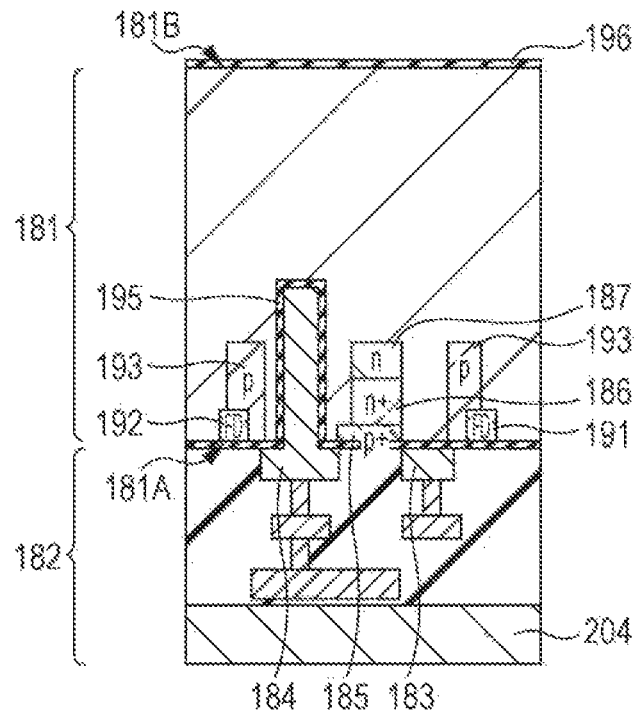
Figure 44O:
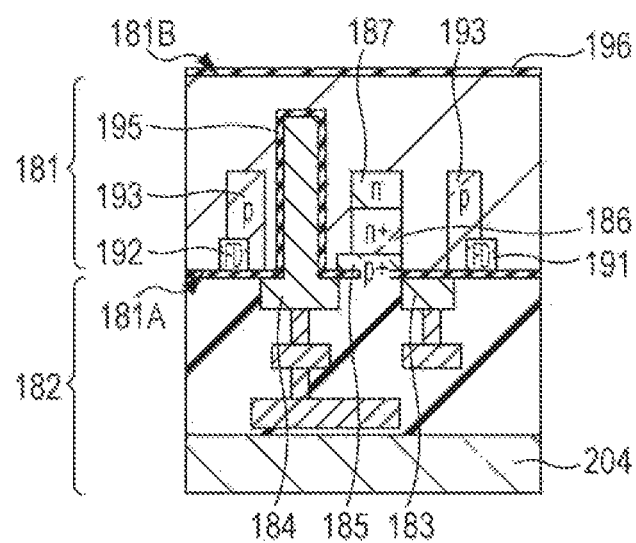

Next, as illustrated in FIG. 44N, a supporting substrate 204 is connected onto the wiring layer 182, and the semiconductor substrate 181 is reversed. Next, as illustrated in FIG. 44O, the rear face 181B side of the semiconductor substrate 181 is removed using the CMP or the like. The semiconductor substrate 181 is formed in predetermined thickness by removing the rear face 181B side of the semiconductor substrate 181. The insulating layer 196 for surface protection made up of a thermally-oxidized film or the like is formed on the rear face 181B of the semiconductor substrate 181 again.

Figure 45P:
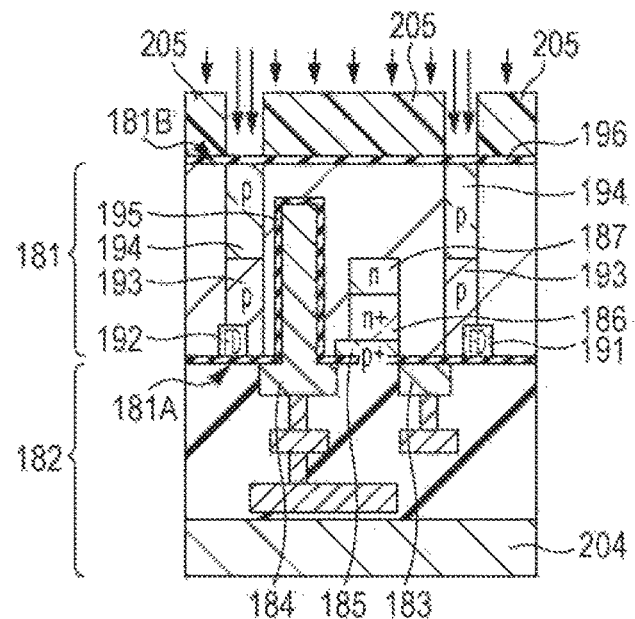
FIGS. 45P through 45R are manufacturing process diagrams of the solid-state imaging device according to the fifth embodiment.

Next, as illustrated in FIG. 45P, a resist layer 205 is formed on the rear face 181B of the semiconductor substrate 181. The resist layer 205 is formed with a pattern for opening a position where a pixel separation region for sectioning between pixels of the solid-state imaging device is formed, using the photolithographic technique.

Next, a p type impurity is ion-injected into the rear face 181B side of the semiconductor substrate 181 from the opening of the resist layer 205. According to this ion injection, the second pixel separation portion 194 is formed on the rear face 181B side of the semiconductor substrate 181. The second pixel separation portion 194 is formed from depth whereby the second pixel separation portion 194 comes into contact with the already formed first pixel separation portion 193, to the rear face 181B.

According to this process, the pixel separation region made up of the first pixel separation portion 193 and second pixel separation portion 194 is formed from the front face 181A to rear face 181B of the semiconductor substrate 181.

Figure 45Q:
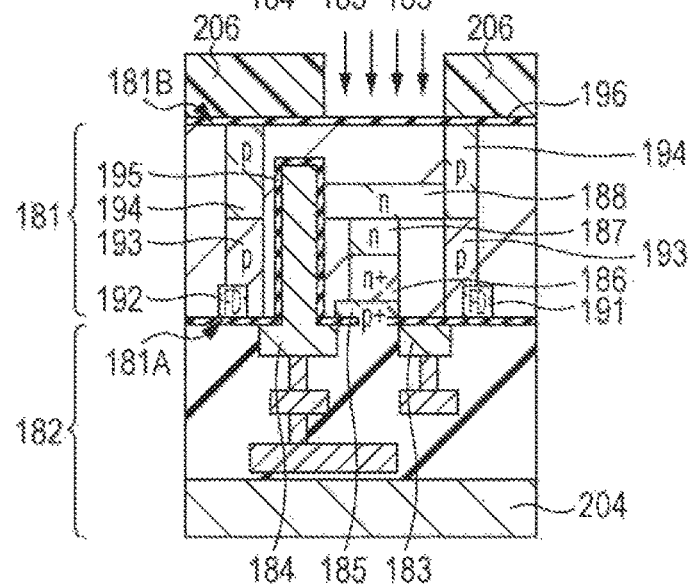

Next, as illustrated in FIG. 45Q, a resist layer 206 is formed on the rear face 181B of the semiconductor substrate 181. The resist layer 206 is formed with a pattern for opening a position where the PD 2 of the solid-state imaging device is formed, using the photolithographic technique.

Next, an n type impurity is ion-injected into a deep position of the semiconductor substrate 181 from the opening of the resist layer 206. Ion injection is performed up to the depth of a half or so of the thickness of the semiconductor substrate 181 at the time of finally forming the solid-state imaging device 180. Next, the n type semiconductor region 188 making up the PD 2 is formed in a position connecting to the n type semiconductor region 187 by diffusing the impurity up to a position connecting to the already formed n type semiconductor region 187 of the PD 1.

Figure 45R:
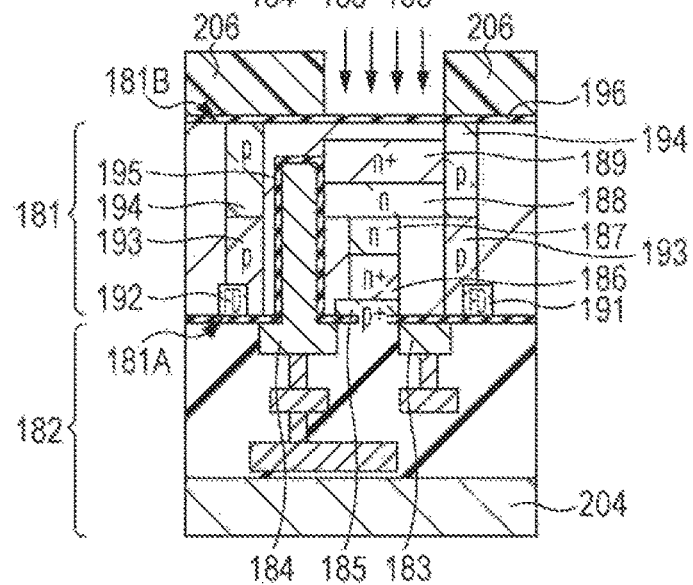

Next, as illustrated in FIG. 45R, an n type impurity is ion-injected into a shallow region on the n type semiconductor region 188 formed in the previous process from the opening of the resist layer 206. According to this ion injection, the n+ type semiconductor region 189 having high concentration is formed.

Figure 46S:
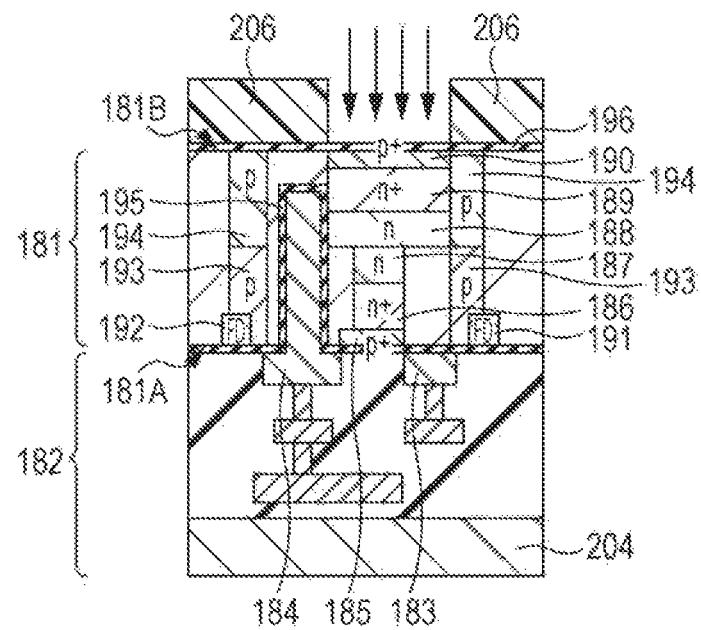
FIGS. 46S and 46T are manufacturing process diagrams of the solid-state imaging device according to the fifth embodiment.

Next, as illustrated in FIG. 46S, a p type impurity is ion-injected from the opening of the resist layer 206. According to this ion injection, the p+ type semiconductor region 190 having high concentration is formed on the rear face 181B of the semiconductor substrate 181.

According to the above processes, there is formed the PD 2 having a configuration wherein the p+ type semiconductor region 190, n+ type semiconductor region 189, and n type semiconductor region 188 are laminated from the rear face 181B side of the semiconductor substrate 181.

Figure 46T:
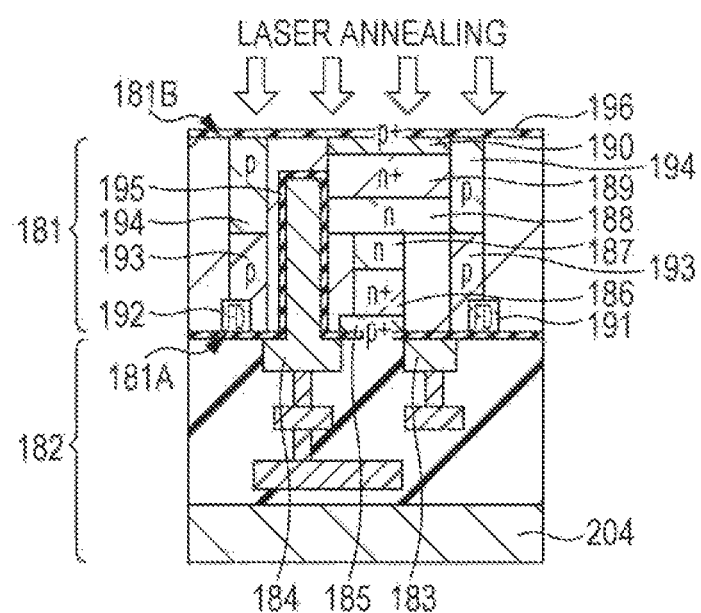

Next, as illustrated in FIG. 46T, the semiconductor substrate 181 where the PD 1 and PD 2 and so forth are formed is subjected to heat treatment according to laser annealing or the like from the rear face 181B side. For example, activation of an impurity formed within the semiconductor substrate 181 is performed by heat treatment of 1000° C.

According to the above processes, the solid-state imaging device according to the present embodiment can be manufactured.

With the above-mentioned solid-state imaging device manufacturing method according to the present embodiment, in the same way as with the first embodiment, the PD 1 and PD 2 are formed from the front face 181A side and rear face 181B side of the semiconductor substrate 181 using ion injection, respectively. Therefore, diffusion of an impurity due to ion injection to a deep portion of the semiconductor substrate can be prevented, and the saturation signal amount can be increased.

Also, according to the above-mentioned manufacturing method according to the present embodiment, with a process for injecting a p type impurity to form pixel separation, ion injection is performed from the front face 181A side and rear face 181B side of the semiconductor substrate 181 to form the first and second pixel separation portions 193 and 194. Thus, diffusion of an impurity to be generated at the time of performing ion injection up to a deep region of the substrate can be suppressed, and accordingly, a solid-state imaging device with color mixture being prevented from easily occurring can be manufactured.

12. Sixth Embodiment

Figure 47A:
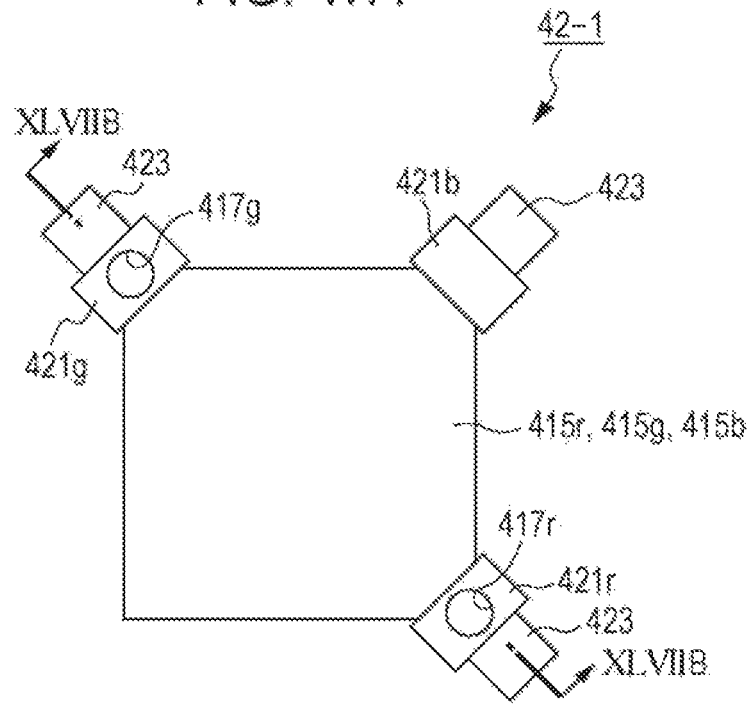
FIGS. 47A and 47B are a plan view and a cross-sectional view illustrating the configuration of a solid-state imaging device according to a sixth embodiment.
Figure 47B:
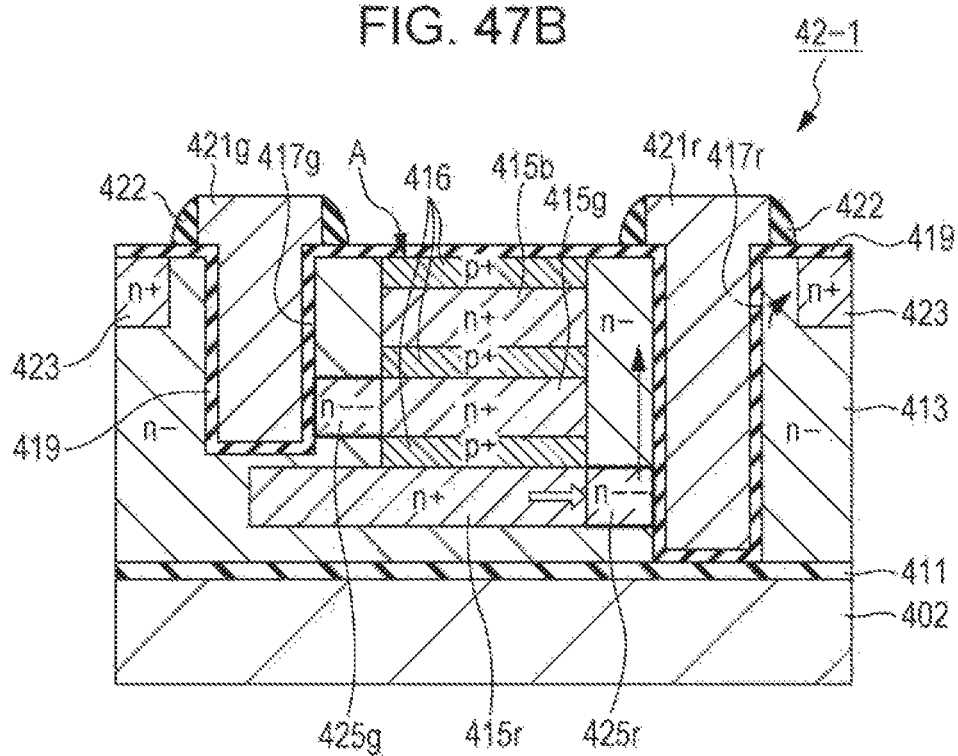

Configuration of Solid-State Imaging Device
Example Wherein a Potential Adjustment Region is Provided FIGS. 47A and 47B are diagrams illustrating the configuration of a solid-state imaging device 41-1 according to a sixth embodiment, and FIG. 47A is a schematic plan view of one pixel worth in a solid-state imaging apparatus, and FIG. 47B is a schematic cross-sectional view equivalent to XLVIIB-XLVIIB cross-section in FIG. 47A. Hereinafter, the configuration of the solid-state imaging device 41-1 according to the sixth embodiment will be described based on these drawings.

The solid-state imaging device 41-1 according to the sixth embodiment illustrated in FIGS. 47A and 47B are disposed in each pixel of the above solid-state imaging apparatus. A semiconductor substrate 413 is disposed in the upper portion of a supporting substrate 42 via an insulating film 411, and multiple photoelectric conversion regions 415r, 415g, and 415b are provided within this semiconductor substrate 413. Also, two trenches 417r and 417g are provided beside the photoelectric conversion regions 415r, 415g, and 415b within this semiconductor substrate 413. Embedding-type readout gates 421r and 421g are provided within these trenches 417r and 417g via a gate insulating film 419. Also, a readout gate 421b (see plan view) is provided in the upper portion of the semiconductor substrate 413 via the gate insulating film 419.

Further, three floating diffusions 423 are disposed in proximity to the readout gates 421r, 421g, and 421b on the surface layer of the semiconductor substrate 413. In particular, in the present sixth embodiment, potential adjustment regions 425r and 425g are provided between the photoelectric conversion regions 415r and 415g, and the gate insulating film 419.

Next, description will be made regarding the detailed configuration of each component disposed in the semiconductor substrate 413, and the inner and upper portions thereof.

Semiconductor Substrate 413

The semiconductor substrate 413 is a semiconductor thin film configured of monocrystalline silicon, for example. Here, the semiconductor substrate 413 is configured of n type monocrystalline silicon in particular, and accordingly, the entire semiconductor substrate 413 is employed as an n well. N type concentration in such a semiconductor substrate 413 is a slightly thin "n−". Now, let us say that the n type concentration indicated here is not n-type-impurity-contained concentration itself but substantial n type concentration. Accordingly, even with a region of which the n-type-impurity-contained concentration is high, in the event that p-type-impurity-contained concentration is high in the region thereof, the substantial n-type concentration becomes low. This will also be true in the following.

Also, with the present sixth embodiment, a face opposite of the supporting substrate 42 at the semiconductor substrate 413 is taken as a light receiving face A as to the photoelectric conversion regions 415r, 415g, and 415b.

Photoelectric Conversion Regions 415r, 415g, and 415b

The photoelectric conversion regions 415r, 415g, and 415b are impurity regions laminated and disposed in the depth direction thereof within the semiconductor substrate 413, and the planar shape of the semiconductor substrate 413 is, for example, a square as viewed from the light receiving face A side. Of these photoelectric conversion regions 415r, 415g, and 415b, the photoelectric conversion region 415r for converting light of a red region is disposed in the deepest position of the semiconductor substrate 413 and the closest position to the supporting substrate 42. Also, the photoelectric conversion region 415g for converting light of a green region is disposed in the upper portion thereof. The photoelectric conversion region 415b for converting light of a blue region is disposed closest to the surface of the semiconductor substrate 413. These are disposed, in order from the supporting substrate 42 side, in a longer wavelength order corresponding to the photoelectric conversion region 415r for red, photoelectric conversion region 415g for green, and photoelectric conversion region 415b for blue.

Also, the photoelectric conversion region 415r disposed in the deepest portion may be extended in the downward of a later-described trench 417g.

The photoelectric conversion regions 415r, 415g, and 415b thus disposed are the same n type impurity regions as with the semiconductor substrate 413, and the n type concentration thereof is deeper (n+) than that of the semiconductor substrate 413. Such photoelectric conversion regions 415r, 415g, and 415b are deeper in potential as compare to the semiconductor substrate 413 in a range where there is no electric field influence.

Also, a p type region 416 is disposed between the photoelectric conversion regions 415r, 415g, and 415b, and above the photoelectric conversion region 415b which is the top layer in a state adjacent to these. Thus, there is configured a photodiode having a pn junction between the n type photoelectric conversion regions 415r, 415g, and 415b, and any p type region 416 adjacent to these. The pn junction portion between the n type photoelectric conversion regions 415r, 415g, and 415b, and the p type region 416 is disposed in the depth corresponding to the wavelength dependence of the optical absorption coefficient of light input from the light receiving face A. However, the p type region 416 of the top layer may be provided as a layer for suppressing the interface state.

The p type concentration in these p type regions 416 is deep [p+]. Note that the p type concentration indicated here is not p-type-impurity-contained concentration itself but substantial p type concentration, which is the same as with the n type concentration.

Trenches 417r and 417g

The trenches 417r and 417g are independently provided beside the photoelectric conversion regions 415r, 415g, and 415b with an interval as to these. For example, these trenches 417r and 417g are disposed in a position sandwiching the photoelectric conversion regions 415r, 415g, and 415b of which the planar shapes are squares from the diagonal direction.

Of these two trenches 417r and 417g, one trench 417r is provided passing through the semiconductor substrate 413, and the other trench 417g is formed in a recessed portion shape having the bottom without passing through the semiconductor substrate 413. The depth of the trench 417g having a recessed portion shape is at least deeper than the photoelectric conversion region 415g for green and shallower than the photoelectric conversion region 415r for red. Thus, the photoelectric conversion region 415r for red provided to the deepest portion of the semiconductor substrate 413 can be extended to the downward of the trench 417g, and signal charge amount to be accumulated in the photoelectric conversion region 415r can be increased.

Gate Insulating Film 419

The gate insulating film 419 is provided covering the inner wall of the trenches 417r and 417g, and above the light receiving face A of the semiconductor substrate 413. This gate insulating film 419 is configured of a silicon oxide film obtained by silicon being subjected to thermal oxidation, silicon oxide nitride film, or high dielectric insulating film, for example. The high dielectric insulating film is configured of hafnium oxide, hafnia silicate, nitrogen addition hafnium aluminate, tantalum oxide, titanium dioxide, zirconium oxide, praseodymium oxide, yttrium oxide, or the like. Such each material film is employed as the gate insulating film 419 in a single layer or laminated layer state as appropriate.

Readout Gates 421r and 421g

The readout gates 421r and 421g are provided as embedding electrodes embedded in the inner portions of the trenches 417r and 417g via the gate insulating film 419, and are subjected to patterning in the upward of the light receiving face A of the semiconductor substrate 413. Such readout gates 421r and 421g are configured of polysilicon (Phosphorus Doped Amorphous Silicon: PDAS) including an impurity such as phosphorus (P) or the like, or a metal material such as aluminum, tungsten, titan, cobalt, hafnium, tantalum, or the like.

Readout Gate 421b

The readout gate 421b is provided to the upward of the light receiving face A of the semiconductor substrate 413 via the gate insulating film 419. This readout gate 421b is disposed with an interval as to the readout gates 421r and 421g serving as embedding electrodes, and are subjected to patterning with a predetermined interval as to the photoelectric conversion region 415b for blue of the top layer. Such a readout gate 421b may be configured of the same material layer as with the read out gates 421r and 421g.

Floating Diffusion 423

The floating diffusion 423 is an impurity region provided to the surface layer on the light receiving face A side of the semiconductor substrate 413, and are provided in a position sandwiching the readout gates 421r, 421g, and 421b as to the photoelectric conversion regions 415r, 415g, and 415b. The floating diffusions 423 thus disposed are the same n type impurity regions as with the semiconductor substrate 413 and photoelectric conversion regions 415r, 415g, and 415b, and the n type concentration thereof is deeper (n+) than that of the semiconductor substrate 413.

Potential Adjustment Regions 425r and 425g

The potential adjustment regions 425r and 425g are provided between the photoelectric conversion regions 415r and 415g disposed in a deep position of the semiconductor substrate 413, and the gate insulating film 419 covering the side walls of the trenches 417r and 417g. Of these, one potential adjustment region 425r is disposed between the photoelectric conversion region 415r for red and the trench 417r in a manner adjacent to these, and is provided to the same deep region as with the photoelectric conversion region 415r. This potential adjustment region 425r is disposed with an interval between the other photoelectric conversion regions 415g and 415b, and the floating diffusion 423. Also, the other potential adjustment region 425g is disposed between the photoelectric conversion region 415g for green and the trench 417g in a manner adjacent to these, and is provided to the same deep region as with the photoelectric conversion region 415g. This potential adjustment region 425g is disposed with an interval between the other photoelectric conversion regions 415r and 415b, and the floating diffusion 423.

The potential adjustment regions 425r and 425g thus disposed are the same n type impurity regions as with the semiconductor substrate 413 and the photoelectric conversion regions 415r, 415g, and 415b, and the n type concentration thereof is further thinner (n−−) than that of the semiconductor substrate 413. Such potential adjustment regions 425r and 425g are shallower in potential as compared to the semiconductor substrate 413 and photoelectric conversion regions 415r, 415g, and 415b in a range where there is no electric field influence.

Driving of Solid-State Imaging Device

FIGS. 48A and 48B are diagrams for describing driving of the solid-state imaging device 41-1 having the above configuration, and illustrate the potential for a light reception period and a readout period at the photoelectric conversion region 415r for red as an example. (1) and (2) in FIG. 48A are potential at a deep position of the photoelectric conversion region 415r. On the other hand, (1) and (2) in FIG. 48B are potential in a channel formation region along the gate insulating film 419. Also, (1) in FIG. 48A and (1) in FIG. 48B correspond to the light reception period (gate voltage is off), and (2) in FIG. 48A and (2) in FIG. 48B correspond to the readout period (gate voltage is on). Hereinafter, along with these drawings, driving of the solid-state imaging device 41-1 according to the sixth embodiment will be described with reference to the previous FIGS. 47A and 47B.

First, with the light reception period, gate voltage to be applied to the readout gate 421r is turned off. Therefore, as illustrated in (1) in FIG. 48A, the potential of the photoelectric conversion region 415r of which the n type concentration is deeper (n+) is kept deeper than the potential of the potential adjustment region 425r of which the concentration is (n−−). Thus, a signal charge e generated by photoelectric conversion is accumulated in the photoelectric conversion region 415r.

On the other hand, as illustrated in (1) in FIG. 48B, with the channel formation region along the gate insulating film 419, the potential of the potential adjustment region 425r of which the n type concentration is significantly thin (n−−) is kept shallower than the potential of the semiconductor substrate 413 of which the n type concentration is slightly thin (n−).

Next, with the readout period, plus gate voltage to be applied to the readout gate 421r is turned on. At this time, the potential adjustment region 425r disposed adjacent to the gate insulating film 419 is intensely affected by the electric field due to gate voltage as compared to the photoelectric conversion region 415r.

Therefore, as illustrated in (2) in FIG. 48A, gate voltage is set so that the potential of the potential adjustment region 425r is deeper than the potential of the photoelectric conversion region 415r. Thus, the signal charge e of the photoelectric conversion region 415r is read out to the potential adjustment region 425r.

On the other hand, as illustrated in (2) in FIG. 48B, the potential adjustment regions 425r and semiconductor substrate 413 disposed along the gate insulating film 419 are affected by the gate voltage to be applied to the readout gate 421r with the same intensity. Therefore, the potential depth relation between the potential adjustment region 425r and semiconductor substrate 413 globally becomes deep in a kept state in the same way as with the light reception period. Accordingly, the signal charge e read out to the potential adjustment region 425r is read out by the semiconductor substrate 413 having further deep potential. At this time, drain voltage is applied to the floating diffusion 423 disposed in proximity to the readout gate 421r so as to obtain deeper potential than that of the semiconductor substrate 413. Thus, the signal charge e of the photoelectric conversion region 415r is read out to the floating diffusion 423.

Driving as described above is similarly applied to driving of the photoelectric conversion region 415g for green. Also, driving of the photoelectric conversion region 415b for blue may be performed in the same way as with the case employing a normal surface channel type readout gate.

Solid-State Imaging Device Manufacturing Method

FIGS. 49A through 50C are cross-section process diagrams for describing manufacturing procedures for the solid-state imaging device 41-1 having the above configuration. Hereinafter, the manufacturing procedures for the solid-state imaging device 41-1 according to the sixth embodiment will be described based on these drawings.

FIG. 49A

Figure 49A:
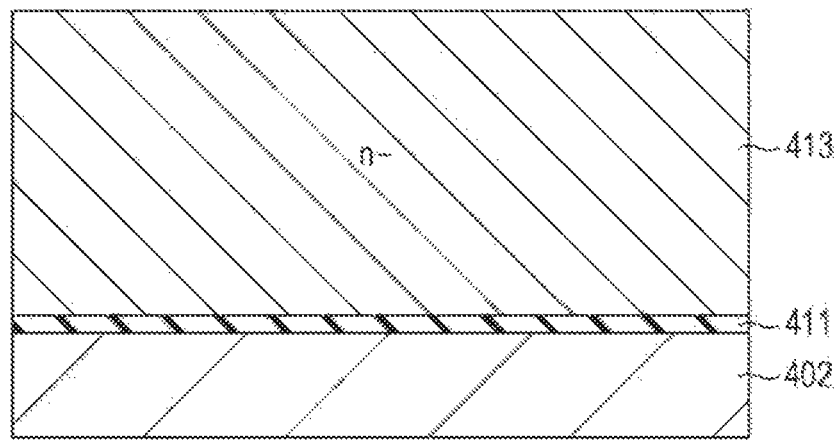
FIGS. 49A through 49C are cross-sectional process views (Part 1) illustrating manufacturing procedures of the solid-state imaging device according to the sixth embodiment.

First, as illustrated in FIG. 49A, a thin film shaped semiconductor substrate 413 provided to the upper portion of the supporting substrate 42 via an insulating film 411 is prepared. Let us say that this semiconductor substrate 413 is configured of n type monocrystalline silicon, and the n type concentration thereof is slightly thin (n−).

FIG. 49B

Figure 49B:
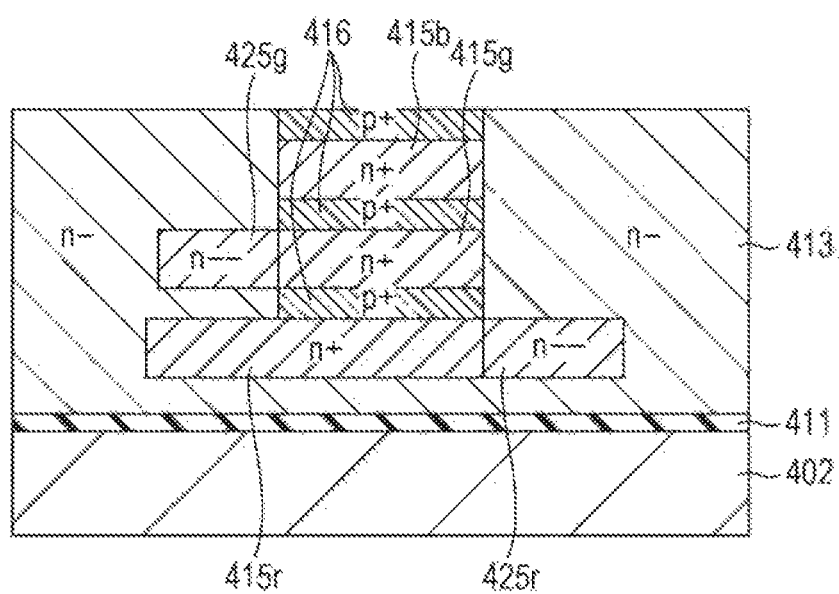

Next, as illustrated in FIG. 49B, each electroconductive type impurity is introduced into the semiconductor substrate 413, thereby forming the photoelectric conversion regions 415r, 415g, and 415b, the p type region 416, and the potential adjustment regions 425r and 425g within the semiconductor substrate 413 of which the n type concentration is slightly thin (n−).

At this time, with formation of the photoelectric conversion regions 415r, 415g, and 415b, an n type impurity is further introduced into the deep regions of the semiconductor substrate 413. Thus, the photoelectric conversion regions 415r, 415g, and 415b of which the n type concentration is deep (n+) are formed.

Also, with formation of the potential adjustment regions 425r and 425g, a p type impurity is introduced into the deep regions of the semiconductor substrate 413. Thus, the potential adjustment regions 425r and 425g of which the n type concentration is substantially thin (n−−) are formed in a state adjacent to the photoelectric conversion regions 415r and 415g.

Further, with formation of the p type regions 416, a p type impurity of which the electroconductive type is inverted and becomes deep [p+] is introduced into the deep regions of the semiconductor substrate 413. Thus, the p type regions 416 are formed.

With introduction of the impurities into the semiconductor substrate 413 such as described above, the area is restricted by a mask, and also introduction is performed by ion injection of the impurities of which the depths are adjusted by injection energy, and activation heat treatment thereafter. Note that ion injection may be performed in a predetermined order, and the activation heat treatment may be performed after all of the ion injections are completed.

FIG. 49C

Figure 49C:
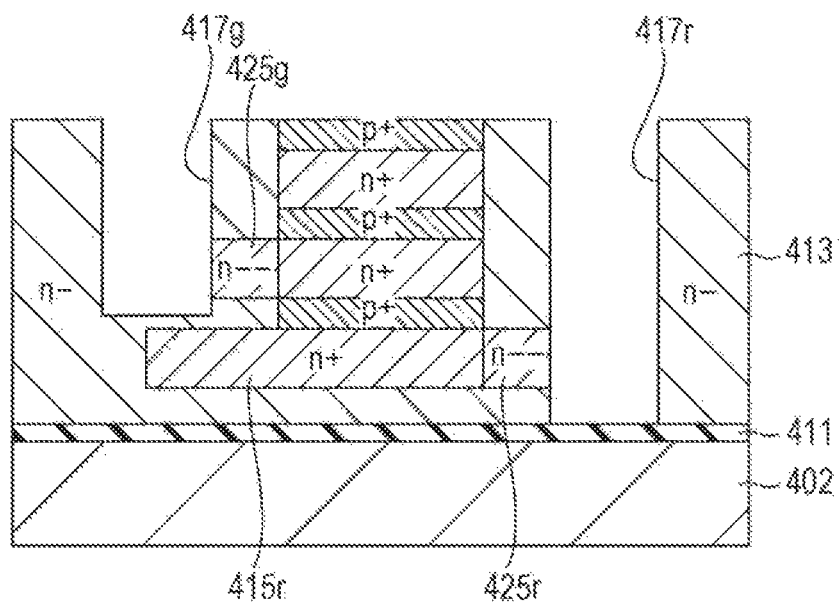

Thereafter, as illustrated in FIG. 49C, trenches 417r and 417g are formed in the semiconductor substrate 413. At this time, according to etching employing a resist pattern omitted in the drawing as a mask, the trench 417r adjacent to the potential adjustment region 425r is formed in a state passing through the semiconductor substrate 413. Also, according to etching employing another resist pattern as a mask, the trench 417g adjacent to the potential adjustment region 425g and also having depth not reaching the photoelectric conversion region 415r is formed in the semiconductor substrate 413.

FIG. 50A

Figure 50A:
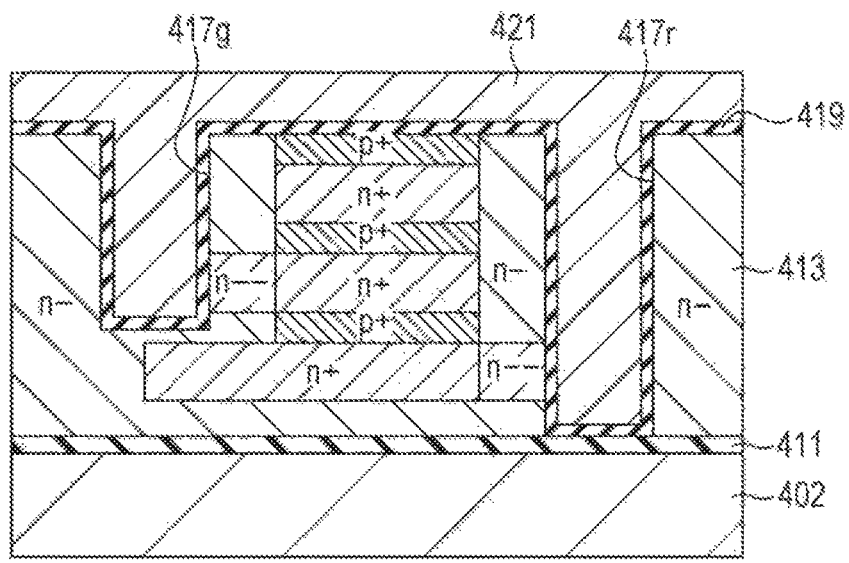
FIGS. 50A through 50C are cross-sectional process views (Part 2) illustrating manufacturing procedures of the solid-state imaging device according to the sixth embodiment.

Next, as illustrated in FIG. 50A, the gate insulating film 419 is formed in a state covering the inner walls of the trenches 417r and 417g and above the semiconductor substrate 413. Film formation of the gate insulating film 419 is performed by a method selected as appropriate with a material making up the gate insulating film 419. For example, a silicon oxide film or silicon oxide nitride film is formed by thermal oxidation or thermal nitriding of the semiconductor substrate 413, and a hafnium oxide film or the like is formed by an atomic-layer-vapor-deposition method.

Thereafter, in a state in which the trenches 417r and 417g are embedded, an electroconductive material film 421 is formed on the gate insulating film 419. Film formation of the electroconductive material film 421 is performed by a method selected as appropriate with a material making up the electroconductive material film 421. For example, in the case of a polysilicon film including an impurity such as phosphorous (P) or the like, film formation is performed by a scientific vapor phase growth method, and in the case of a metal material film such as aluminum, tungsten, titan, cobalt, hafnium, tantalum, or the like, film formation is performed by a spattering method.

FIG. 50B

Figure 50B:
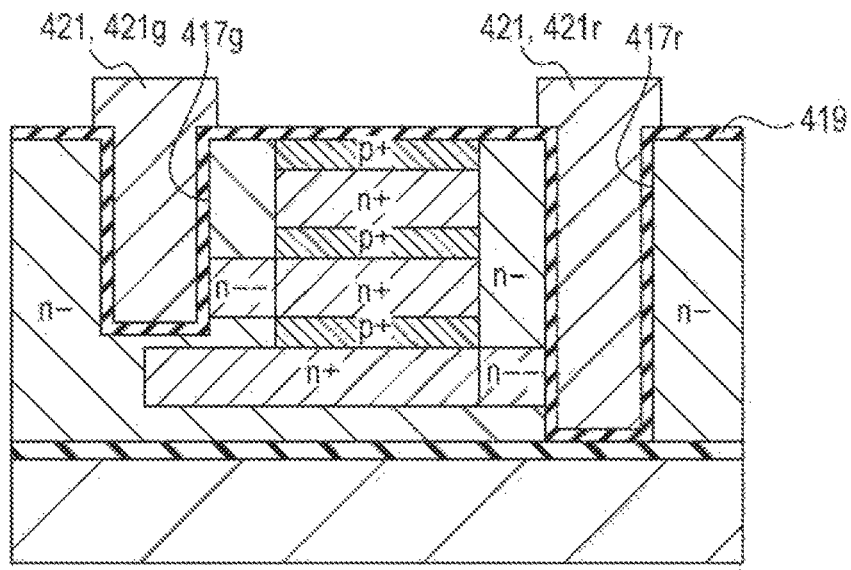

Next, as illustrated in FIG. 50B, the electroconductive material film 421 is subjected to pattern matching. Thus, the readout gate 421r embedded in the trench 417r, the readout gate 421g embedded in the trench 417g, and the readout gate (421b) on the light receiving face A of the semiconductor substrate 413 of which the drawing is omitted here are formed. At this time, it is desirable to subject the electroconductive material film 421 to etching using a resist pattern of which the drawing is omitted as a mask. Thereafter, in order to terminate an interface state between the gate insulating film 419 and the semiconductor substrate 413 as appropriate, the gate insulating film 419 and the semiconductor substrate 413 are subjected to annealing processing within chlorine atmosphere.

FIG. 50C

Figure 50C:
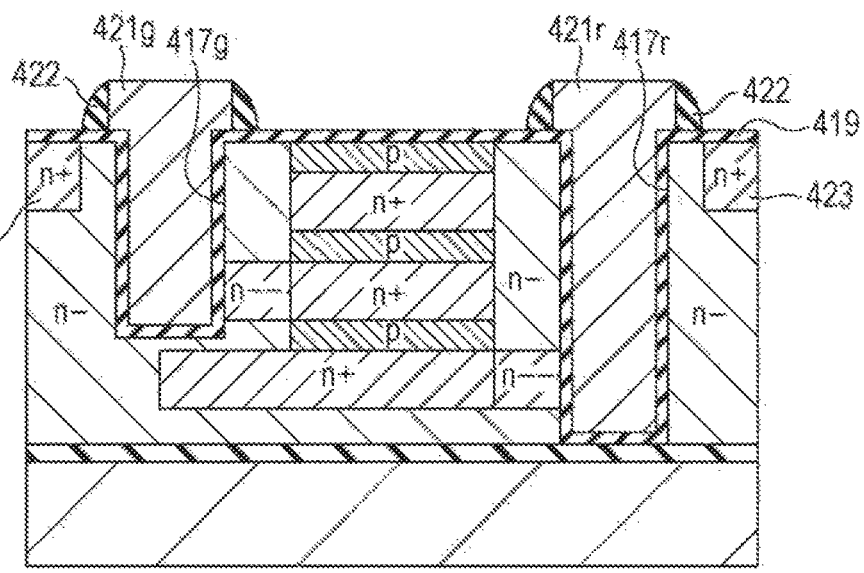

Thereafter, as illustrated in FIG. 50C, an insulating side wall 422 is formed on the side walls of the readout gates 421r, 421g, (and 421b). This side wall 422 is formed by film formation of an insulating film such as a silicon oxide film, silicon nitride film or the like, and etch back of the insulating film thereafter. Thereafter, a floating diffusion 423 is formed in a position sandwiching the readout gates 421r, 421g, (and 421b) as to the photoelectric conversion regions 415r, 415g, and 415b in the surface layer on the light receiving face A side of the semiconductor substrate 413. At this time, an impurity is introduced into the surface layer of the semiconductor substrate 413 with the resist pattern and side wall 422 which are omitted in the drawing as a mask, thereby forming the floating diffusion 423 of which the n type concentration is deep (n+) is formed beside the side wall 422 by self-alignment.

In this way, the solid-state imaging device 41-1 previously described with reference to FIGS. 47A and 47B is obtained.

Advantage of Sixth Embodiment

The solid-state imaging device 41-1 according to the sixth embodiment described above has a configuration wherein the potential adjustment regions 425r and 425g of which the n type concentration is thinner (n−−) than those of the photoelectric conversion regions 415r and 415g and semiconductor substrate 413 are provided between the photoelectric conversion regions 415r and 415g, and the gate insulating film 419. Thus, the potential of the channel formation region along the gate insulating film 419 can be set deeper at the semiconductor substrate 413 as compared to the potential adjustment regions 425r and 425g, the signal charges (electrons) of the potential adjustment regions 425r and 425g can be read out to the semiconductor substrate 413 without obstacles. As a result thereof, with the solid-state imaging device 41-1 where the photoelectric conversion regions 415r and 415g are provided to a deep position of the semiconductor substrate 413, all of the signal charges of the photoelectric conversion regions 415r and 415g can be read out, and accordingly, improvement in imaging properties can be realized by preventing afterimage.

Figure 51:
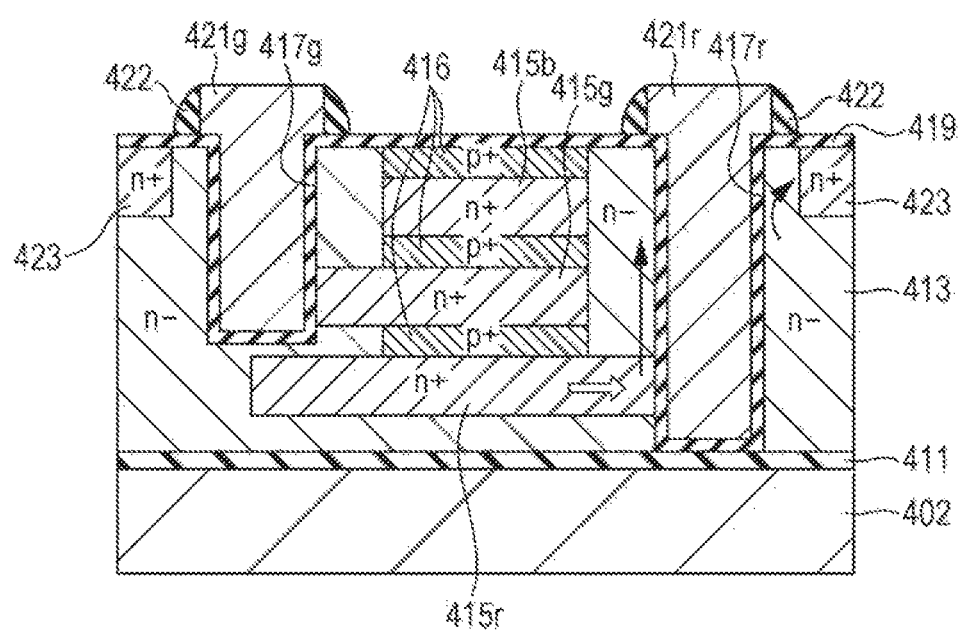
FIG. 51 is a cross-sectional view illustrating the configuration of a solid-state imaging device serving as a comparative example of the sixth embodiment.
Figure 52A:
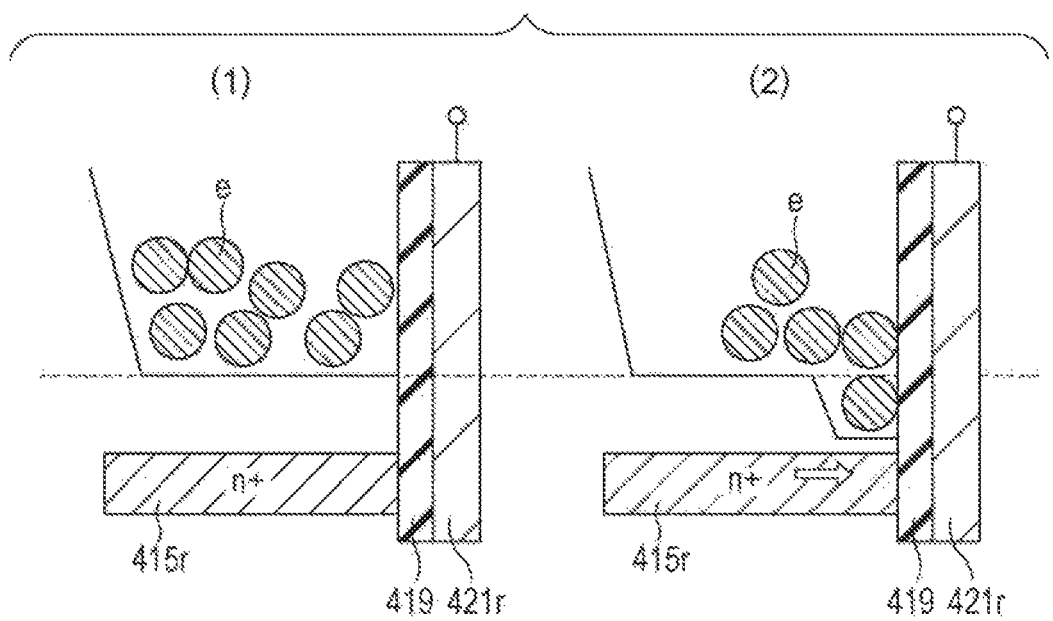
FIGS. 52A and 52B are diagrams for describing driving of the solid-state imaging device serving as a comparative example of the sixth embodiment.
Figure 52B:
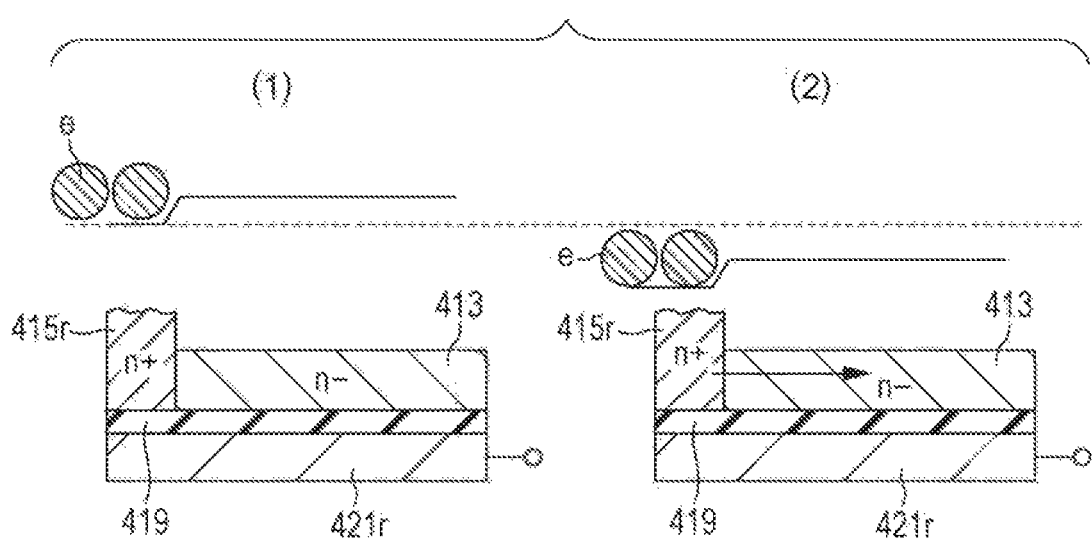

Here, as a comparative example FIG. 51 illustrates the cross-sectional view of a solid-state imaging device having a configuration including no potential adjustment region. Also, FIGS. 52A and 52B illustrate diagrams for describing driving of the solid-state imaging device illustrated in FIG. 51. With the solid-state imaging device to which no potential adjustment region is provided, with the light reception period, as illustrated in (1) in FIG. 52A and (1) in FIG. 52B, the potential of the photoelectric conversion region 415r of which the n type concentration is deep (n+) is kept deeper than the potential of the semiconductor substrate 413 of which the concentration is (n−). Thus, the signal charge e generated by photoelectric conversion is accumulated in the photoelectric conversion region 415r.

Also, with the readout period, gate voltage to be applied to the readout gate 421r is turned on, and accordingly, as illustrated in (2) in FIG. 52A, potential on the gate insulating film 419 side in the photoelectric conversion region 415r is deepened. Thus, the signal charge e of the photoelectric conversion region 415r is read out to the gate insulating film 419 side. However, as illustrated in (2) in FIG. 52B, with the channel formation region along the gate insulating film 419, the potential depth relation between the photoelectric conversion region 415r and the semiconductor substrate 413 is entirely deepened in a state kept in the same way as with the light reception period. Therefore, with the photoelectric conversion region 415r, the potential is still deeper than that of the semiconductor substrate 413, and the signal charge e is remained in the photoelectric conversion region 415r.

13. Seventh Embodiment

Configuration of Solid-State Imaging Device

Example wherein a pinning region overlapped with a potential adjustment region is provided.

Figure 53A:
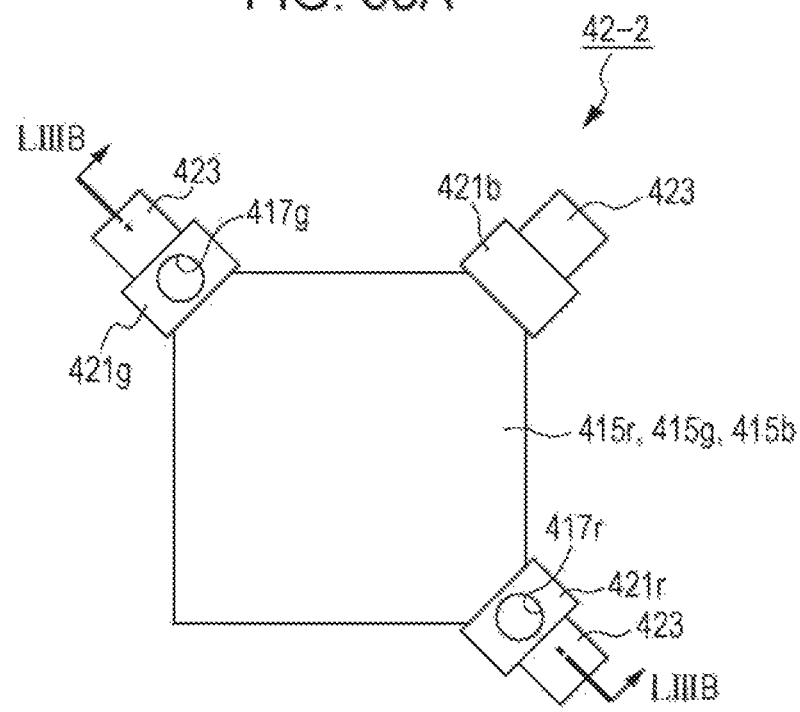
FIGS. 53A and 53B are a plan view and a cross-sectional view illustrating the configuration of a solid-state imaging device according to a seventh embodiment.
Figure 53B:
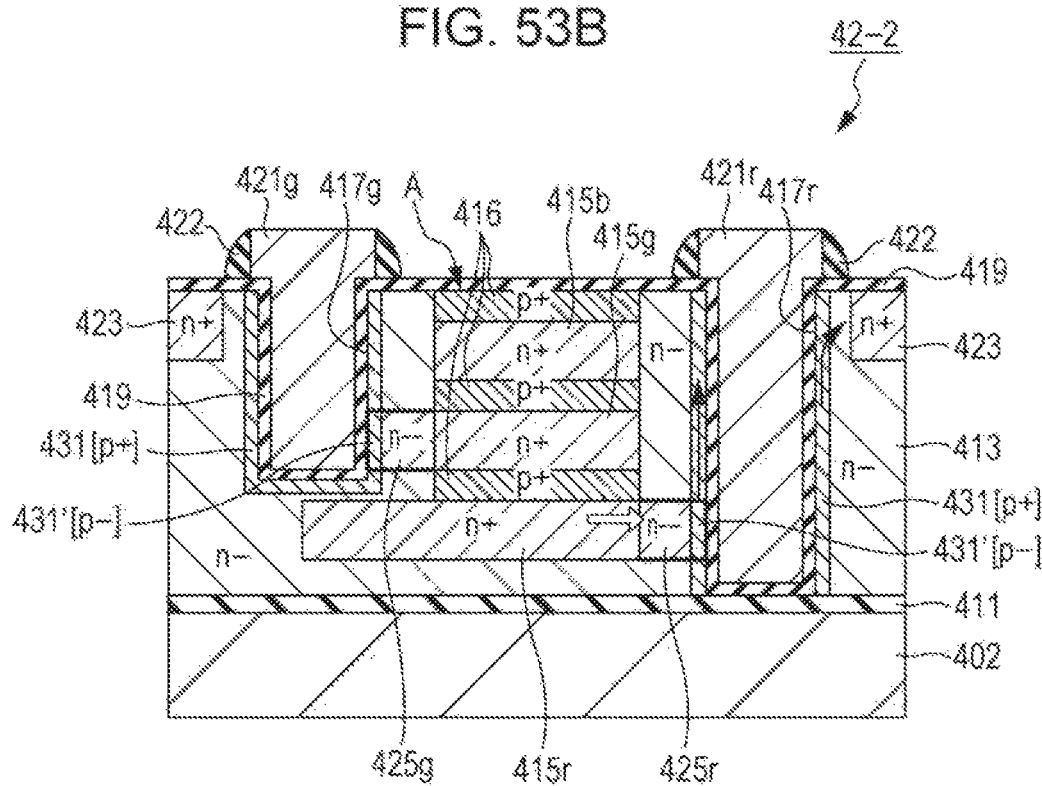

FIGS. 53A and 53B are diagrams illustrating the configuration of a solid-state imaging device 41-2 according to a seventh embodiment. FIG. 53A is a schematic plan view of one pixel worth in the solid-state imaging apparatus, and FIG. 53B is a schematic cross-sectional view equivalent to LIIIB-LIIIB cross-section in FIG. 53A. The solid-state imaging device 41-2 according to the seventh embodiment illustrated in these drawings differs from the sixth embodiment in that a pinning region 431 is provided to the inner wall layers of the trenches 417r and 417g, and other configurations are the same as with the sixth embodiment.

Specifically, the pinning regions 431 are impurity regions provided along the inner wall of the trenches 417r and 417g within the semiconductor substrate 413, and are provided as layers for suppressing an interface state. Such pinning regions 431 are configured as a p type impurity region which is an inverse electroconductive type of the semiconductor substrate 413. The p type concentration in the pinning regions 431 is deep [p+].

The pinning regions 431 as described above serve as overlapped regions 431' partially overlapped with the potential adjustment regions 425r and 425g at the same height as the potential adjustment regions 425r and 425g. Such overlapped regions 431' include an impurity making up the potential adjustment regions 425r and 425g of which the n type concentration is (n−−), and an impurity making up the pinning regions 431 of which the p type concentration is [p+]. Accordingly, the p type concentration in the overlapped regions 431' is slightly thin [p−], and is thinner than the p type concentration of the pinning regions 431.

Here, with the potential adjustment regions 425r and 425g, only a portion of the gate insulating film 419 side may be overlapped with the pinning regions 431 as illustrated, or the entirety thereof may be disposed in a manner overlapped with the pinning regions 431.

Driving of Solid-State Imaging Device

Figure 54A:
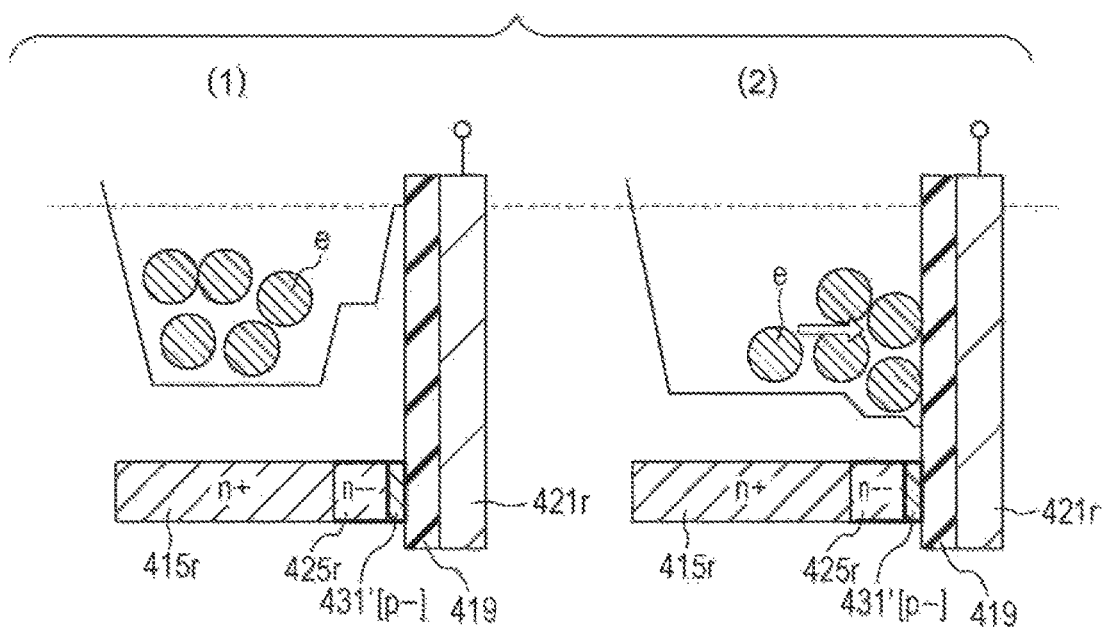
FIGS. 54A and 54B are diagrams for describing driving of the solid-state imaging device according to the seventh embodiment.
Figure 54B:
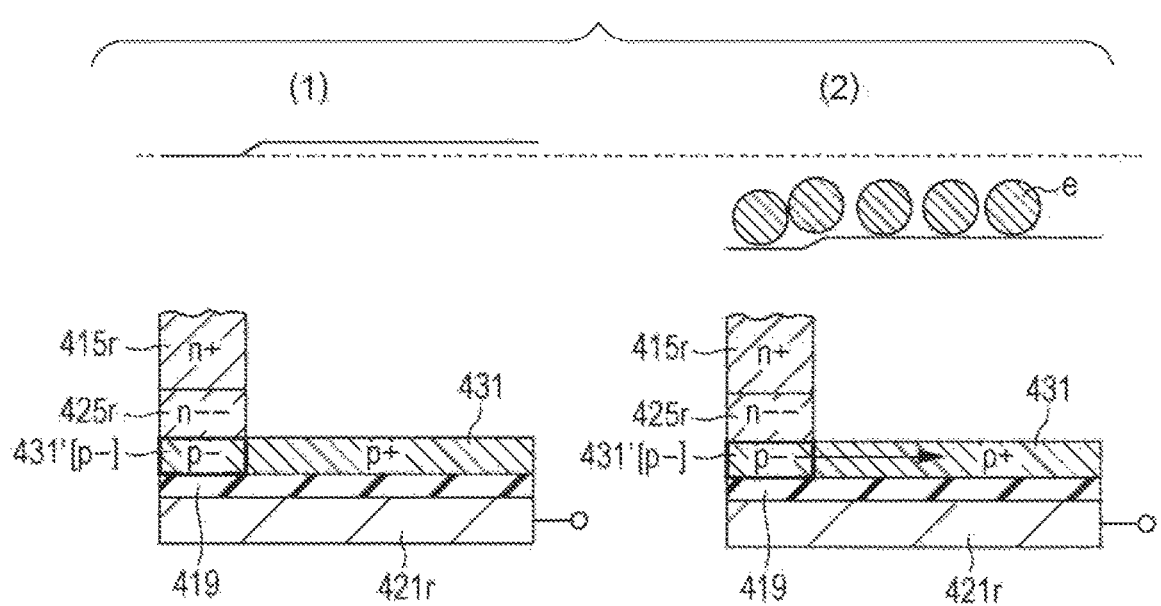

FIGS. 54A and 54B are diagrams for describing driving of the solid-state imaging device 41-2 having the above configuration, and illustrate the potential for a light reception period and a readout period at the photoelectric conversion region 415r for red as an example. (1) and (2) in FIG. 54A are potential at a deep position of the photoelectric conversion region 415r. On the other hand, (1) and (2) in FIG. 54B are potential in a channel formation region along the gate insulating film 419. Also, (1) in FIG. 54A and (1) in FIG. 54B correspond to the light reception period (gate voltage is off), and (2) in FIG. 54A and (2) in 54B correspond to the readout period (gate voltage is on). Hereinafter, along with these drawings, driving of the solid-state imaging device 41-2 according to the seventh embodiment will be described with reference to the previous FIGS. 53A and 53B.

First, with the light reception period, gate voltage to be applied to the readout gate 421r is turned off. Therefore, as illustrated in (1) in FIG. 54A, the potential in the depth position of the photoelectric conversion region 415r becomes shallower in the sequence of the photoelectric conversion region 415r of which the n type concentration is deep (n+), the potential adjustment region 425r of which the n type concentration is (n−−), and the overlapped region 431' of which the p type concentration is slightly thinner [p−]. Thus, a signal charge e generated by photoelectric conversion is accumulated in the photoelectric conversion region 415r.

On the other hand, as illustrated in (1) in FIG. 54B, the potential in the channel formation region along the gate insulating film 419 becomes shallower in the sequence of the overlapped region 431' of which the p type concentration is slightly thinner [p−], and the pinning region 431 of which the p type concentration is deep [p+]. This step follows difference in the p type concentration. Here, the overlapped region 431' is a region where the pinning region 431 of which the p type concentration is deep [p+], and the potential adjustment region 425r of which the n type concentration is significantly thinner (n−−) are overlapped. Therefore, the p type concentration of the overlapped region 431' is small in difference with the p type concentration of the pinning region 431, and the step thereof is not so great.

Next, with the readout period, plus gate voltage to be applied to the readout gate 421r is turned on. At this time, the potential adjustment region 425r and overlapped region 431' disposed on the readout gate 421r side are intensely affected by electric field due to the gate voltage as compared to the photoelectric conversion region 415r.

Therefore, as illustrated in (2) in FIG. 54A, the gate voltage is set so that the potentials of the potential adjustment region 425r and overlapped region 431' become deeper than that of the photoelectric conversion region 415r. Thus, the signal charge e of the photoelectric conversion region 415r is read out to the potential adjustment region 425r and overlapped region 431'.

On the other hand, as illustrated in (2) in FIG. 54B, the overlapped region 431' disposed along the gate insulating film 419, and the pinning region 431 are affected by the gate voltage to be applied to the readout gate 421r with the same intensity. Therefore, the potential depth relation between the overlapped region 431' and the pinning region 431 globally becomes deep in a kept state in the same way as with the light reception period. Accordingly, the signal charge e read out to the overlapped region 431' is read out to the pinning region 431 by overcoming a small step of the pinning region 431 of which the p type concentration is deep [p+] from the overlapped region 431' of which the p type concentration is slightly thin [p−]. At this time, drain voltage is applied to the floating diffusion 423 disposed in proximity to the readout gate 421r such that the potential is deeper than the semiconductor substrate 13. Thus, the signal charge e of the photoelectric conversion region 415r is read out to the floating diffusion 423.

Driving as described above is similarly applied to driving of the photoelectric conversion region 415g for green. Also, driving of the photoelectric conversion region 415b for blue may be performed in the same way as with the case employing a normal surface channel type readout gate.

Solid-State Imaging Device Manufacturing Method

FIGS. 55A through 56B are cross-section process diagrams for describing manufacturing procedures for the solid-state imaging device 41-2 having the above configuration. Hereinafter, the manufacturing procedures for the solid-state imaging device 41-2 according to the seventh embodiment will be described based on these drawings.

FIG. 55A

Figure 55A:
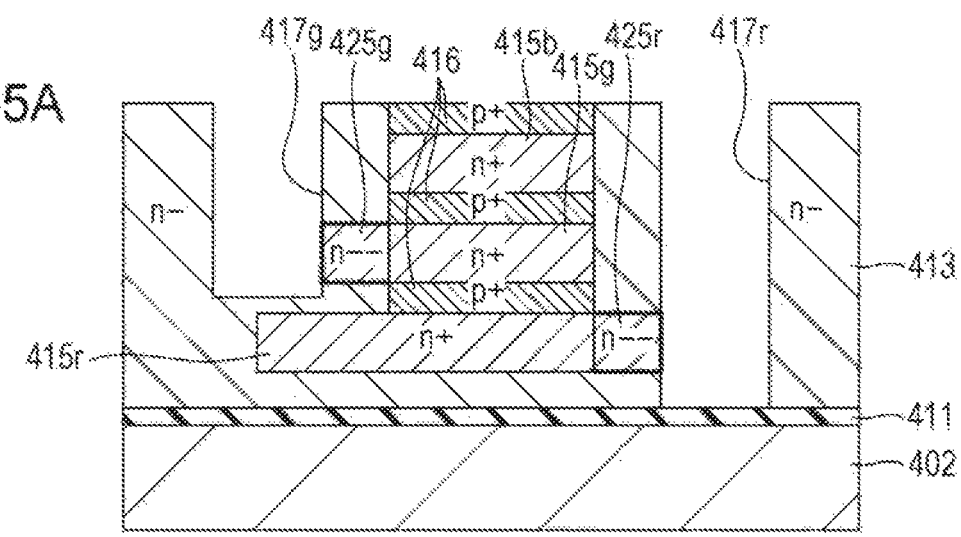
FIGS. 55A through 55C are cross-sectional process views (Part 1) illustrating manufacturing procedures of the solid-state imaging device according to the seventh embodiment.

First, as illustrated in FIG. 55A, a procedure is performed in the same way as with the sixth embodiment wherein the photoelectric conversion regions 415r, 415g, and 415b, p type regions 416, and the potential adjustment regions 425r and 425g are formed and further the trenches 417r and 417g are formed in the semiconductor substrate 413.

FIG. 55B

Figure 55B:
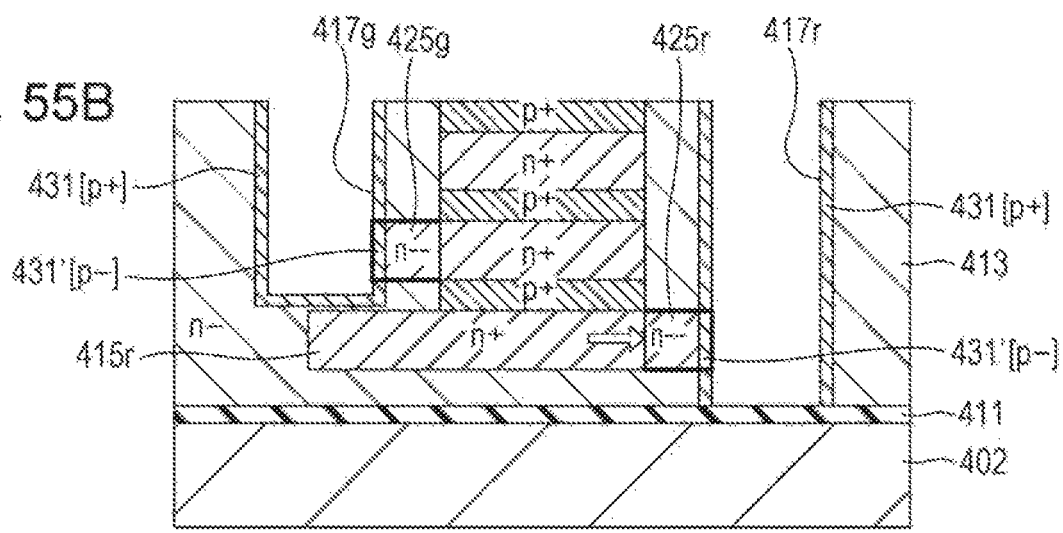

Next, as illustrated in FIG. 55B, a p type impurity is introduced into the semiconductor substrate 413 of which the n type concentration is slightly thin (n−) from the inner walls of the trenches 417r and 417g, thereby forming the pinning region 431 of which the p type concentration is slightly deep [p+] on the inner walls of the trenches 417r and 417g. Thus, the p type impurity is also introduced into the potential adjustment regions 425r and 425g exposed in the inner walls of the trenches 417r and 417g, and the overlapped region 431' of which the p type concentration is slightly thin [p−] is formed in this portion.

Introduction of p type impurities such as described above is performed, along with the area being restricted by a mask, by oblique ion injection of the impurities each of which the depth is adjusted by injection energy, and activation heat treatment thereafter. At this time, according to ion injection energy being adjusted, overlapping of the pinning region 431 as to the potential adjustment regions 425r and 425g is adjusted so that the pinning region 431 is overlapped with a portion or the entirety of the potential adjustment regions 425r and 425g. Ion injection energy is adjusted so that the pinning region 431 is not formed in a range exceeding the potential adjustment regions 425r and 425g. Thereafter, the same procedures as with the procedures described with reference to FIGS. 50A through 50C in the sixth embodiment are performed.

FIG. 55C

Figure 55C:
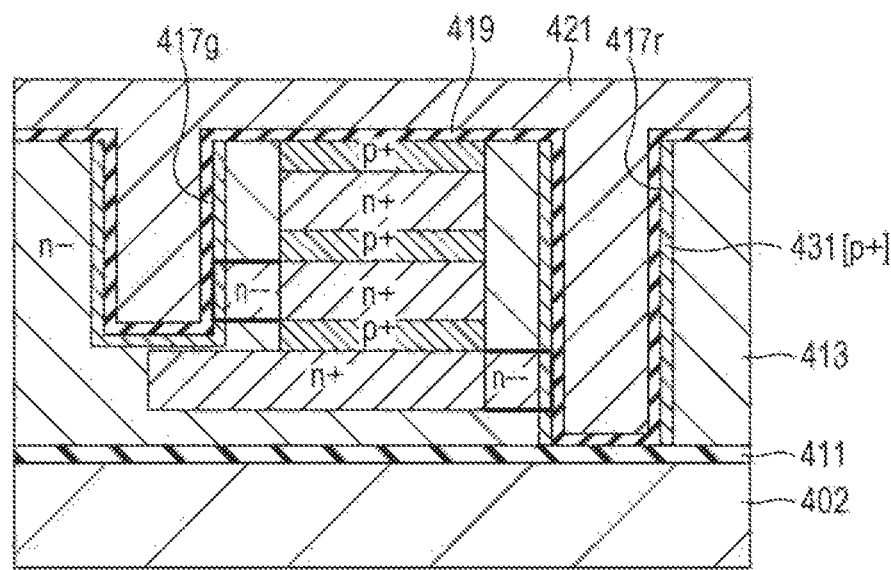

Specifically, first, as illustrated in FIG. 55C, the gate insulating film 419 is formed in a state covering the inner walls of the trenches 417r and 417g, and above the semiconductor substrate 413. Next, the electroconductive material film 421 is formed on the gate insulating film 419 in a state in which the trenches 417r and 417g are embedded.

FIG. 56A

Figure 56A:
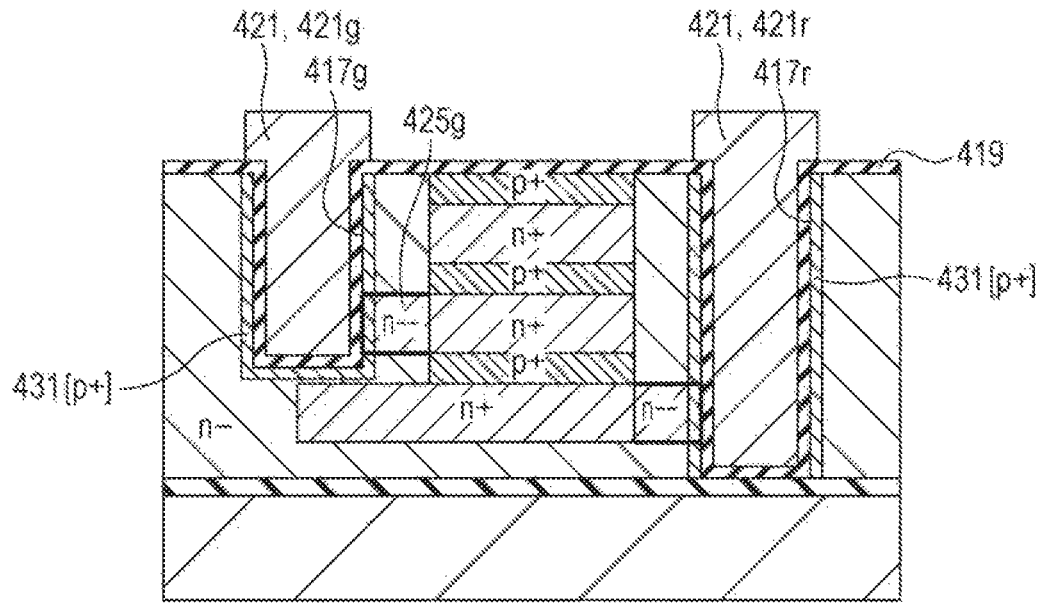
FIGS. 56A and 56B are cross-sectional process views (Part 2) illustrating manufacturing procedures of the solid-state imaging device according to the seventh embodiment.

Next, as illustrated in FIG. 56A, the electroconductive material film 421 is subjected to pattern etching, thereby forming the readout gate 421r within the trench 417r, and forming the readout gate 421g within the trench 417g, and further forming the readout gate (421b) of which the drawing is omitted here on the light receiving face A.

FIG. 56B

Figure 56B:
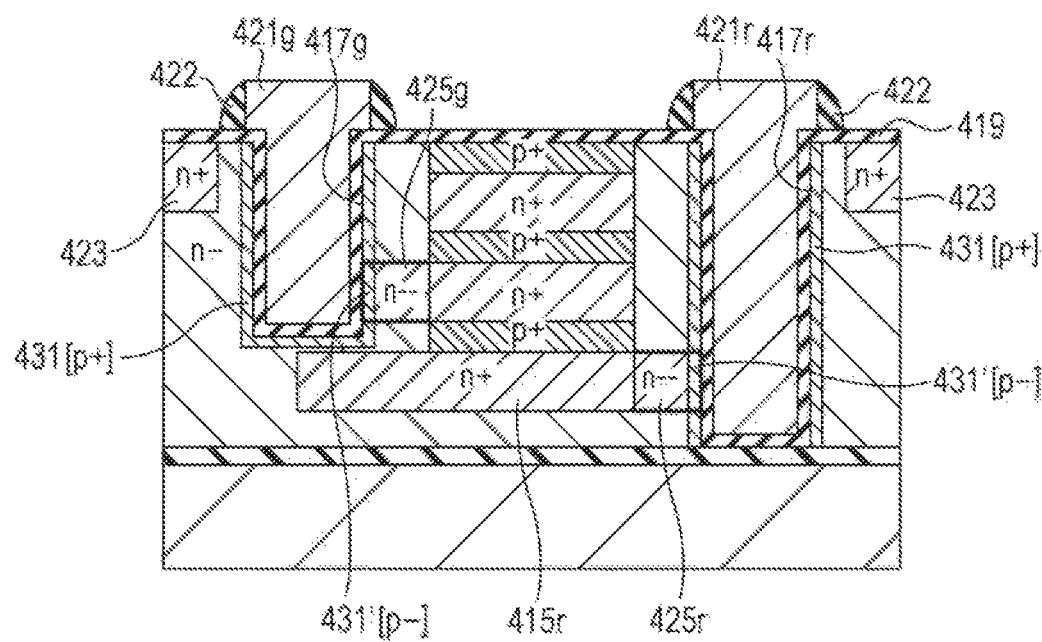

Thereafter, as illustrated in FIG. 56B, the insulating side wall 422 is formed on the side walls of the readout gates 421r, 421g, (and 421b), and subsequently, the floating diffusion 423 of which the n type concentration is deep (n+) is formed on the surface layer of the light receiving face A side of the semiconductor substrate 413.

The solid-state imaging device 41-2 having the configuration previously described with reference to FIGS. 53A and 53B is thus obtained.

Advantage of Seventh Embodiment

The solid-state imaging device 41-2 according to the seventh embodiment described above has a configuration wherein a p type pinning region 431 is further provided to the inner walls of the trenches 417r and 417g to which the readout gates 421r and 421g are internally provided as to the configuration of the sixth embodiment. Thus, as will be described next, the potential step of the channel formation region along the gate insulating film 419 can be lowered as compared to the case of providing no potential adjustment regions 425r and 425g of which the n type concentration is significantly thinner (n--) than those of the photoelectric conversion regions 415r and 415g.

Accordingly, the signal charges (electrons) further read out to the overlapped region 431' via the potential adjustment regions 425r and 425g from the photoelectric conversion regions 415r and 415g can further readily be read out to the pinning region 431 from the overlapped region 431'. As a result thereof, with the solid-state imaging device 41-2 in which the photoelectric conversion regions 415r and 415g are provided to a deep position of the semiconductor substrate 413, all of the signal charges of the photoelectric conversion regions 415r and 415g can be read out, and accordingly, improvement in imaging properties can be realized.

Figure 57:
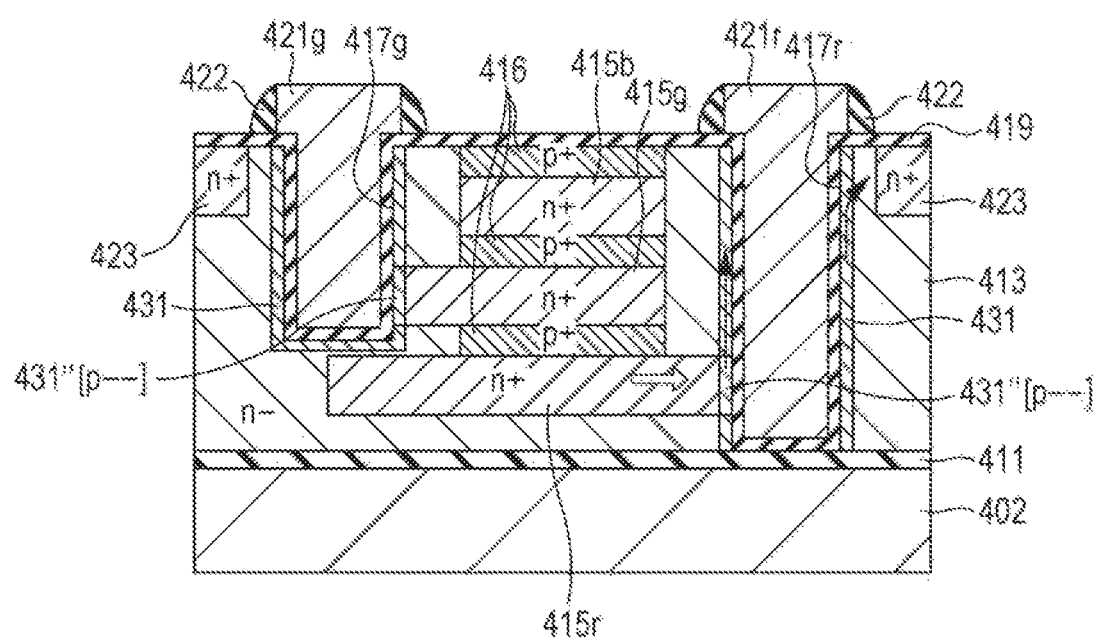
FIG. 57 is a cross-sectional view illustrating the configuration of a solid-state imaging device serving as a comparative example of the seventh embodiment.
Figure 58A:
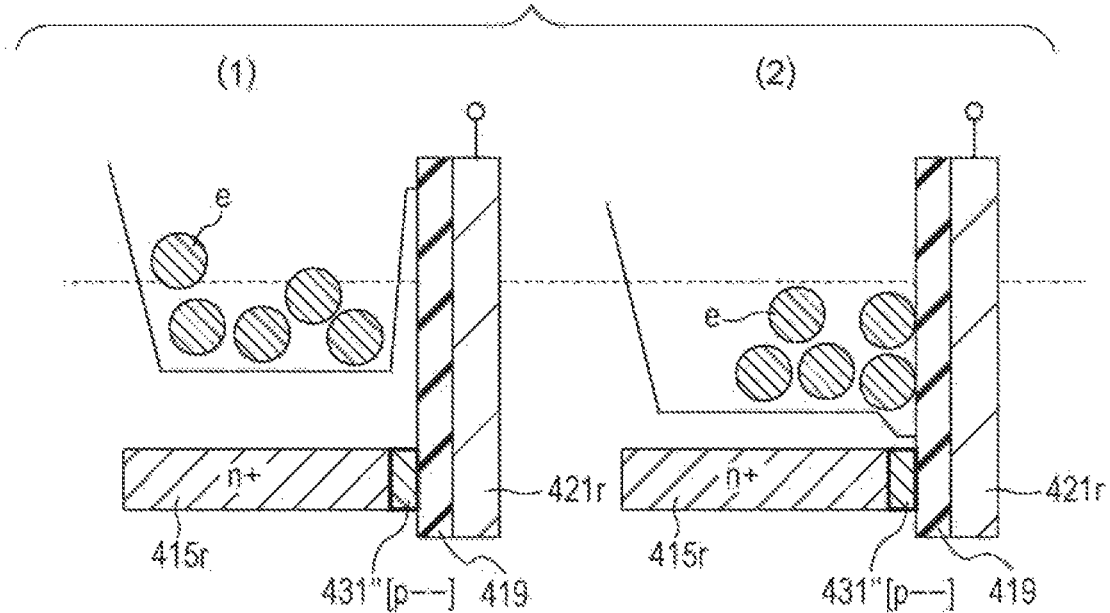
FIGS. 58A and 58B are diagrams for describing driving of the solid-state imaging device serving as a comparative example of the seventh embodiment.
Figure 58B:
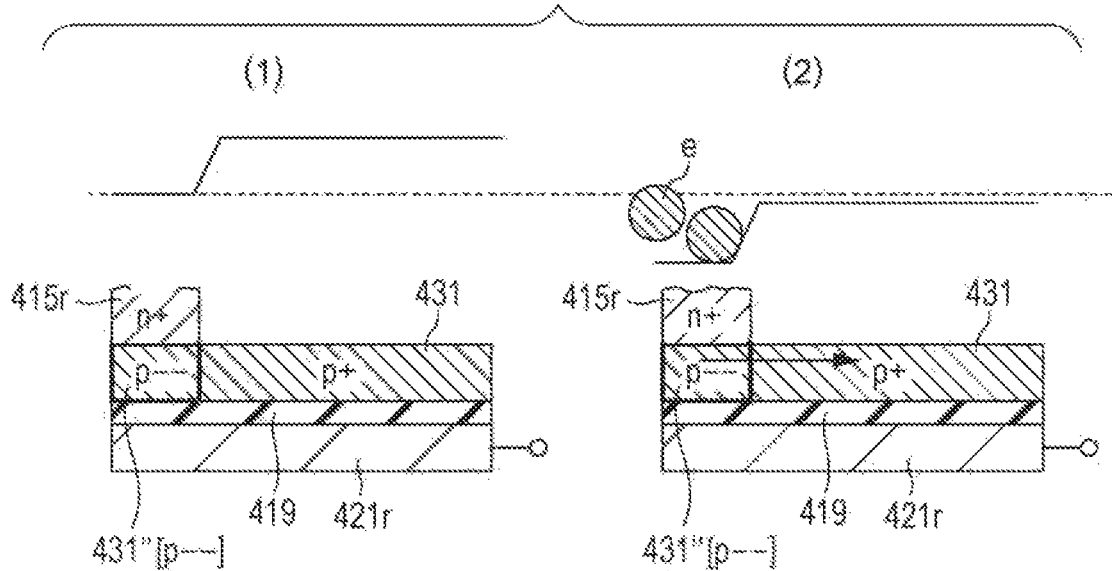

Here, as a comparative example FIG. 57 illustrates a cross-sectional view of a solid-state imaging device having a configuration including no potential adjustment region. Also, FIGS. 58A and 58B illustrate diagrams for describing driving of the solid-state imaging device illustrated in FIG. 57. With the solid-state imaging device to which no potential adjustment region is provided, there is provided an overlapped region 431" of which the p type concentration is significantly thin [p--] wherein the photoelectric conversion regions 415r and 415g of which the n type concentration is deep (n+), and the pinning region 431 of which the p type concentration is deep [p+] are overlapped.

With the light reception period of such a solid state imaging device, as illustrated in (1) in FIG. 58A, the potential of the photoelectric conversion region 415r of which the n type concentration is deep (n+) is kept deeper than the potential of the overlapped region 431" of which the p type concentration is significantly thin [p--]. Thus, the signal charge e generated by photoelectric conversion is accumulated in the photoelectric conversion region 415r.

On the other hand, as illustrated in (1) in FIG. 58B, the potential of the pinning region 431 of which the p type concentration is deep [p+] is shallower than the potential of the overlapped region 431" of which the p type concentration is significantly thin [p--]. Here, the overlapped region 431" is a region where the pinning region 431 of which the p type concentration is deep [p+], and the photoelectric conversion region 415r of which the n type concentration is deep (n+) are overlapped. Therefore, difference between the p type concentration of the overlapped region 431" and the p type concentration of the pinning region 431 is great, and the potential step thereof is greater than that in the solid-state imaging device according to the seventh embodiment described with reference to FIGS. 53A and 54B.

Next, with the readout period, gate voltage to be applied to the readout gate 421r is turned on, and accordingly, as illustrated in (2) in FIG. 58A, the potential of the overlapped region 431" which is [p--] is set so as to be greater than that of the photoelectric conversion region 415r which is (n+). Thus, the signal charge e of the photoelectric conversion region 415r is read out to the gate insulating film 419 side. However, as illustrated in (2) in FIG. 58B, with a portion adjacent to the gate insulating film 419, the potential depth relation between the overlapped region 431" and the pinning region 431 is globally deepened in a state kept in the same way as with the light reception period. Therefore, the potential of the pinning region 431 which is [p+] is shallower than the potential of the overlapped region 431" which is [p--], and a great step is remained. Accordingly, the signal charge e is remained in the overlapped region 431".

14. Modifications

Figure 59A:
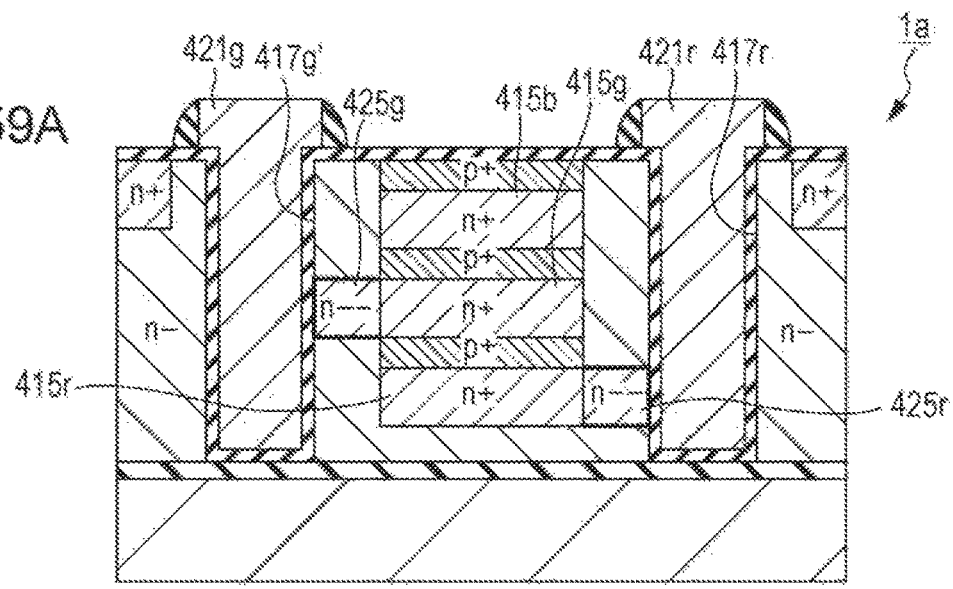
FIGS. 59A through 59C are cross-sectional views illustrating a modification of an embodiment.
Figure 59B:
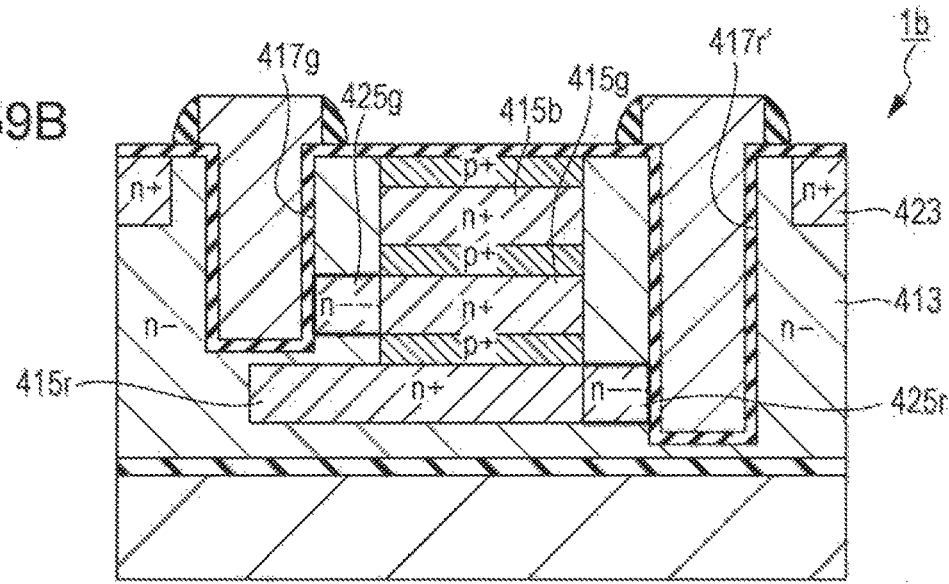
Figure 59C:
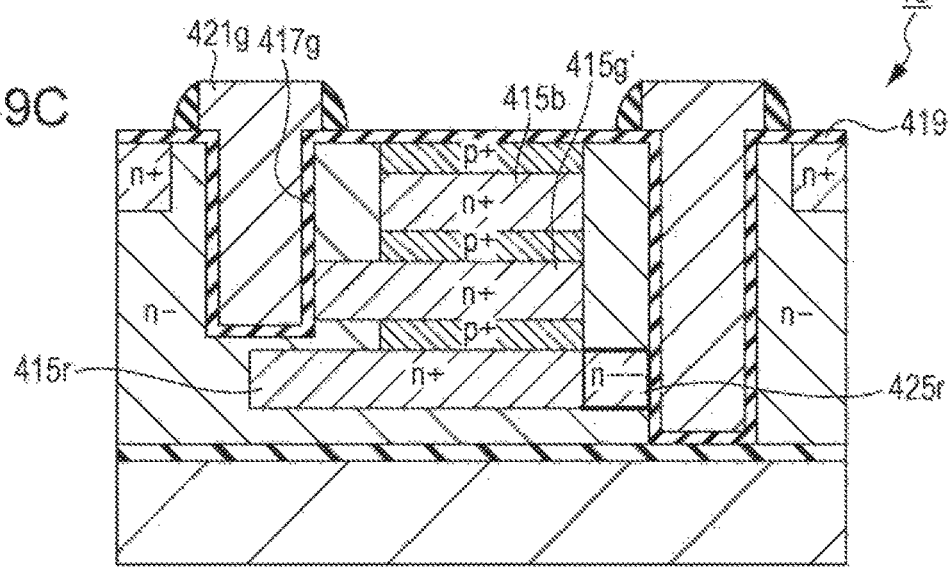

FIGS. 59A through 59C illustrate cross-sectional views of first through third modifications of the solid-state imaging device according to the present technology. Hereinafter, based on these drawings, the modifications of the solid-state imaging device will be described. Note that, though FIGS. 59A through 59C illustrate configurations wherein the modifications have been applied to the solid-state imaging device 41-1 according to the first embodiment, the modifications may similarly be applied to the solid-state imaging device 41-2 according to the seventh embodiment.

First Modification

FIG. 59A illustrates, as the first modification of the solid-state imaging device, the configuration of a solid-state imaging device 41a in which a readout gate 421g' for reading out signal charges from the photoelectric conversion region 415g for green is also provided to the inside of a penetrated trench 417g'. With the semiconductor substrate device 413, the penetration-shaped trenches 417r and 417g' are provided in a position sandwiching the photoelectric conversion regions 415r, 415g, and 415b. According to this configuration, the depths of the penetration-shaped trenches 417r and 417g' as to the photoelectric conversion regions 415r, 415g, and 415b stabilize, and accordingly, imaging properties without variation may be obtained.

Second Modification

FIG. 59B illustrates, as the second modification of the solid-state imaging device, the configuration of a solid-state imaging device 41b in which the readout gate 421r for reading out signal charges from the photoelectric conversion region 415r for red also serves as a trench 417r' which does not penetrate the semiconductor substrate 413. In this case, it is desirable to form the trench 417r' deeper than the photoelectric conversion region 415r for red.

Third Modification

FIG. 59C illustrates, as the third modification of the solid-state imaging device, the configuration of a solid-state imaging device 41c in which the potential adjustment region 425r is provided to only the photoelectric conversion region 415r for red disposed in the deepest position of the semiconductor substrate 413 farthest from the floating diffusion 423. In this case, let us say that the photoelectric conversion region 415g for green is provided in proximity to the gate insulating film 419 covering the inner wall of the trench 417g. Even with such a configuration, the photoelectric conversion region 415r for red is disposed in the deepest position of the semiconductor substrate 413 farthest from the floating diffusion 423, and accordingly, all of the signal charges may be read out from the photoelectric conversion region 415r for red from which signal charges are read out with the most difficult situations. Note that, in the case of this configuration, all of the signals are arranged to be read out from the photoelectric conversion region 415g for green by adjusting gate voltage to be applied to the readout gate 421g.

Note that this third modification may be combined with the first or second modification.

With the embodiments and modifications described above, the configurations have been described wherein the present technology has been applied to a solid-state imaging device in which the readout gates 421r, 421g, and 421b, and the floating diffusion 423 are provided to the light receiving face A side of the semiconductor substrate 413. However, the present technology may similarly be applied to what we call a rear face irradiation type solid-state imaging device wherein the readout gates 421r, 421g, and 421b, and the floating diffusion 423 are provided on the face side opposite of the light receiving face A in the semiconductor substrate 413. In this case, it is desirable to provide a potential adjustment region so as to come into contact with a photoelectric conversion region disposed in a deep position separated from the floating diffusion 423.

Also, with the embodiments and modifications described above, the configurations have been described wherein the present technology has been applied to a solid-state imaging device in which the electroconductive types of the semiconductor substrate 413, photoelectric conversion regions 415r, 415g, and 415b, and floating diffusion 423 are n types. However, the present technology may also be applied to a solid-state imaging device having an electroconductive type opposite thereof in the same way. In this case, it is desirable that "n type" that has been described in the embodiments and modifications is read as "p type", "p type" is read as "n type", and further, "shallow" regarding the depth of potential is read as "deep", and "deep" is read as "shallow".

15. Embodiment of Electronic Device

Figure 60:
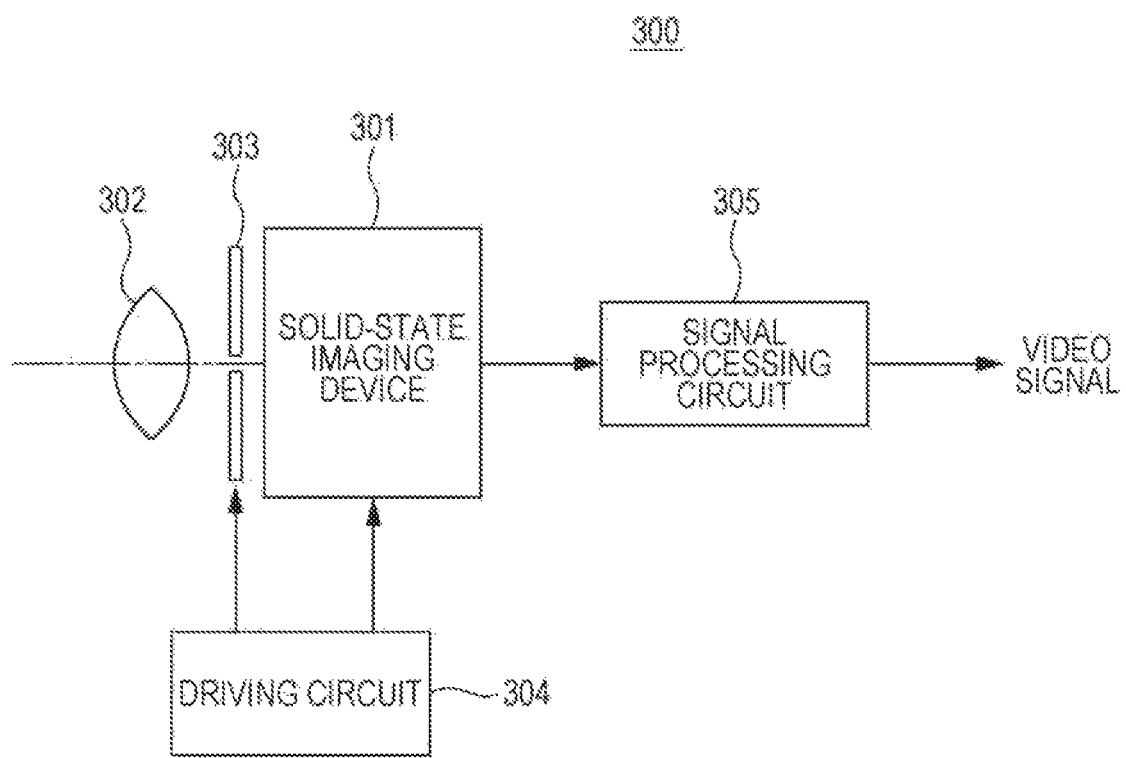
FIG. 60 is a schematic configuration diagram of an electronic device to which a solid-state imaging device has been applied.

Next, an embodiment of an electronic device having the above-described solid-state imaging devices will be described. The above-mentioned solid-state imaging devices may be applied to electronic devices, for example, such as camera systems such as digital cameras, video cameras, and so forth, cellular phones having an imaging function, other devices having an imaging function, and so forth. FIG. 60 illustrates, as an example of electronic devices, a schematic configuration in the case of having applied the solid-state imaging device to a camera capable of taking still images and moving images.

A camera 300 according to the present example includes a solid-state imaging device 301, an optical system 302 for guiding incident light to a light reception sensor portion of the solid-state imaging device 301, a shutter device 303 provided between the solid-state imaging device 301 and the optical system 302, and a driving circuit 304 for driving the solid-state imaging device 301. Further, the camera 300 includes a signal processing circuit 305 for processing output signals from the solid-state imaging device 301.

The solid-state imaging devices according to each of the embodiments described above is applied to the solid-state imaging device 301. The optical system (optical lens) 302 forms image light (incident light) from a subject on the imaging face (not illustrated) of the solid-state imaging device 301. Thus, signal charges are accumulated within the solid-state imaging device 301 for a certain period of time. Note that the optical system 302 may be configured of an optical lens group including multiple optical lenses. Also, the shutter device 303 controls a light irradiation period and a light shielding period of incident light as to the solid-state imaging device 301.

The driving circuit 304 supplies a driving signal to the solid-state imaging device 301 and shutter device 303. The driving circuit 304 controls the signal output operation as to the signal processing circuit 305 of the solid-state imaging device 301, and the shutter operation of the shutter device 303 using the supplied driving signal. That is to say, with this example, a signal transfer operation is performed from the solid-state imaging device 301 to the signal processing circuit 305 using the driving signal (timing signal) supplied from the driving circuit 304.

The signal processing circuit 305 subjects the signal transferred from the solid-state imaging device 301 to various signal processes. The signal (video signal) subjected to various signal processes is stored in a storage medium (not illustrated) such as memory or the like, or output to a monitor (not illustrated).

Note that, with the above solid-state imaging devices, though the first electroconductive type has been described as p type, and the second electroconductive type has been described as n type, the electroconductive types of n type and p type may be reversed in the present technology. In this case, with the driving method, voltage to be applied to various transfer transistors is replaced from positive voltage to negative voltage.

Note that the present disclosure may also take the following arrangements.

(1) A solid-state imaging device including: a first photodiode made up of a first first-electroconductive-type semiconductor region formed on a first principal face side of a semiconductor substrate, and a first second-electroconductive-type semiconductor region formed within the semiconductor substrate adjacent to the first first-electroconductive-type semiconductor region; a second photodiode made up of a second first-electroconductive-type semiconductor region formed on a second principal face side of the semiconductor substrate, and a second second-electroconductive-type semiconductor region formed within the semiconductor substrate adjacent to the second first-electroconductive-type semiconductor region; and a gate electrode formed on the first principal face side of the semiconductor substrate; wherein impurity concentration of a connection face between the second first-electroconductive-type semiconductor region and the second second-electroconductive-type semiconductor region is equal to or greater than impurity concentration of a connection face of an opposite-side layer of the second first-electroconductive-type semiconductor region of the second second-electroconductive-type semiconductor region.

(2) The solid-state imaging device according to (1), further including: a third first-electroconductive-type semiconductor region between the first second-electroconductive-type semiconductor region and the second second-electroconductive-type semiconductor region.

(3) The solid-state imaging device according to (1) or (2), further including: a second-electroconductive-type semiconductor region between the first second-electroconductive-type semiconductor region and the second second-electroconductive-type semiconductor region, of which the impurity concentration is lower than the impurity concentrations of the first second-electroconductive-type semiconductor region and the second second-electroconductive-type semiconductor region.

(4) The solid-state imaging device according to any of (1) through (3), further including: a planar-type transfer transistor configured to read out the charges of the first photodiode formed on the first principal face of the semiconductor substrate; and a vertical-type transfer transistor configured to read out the charges of the second photodiode formed on the first principal face of the semiconductor substrate.

(5) A solid-state imaging device including: a first photodiode made up of a first first-electroconductive-type semiconductor region formed on a first principal face side of a semiconductor substrate, and a first second-electroconductive-type semiconductor region formed within the semiconductor substrate adjacent to the first first-electroconductive-type semiconductor region; a second photodiode made up of a second first-electroconductive-type semiconductor region formed on a second principal face side of the semiconductor substrate, and a second second-electroconductive-type semiconductor region formed within the semiconductor substrate adjacent to the second first-electroconductive-type semiconductor region; and a gate electrode formed on the first principal face side of the semiconductor substrate; wherein the first second-electroconductive-type semiconductor region and the second second-electroconductive-type semiconductor region is connected within the semiconductor substrate, and impurity concentration of a connection face between the second first-electroconductive-type semiconductor region and the second second-electroconductive-type semiconductor region is equal to or smaller than impurity concentration of a connection face between the first second-electroconductive-type semiconductor region and the second second-electroconductive-type semiconductor region.

(6) A solid-state imaging device manufacturing method including: injecting a second-electroconductive-type impurity from the first principal face side of a semiconductor substrate to form a first second-electroconductive-type semiconductor region within the first principal face side of the semiconductor substrate; injecting a first-electroconductive-type impurity from the first principal face side of the semiconductor substrate to form a first first-electroconductive-type semiconductor region on the surface of the first principal face of the semiconductor substrate; forming a gate electrode on the first principal face of the semiconductor substrate; injecting a second-electroconductive-type impurity from the second principal face side of the semiconductor substrate to form a second second-electroconductive-type semiconductor region within the second principal face side of the semiconductor substrate, of which the impurity concentration on the surface side of the second principal face is equal to or greater than impurity concentration on the deep portion side of the semiconductor substrate; and injecting a first-electroconductive-type impurity from the second principal face side of the semiconductor substrate to form a second first-electroconductive-type semiconductor region on the surface of the second principal face of the semiconductor substrate.

(7) The solid-state imaging device manufacturing method according to (6), further including: injecting a first-electroconductive-type impurity from the first principal face side to form a first pixel separation from the surface of the first principal face side to the inside of the semiconductor substrate; and injecting a first-electroconductive-type impurity from the second principal face side to form a second pixel separation from the surface of the second principal face side to a position where the first pixel separation is formed.

(8) An electronic device including: a solid-state imaging device according to any of (1) through (5); an optical system configured to guide incident light into an imaging unit of the solid-state imaging device; and a signal processing circuit configured to process an output signal of the solid-state imaging device.

(9) A solid-state imaging device including: a readout gate embedded within a trench formed in a semiconductor substrate via a gate insulating film; a photoelectric conversion region provided within the semiconductor substrate; a floating diffusion provided on the surface layer of the semiconductor substrate while keeping an interval with the photoelectric conversion region; and a potential adjustment region disposed adjacent to the photoelectric conversion region and the gate insulating film, which is the same electroconductive type as the semiconductor substrate and the photoelectric conversion region, and also is an impurity region of which the electroconductive-type concentration is lower than those of this semiconductor substrate and this photoelectric conversion region.

(10) The solid-state imaging device according to (9), wherein the potential adjustment region is provided in the same depth position as with the photoelectric conversion region.

(11) The solid-state imaging device according to (9) or (10), wherein a plurality of the photoelectric conversion regions are disposed by being laminated in the depth direction within the semiconductor substrate; and wherein the potential adjustment region is provided adjacent to a photoelectric conversion region positioned farthest from the floating diffusion of the plurality of the photoelectric conversion regions.

(12) The solid-state imaging device according to (11), wherein of a plurality of the photoelectric conversion regions, a photoelectric conversion region provided adjacent to the potential adjustment region is a photoelectric conversion region for red light.

(13) The solid-state imaging device according to any of (9) through (12), wherein the readout gate is disposed within a trench provided by passing through the semiconductor substrate.

(14) The solid-state imaging device according to any of (9) through (13), wherein the floating diffusion is disposed on the light receiving face side as to the photoelectric conversion region in the semiconductor substrate.

(15) The solid-state imaging device according to any of (9) through (14), wherein the semiconductor substrate is configured of the same electroconductive type as the photoelectric conversion region and the floating diffusion.

(16) The solid-state imaging device according to any of (9) through (15), wherein a pinning region having the opposite electroconductive type of the photoelectric conversion region is provided within the semiconductor substrate along the side wall of the trench; and wherein an overlapped region where the potential adjustment region and the pinning region are overlapped includes an impurity making up this potential adjustment region and an impurity making up this pinning region together.

(17) The solid-state imaging device according to (16), wherein a portion of the potential adjustment region is disposed overlapped with the pinning region.

(18) A solid-state imaging device manufacturing method including: introducing an impurity into a semiconductor substrate, thereby forming a photoelectric conversion region within this semiconductor substrate, and also forming a potential adjustment region adjacent to this photoelectric conversion region, which is the same electroconductive-type as this semiconductor substrate and this photoelectric conversion region, and also the electroconductive-type concentration is lower than those of this semiconductor substrate and this photoelectric conversion region; forming a trench adjacent to the potential adjustment region in the semiconductor substrate; forming a readout gate within the trench via a gate insulating film; and guiding an impurity into the surface layer of the semiconductor substrate, thereby forming a floating diffusion in proximity to the readout gate on the surface layer of the semiconductor substrate.

(19) The solid-state imaging device manufacturing method according to (18), wherein the trench is formed by passing trough the semiconductor substrate.

(20) The solid-state imaging device manufacturing method according to (18) or (19), further including: introducing an impurity into the semiconductor substrate from the inner wall of the trench after forming the trench before forming the gate insulating film and the readout gate, thereby forming a pinning region having the opposite electroconductive type of the photoelectric conversion region along the inner wall of this trench.

(21) The solid-state imaging device manufacturing method according to (20), wherein, with formation of the pinning region, this pinning region is overlapped with a portion of the potential adjustment region.

(22) An electronic device including: a readout gate embedded within a trench formed in a semiconductor substrate via a gate insulating film; a photoelectric conversion region provided within the semiconductor substrate; a floating diffusion provided on the surface layer of the semiconductor substrate while keeping an interval with the photoelectric conversion region; a potential adjustment region disposed adjacent to the photoelectric conversion region and the gate insulating film, which is the same electroconductive type as the semiconductor substrate and the photoelectric conversion region, and also is an impurity region of which the electroconductive-type concentration is lower than this semiconductor substrate and this photoelectric conversion region; and an optical system configured to guide incident light into the photoelectric conversion region.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device, comprising:
   a semiconductor substrate;
   a first photodiode including:
      a first semiconductor region of a first-electroconductive-type, on a first principal side of said semiconductor substrate;
      a second semiconductor region of a second-electroconductive-type, within said semiconductor substrate, wherein said second semiconductor region is in contact with a first surface of said first semiconductor region; and
      a third semiconductor region of said second-electroconductive-type, within said semiconductor substrate, wherein said third semiconductor region is adjacent to said second semiconductor region;
   a second photodiode including:
      a fourth semiconductor region of said first-electroconductive-type, on a second principal side of said semiconductor substrate, wherein
         said fourth semiconductor region is configured to suppress dark current in said second photodiode,
         said second principal side is a light receiving side of said semiconductor substrate, and
         said first semiconductor region and said fourth semiconductor region have a same planar area;
      a fifth semiconductor region of said second-electroconductive-type, within said semiconductor substrate, wherein a first surface of said fourth semiconductor region is in contact with said fifth semiconductor region; and
      a sixth semiconductor region of said second-electroconductive-type, within said semiconductor substrate, wherein
         said sixth semiconductor region is between said fifth semiconductor region and said third semiconductor region, and
         said third semiconductor region of said first photodiode and said sixth semiconductor region of said second photodiode are connected at a center of said semiconductor substrate;
   a gate electrode on said first principal side of said semiconductor substrate;
   a vertical-type transfer transistor on said first principal side of said semiconductor substrate, wherein
      said vertical-type transfer transistor is configured to read out charges from said first photodiode and said second photodiode,
      said vertical-type transfer transistor does not overlap said first photodiode and said second photodiode in a plan view of said solid-state imaging device, and
      a first impurity concentration of said fifth semiconductor region at a first connection face between said fourth semiconductor region and said fifth semiconductor region is equal to or greater than a second impurity concentration of said sixth semiconductor region at a second connection face between said third semiconductor region and said sixth semiconductor region;
   a first insulating layer on said first principal side of said semiconductor substrate;
   a wiring layer in contact with a first surface of said first insulating layer;
   a second insulating layer on said second principal side of said semiconductor substrate, wherein
      an entirety of a second surface of said fourth semiconductor region is in contact with said second insulating layer, and
      said first surface of said fourth semiconductor region is opposite to said second surface of said fourth semiconductor region;
   a first pixel separation portion, wherein
      an entirety of a first surface of said first pixel separation portion is in contact with a second surface of said first insulating layer,
      an entirety of a second surface of said first semiconductor region is in contact with said second surface of said first insulating layer,
      said first surface of said first semiconductor region is opposite to said second surface of said first semiconductor region, and
      said first surface of said first insulating layer is opposite to said second surface of said first insulating layer; and
   a second pixel separation portion, wherein
      an entirety of a first surface of said second pixel separation portion is in contact with said second insulating layer,
      said first surface of said second pixel separation portion is opposite to said first surface of said first pixel separation portion,
      a second surface of said first pixel separation portion and a second surface of said second pixel separation portion are connected at said center of said semiconductor substrate, and
      said first pixel separation portion and said second pixel separation portion are adjacent to said vertical-type transfer transistor.

2. The solid-state imaging device according to claim 1, wherein
   a third impurity concentration of said third semiconductor region is lower than a fourth impurity concentration of said second semiconductor region, and
   a fifth impurity concentration of said fifth semiconductor region is greater than a sixth impurity concentration of said sixth semiconductor region.

3. An electronic device, comprising:
a solid-state imaging device including:
   a semiconductor substrate;
   an imaging unit that includes:
      a first photodiode including:
         a first semiconductor region of a first-electroconductive-type, on a first principal side of said semiconductor substrate;
         a second semiconductor region of a second-electroconductive-type, within said semiconductor substrate, wherein said second semiconductor region is in contact with a first surface of said first semiconductor region; and
         a third semiconductor region of said second-electroconductive-type, within said semiconductor substrate, wherein said third semiconductor region is adjacent to said second semiconductor region;
      a second photodiode including:
         a fourth semiconductor region of said first-electroconductive-type, on a second principal side of said semiconductor substrate, wherein
            said fourth semiconductor region is configured to suppress dark current in said second photodiode,
            said second principal side is a light receiving side of said semiconductor substrate, and
            said first semiconductor region and said fourth semiconductor region have a same planar area;
         a fifth semiconductor region of said second-electroconductive-type, within said semiconductor substrate, wherein a first surface of said fourth semiconductor region is in contact with said fifth semiconductor region; and
         a sixth semiconductor region of said second-electroconductive-type, within said semiconductor substrate, wherein
            said sixth semiconductor region is between said fifth semiconductor region and said third semiconductor region, and
            said third semiconductor region of said first photodiode and said sixth semiconductor region of said second photodiode are connected at a center of said semiconductor substrate;
   a gate electrode on said first principal side of said semiconductor substrate;
   a vertical-type transfer transistor on said first principal side of said semiconductor substrate, wherein
      said vertical-type transfer transistor is configured to read out charges from said first photodiode and said second photodiode,
      said vertical-type transfer transistor does not overlap said first photodiode and said second photodiode in a plan view of said solid-state imaging device, and
      a first impurity concentration of said fifth semiconductor region at a first connection face between said fourth semiconductor region and said fifth semiconductor region is equal to or greater than a second impurity concentration of said sixth semiconductor region at a second connection face between said third semiconductor region and said sixth semiconductor region;
   a first insulating layer on said first principal side of said semiconductor substrate;
   a wiring layer in contact with a first surface of said first insulating layer;
   a second insulating layer on said second principal side of said semiconductor substrate, wherein
      an entirety of a second surface of said fourth semiconductor region is in contact with said second insulating layer, and
      said first surface of said fourth semiconductor region is opposite to said second surface of said fourth semiconductor region;
   a first pixel separation portion, wherein
      an entirety of a first surface of said first pixel separation portion is in contact with a second surface of said first insulating layer,
      an entirety of a second surface of said first semiconductor region is in contact with said second surface of said first insulating layer,
      said first surface of said first semiconductor region is opposite to said second surface of said first semiconductor region, and
      said first surface of said first insulating layer is opposite to said second surface of said first insulating layer; and
   a second pixel separation portion, wherein
      an entirety of a first surface of said second pixel separation portion is in contact with said second insulating layer,
      said first surface of said second pixel separation portion is opposite to said first surface of said first pixel separation portion,
      a second surface of said first pixel separation portion and a second surface of said second pixel separation portion are connected at said center of said semiconductor substrate, and
      said first pixel separation portion and said second pixel separation portion are adjacent to said vertical-type transfer transistor;
an optical system configured to guide incident light into said imaging unit; and
a signal processing circuit configured to process an output signal of said solid-state imaging device.

* * * * *